(12) United States Patent
Shimada et al.

(10) Patent No.: US 9,389,505 B2
(45) Date of Patent: Jul. 12, 2016

(54) POLYMERIZABLE COMPOSITION FOR SOLDER RESIST, AND SOLDER RESIST PATTERN FORMATION METHOD

(75) Inventors: Kazuto Shimada, Shizuoka-ken (JP); Kimi Ikeda, Shizuoka-ken (JP); Yoshiharu Yabuki, Shizuoka-ken (JP); Daisuke Arioka, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 370 days.

(21) Appl. No.: 13/575,551

(22) PCT Filed: Dec. 9, 2010

(86) PCT No.: PCT/JP2010/072154
§ 371 (c)(1),
(2), (4) Date: Oct. 23, 2012

(87) PCT Pub. No.: WO2011/092950
PCT Pub. Date: Aug. 4, 2011

(65) Prior Publication Data
US 2013/0034812 A1 Feb. 7, 2013

(30) Foreign Application Priority Data

Jan. 27, 2010 (JP) ................................. 2010-016041
May 19, 2010 (JP) ................................. 2010-115725
Dec. 6, 2010 (JP) ................................. 2010-271640

(51) Int. Cl.
| | |
|---|---|
| G03F 7/004 | (2006.01) |
| G03F 7/20 | (2006.01) |
| G03F 7/032 | (2006.01) |
| G03F 1/56 | (2012.01) |
| G03F 7/027 | (2006.01) |
| G03F 7/033 | (2006.01) |
| G03F 7/105 | (2006.01) |
| H05K 3/34 | (2006.01) |

(52) U.S. Cl.
CPC *G03F 7/032* (2013.01); *G03F 1/56* (2013.01); *G03F 7/027* (2013.01); *G03F 7/033* (2013.01); *G03F 7/105* (2013.01); *H05K 3/3452* (2013.01)

(58) Field of Classification Search
None
See application file for complete search history.

(56) References Cited

U.S. PATENT DOCUMENTS

| | | | |
|---|---|---|---|
| 2001/0056174 A1* | 12/2001 | Okada et al. | 528/310 |
| 2005/0056903 A1* | 3/2005 | Yamamoto et al. | 257/433 |
| 2009/0236509 A1* | 9/2009 | Maruyama et al. | 250/237 R |
| 2009/0246650 A1* | 10/2009 | Fujimori et al. | 430/7 |
| 2009/0246651 A1* | 10/2009 | Fujimori et al. | 430/7 |
| 2011/0014401 A1* | 1/2011 | Fujimaki et al. | 428/1.33 |
| 2013/0028587 A1* | 1/2013 | Kaneko et al. | 396/439 |

FOREIGN PATENT DOCUMENTS

| | | | |
|---|---|---|---|
| JP | 02-077749 A | | 3/1990 |
| JP | 0758305 A | | 3/1995 |
| JP | 10-244206 A | | 9/1998 |
| JP | 11109126 A | | 4/1999 |
| JP | 2001-228607 A | * | 8/2001 |
| JP | 2001-235857 A | * | 8/2001 |
| JP | 2001-335619 A | | 12/2001 |
| JP | 2002-294131 A | * | 10/2002 |
| JP | 2004-226621 A | | 8/2004 |
| JP | 2008-257045 A | | 10/2008 |
| JP | 2009-194396 A | | 8/2009 |
| JP | 2009-244741 A | * | 10/2009 |
| JP | 2011075678 A | | 4/2011 |
| TW | 200907566 A | | 2/2009 |
| WO | 2007023834 A1 | | 3/2007 |
| WO | 2009/116442 A1 | | 9/2009 |
| WO | 2011067998 A1 | | 6/2011 |
| WO | WO-2011/118850 A1 | * | 9/2011 |

OTHER PUBLICATIONS

English translation of JP, 2002-294131, A (2002) from machine translation from AIPN Japan Patent Office National Center for Industrial Property Information and Training, generated Dec. 2, 2013, 12 pages.*
Derwent-ACC-No. 2004-064837 , English abstract of JP 2002294131 published Oct. 6, 2002, 5 pages.Inventor Name Hashimoto et al.*
English translation of JP, 2001-228607, A (2001) from machine translation from AIPN Japan Patent Office National Center for Industrial Property Information and Training, generated Dec. 2, 2013, 19 pages.*
English translation of JP, 2009-244741, A (2009) from machine translation from AIPN Japan Patent Office National Center for Industrial Property Information and Training, generated Dec. 2, 2013, 48 of 48 and 8 of 8 pages.*
English translation of JP, 2001-235857, A (2001) from machine translation from AIPN Japan Patent Office National Center for Industrial Property Information and Training, generated Dec. 2, 2013, 17 pages.*
International Search Report for PCT/JP2010/072154, dated Jan. 18, 2011, 8 pages in Japanese and English.
Written Opinion of the ISA (PCT/JP2010/072154), dated Jan. 18, 2011, 12 pages in Japanese and English.
Communication, dated Jun. 10, 2013, issued in corresponding EP Application No. 10844704.6, 6 pages.
Notice of Reasons for Rejection, dated Jun. 3, 2014, issued in corresponding JP Application No. 2010-271640, 10 pages in English and Japanese.
Office Action dated Jan. 6, 2015, issued by the Taiwan Patent Office in corresponding Taiwanese Application No. 100100491.
Office Action dated Nov. 25, 2014, issued by the Japanese Patent Office in counterpart Japanese Application No. 2010-271640.
Office Action dated Apr. 14, 2015 from the Taiwanese Intellectual Property Office in counterpart TW Application No. 100100491.

* cited by examiner

*Primary Examiner* — Cynthia Hamilton
(74) *Attorney, Agent, or Firm* — Sughrue Mion, PLLC

(57) ABSTRACT

The present invention provides a polymerizable composition for a solder resist, including an infrared ray shielding material, a polymerization initiator, and a polymerizable compound, and a solder resist pattern forming method using the polymerizable composition for a solder resist.

26 Claims, No Drawings

POLYMERIZABLE COMPOSITION FOR SOLDER RESIST, AND SOLDER RESIST PATTERN FORMATION METHOD

CROSS REFERENCE TO RELATED APPLICATIONS

This application is a National Stage of International Application No. PCT/JP2010/072154 filed Dec. 9, 2010, claiming priority based on Japanese Patent Application Nos. 2010-016041 filed Jan. 27, 2010, 2010-115725 filed May 19, 2010, and 2010-271640 filed Dec. 6, 2010. The contents of all of which are incorporated herein by reference in their entirety.

TECHNICAL FIELD

The present invention relates to a polymerizable composition for forming a solder resist and a solder resist pattern forming method. In particular, the invention relates to a polymerizable composition for a solder resist, which can be suitably used to form a solder resist for solid state image sensors, and to a solder resist pattern forming method using the same.

BACKGROUND ART

Conventionally, during formation of a permanent pattern of solder resist or the like, a photosensitive layer is formed on an intended member by using a method in which a liquid of photosensitive composition is applied by spin coating, screen printing, or spray printing to form a coated film and then dried, or a method in which a photosensitive composition is applied and dried on a temporary support to form a laminate film having a photosensitive layer and then only the photosensitive layer is transferred on the member by a vacuum laminator or a roll laminator. As a method for forming a permanent pattern of solder resist or the like, for example, there is known a method in which a photosensitive layer is formed on a silicon wafer on which the permanent pattern is to be formed, on a wired silicon wafer, or on a substrate such as a copper-coated laminate plate by using a method as above; the photosensitive layer of the laminate is subjected to exposure; after the exposure, the photosensitive layer is developed to form a pattern; and then, curing treatment and the like are performed to form the permanent pattern.

The formation of the permanent pattern is also applied to a package substrate interposed between a semiconductor chip and a printed board. Regarding the package substrate, much higher density packaging has been demanded in recent years. Wiring pitch width is being narrowed, solder resist layer strength is increasing, and insulating properties of the layer are improving, whereas thickness thereof is being reduced. Thus, there is a strong desire for more resistance to repeated hot and cold shocks (thermal cycling test resistance: TCT resistance). In addition, via diameter reduction and smoothness of tapered configuration are also desired in terms of mountability.

It is necessary for such a photosensitive composition used to form a solder resist to have excellent preservation stability from the viewpoint of convenience.

Meanwhile, a solid state imaging device (image sensor) used in mobile phones, digital cameras, digital video cameras, surveillance cameras, and the like is a photoelectric conversion device formed as an integrated circuit using a semiconductor device producing technique. Recently, due to size and weight reduction in mobile phones and digital cameras, further miniaturization of solid state image sensors has been desired.

To miniaturize the solid state image sensor, there has been proposed a technique for applying a through-electrode and forming a thinner silicon wafer (for example, see Japanese Patent Application Laid-Open (JP-A) No. 2009-194396). Although miniaturization can be made by polishing and thinning of a silicon wafer, the thinned silicon wafer has come to easily transmit light having a wavelength of 800 nm or more, while maintaining shieldability of light of 800 nm or less. Therefore, a new problem has been found in which since photodiodes used in solid state image sensors respond even to light ranging from 800 to 1200 nm, transmission of light of 800 nm or more deteriorates image quality.

The solid state image sensor is configured to include photodiodes, a color filter and a lens, which are adjacent to one side of the photodiodes. Near the color filter or the lens is provided an infrared cut-off filter that cuts off infrared light ranging from 800 to 1200 nm. On an opposite side of the color filter are provided metal wires, a solder resist, and the like. The solder resist is often filled in between the metal wires. However, there has been a problem that it is impossible to shield infrared ray such as leaking light entering the inside of mobile phones, digital cameras, or the like. Thus, conventional measures have been taken to ensure infrared ray shielding properties by additionally disposing an infrared ray shielding layer outside the solder resist having insufficient infrared ray shielding properties. Nevertheless, in general, due to unevenness caused by wires and the like on the solder resist, it has been difficult to apply an even thickness of a material of the infrared ray shielding layer on the uneven surface of a substrate, so that there has been a problem in which a portion with insufficient thickness of the material transmits light therethrough.

To provide an infrared ray shielding layer only on a desired portion, it is preferable for the composition to exhibit photosensitivity and photolithography performance allowing for patterning by exposure. As a light-shielding photosensitive composition having the photolithography, there may be mentioned a black resist including carbon black used to form an LCD color filter. The carbon black has high visible-light shieldability, but has low infrared-ray shieldability. When using such a black resist as a solder resist, addition of carbon black in an amount ensuring shieldability required in infrared region excessively increases the shieldability in the visible light region. The resist will shield light having a shorter wavelength than visible light, which is used for exposure by a high pressure mercury vapor lamp, KrF, ArF, or the like, as usually used for image formation. Accordingly, there is a problem of insufficient photocurability.

Furthermore, at present, an infrared ray shielding layer is disposed separately after forming a solder resist by an applying method. Thus, due to the formation of the solder resist and the formation of the infrared ray shielding layer, it is necessary to perform steps for application, exposure, development, post-heating, and the like plural times. This results in complication of steps and increase of cost, so that improvement has been desired.

Then, an attempt to allow a solder resist itself to have shieldability has been made. For example, there has been proposed a black solder resist composition including a black colorant, a colorant other than black, and a polyfunctional epoxy compound (for example, see JP-A-2008-257045). The composition, however, is characterized in that the content of the black colorant is reduced by combination with the colorant other than black. Therefore, in terms of ensuring both light shielding properties particularly in infrared region and curability, the composition has been practically insufficient.

SUMMARY OF INVENTION

Technical Problem

The present invention has been accomplished in view of the circumstances and intends to solve the conventional problems to achieve the following objects.

Specifically, it is an object of the present invention to provide a polymerizable composition for a solder resist, which has excellence in both light shielding properties in infrared region and curability, and a solder resist pattern forming method using the polymerizable composition.

Solution to Problem

The present inventors conducted intensive and extensive studies to solve the above problems, and consequently found that, by incorporating an infrared ray shielding material in a solder resist, a solder resist layer itself can ensure excellent infrared ray shielding properties and also can obtain sufficient curability, thereby completing the present invention.

The polymerizable composition for a solder resist of the present invention includes an infrared ray shielding material, a polymerization initiator, and a polymerizable compound.

Herein, as the infrared ray shielding material, preferred are a metal-containing inorganic pigment such as titanium black and an infrared ray absorbing dye having excellence in infrared ray absorbability and stability. The polymerizable compound in the polymerizable composition for a solder resist of the present invention may be either a radically polymerizable compound or a cationically polymerizable compound, or both thereof may be used in combination. Additionally, the polymerizable compound may be a polyfunctional polymerizable compound having plural polymerizable groups in a molecule thereof.

The polymerizable composition for a solder resist of the present invention may further include a binder polymer. Such a polymerizable composition for a solder resist has a solid content concentration of preferably 30% by mass or more but 80% by mass or less and a viscosity of preferably 10 mPa·s or more but 3000 mPa·s or less, from the viewpoint of solder resist formability.

A cured film formed using the polymerizable composition for a solder resist of the present invention has excellent infrared ray shielding properties. According to the polymerizable composition of the present invention, for example, when a cured film with a film thickness of 20 μm is formed, a light transmittance of the cured film at a wavelength of 800 to 1200 nm is 10% or less, and also transmission properties in the visible light region are good. More specifically, there can be formed a cured film in which a minimum optical density (OD value) of the cured film at the wavelength of 800 to 1200 nm is less than three times a minimum optical density of the cured film at a wavelength of 300 to 450 nm.

In addition, an obtained cured film needs to be excellent in insulating properties. As an index of the insulating properties of the formed cured film, a preferable breakdown voltage is 1 MV/cm or more. In addition, as the method for measuring a breakdown voltage, a mercury prober manufactured by Four Dimensions, Inc and an HP4285 ALCR meter manufactured by Yokokawa Hewlett-Packard Company can be used to conduct I-V measurement for evaluation. In the present invention, film evaluation is performed based on measurement results obtained by this method.

The polymerizable composition for a solder resist of the present invention has sufficient infrared ray shielding properties even in a case of a thin film and allows formation of a high-resolution pattern. Therefore, the polymerizable composition of the invention is suitable for forming a solder resist used in solid state image sensors.

In addition, the solder resist pattern forming method of the present invention is characterized by including a step of forming a photosensitive layer containing the polymerizable composition for a solder resist of the present invention on a substrate, a step of pattern exposing the photosensitive layer to cure an exposed portion, and a step of removing an uncured photosensitive layer by development to form a patterned cured film having infrared ray shielding properties, in this order.

Advantageous Effects of Invention

According to the present invention, there can be provided a polymerizable composition for a solder resist having excellence in both light shielding properties in infrared region and curability, and a solder resist pattern forming method using the composition. The polymerizable composition for a solder resist is particularly suitable for forming a solder resist for solid state image sensors.

DESCRIPTION OF EMBODIMENTS

Hereinafter, a detailed description will be given of a polymerizable composition for a solder resist according to the present invention (hereinafter may be simply referred to as polymerizable compound).

In the present specification, the total solid content of a polymerizable composition means the total mass of components excluding a solvent from a total mass of the polymerizable composition.

(Polymerizable Composition for Solder Resist)

The polymerizable composition of the present invention includes at least an infrared ray shielding material, a polymerization initiator, and a polymerizable compound, and if needed, includes a binder polymer, a filler, an elastomer, and other components.

In the present specification, when either one or both of the terms "acryl" and "methacryl" are mentioned, the word "(meth)acryl" may be used.

<Infrared Ray Shielding Material>

The infrared ray shielding material used in the present invention, preferably, is a compound having absorption in a range of 800 to 1200 nm and excellent in transmittance of light used for exposure. From such a viewpoint, preferably, the infrared ray shielding material in the present invention is selected from infrared ray absorbing dyes and infrared ray absorbing metal-containing inorganic pigments.

Examples of an infrared ray absorbing dye that can be used as the infrared ray shielding material in the present invention include cyanine dyes, phthalocyanine dyes, naphthalocyanine dyes, immonium dyes, aminium dyes, quinolinium dyes, pyrylium dyes, and metal complex dyes such as Ni complex dyes, and also dyes represented by the following general formulas (I) to (III).

(Dye Represented by General Formula (I))

First, a description will be given of an infrared ray absorbing dye represented by general formula (I) suitably used as the infrared ray shielding material. The dye represented by general formula (I) is included in cyanine dyes.

General Formula (I)

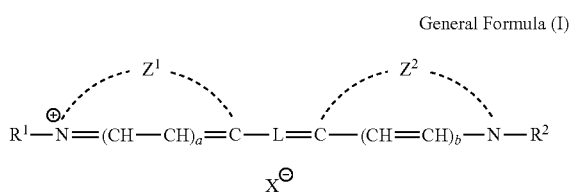

In the general formula (I), $Z^1$ and $Z^2$ each independently represent a nonmetal atomic group forming a five- or six-membered nitrogen-containing heterocyclic ring that may be a condensed ring; $R^1$ and $R^2$ each independently represent an alkyl group, an alkenyl group, or an aralkyl group; L is a linking group including a structure in which 5 to 9 methine groups are linked by conjugated double bonds; a and b each are 0 or 1; and X represents a counter anion.

$Z^1$ and $Z^2$ each independently represent a group of nonmetal atoms forming a five- or six-membered nitrogen-containing heterocyclic ring that may be a condensed ring. Herein, examples of the nitrogen-containing heterocyclic ring and a condensed ring thereof formed by $Z^1$ and $Z^2$ include a oxazole ring, an isoxazole ring, a benzoxazole ring, a naphthoxazole ring, a thiazole ring, a benzothiazole ring, a naphthothiazole ring, an indolenine ring, a benzoindolenine ring, an imidazole ring, a benzoimidazole ring, a naphthoimidazole ring, a quinoline ring, a pyridine ring, a pyrrolopyridine ring, a furopyrol ring, an indolizine ring, an imidazoquinoxaline ring, and a quinoxaline ring. Preferable nitrogen containing heterocycles are five-membered rings, and more preferable forms are those in which a benzene ring or a naphthalene ring is condensed to a five-membered nitrogen-containing heterocyclic ring. More specifically, an indolenine ring and benzoindolenine ring are most preferable.

The nitrogen containing heterocyclic ring and a ring condensed thereto may have a substituent. Examples of substituents that can be introduced include alkyl groups such as methyl, ethyl, and propyl, alkoxy groups such as methoxy and ethoxy, aryloxy groups such as phenoxy and p-chlorophenoxy, halogen atoms such as chlorine, bromine, and fluorine, alkoxycarbonyl groups such as ethoxycarbonyl, cyano groups, nitro groups, sulfo groups and salts thereof, carboxyl groups and salts thereof.

$R^1$ and $R^2$ each independently represent an alkyl group, an alkenyl group, or an aralkyl group. Among them, preferable are alkyl groups, such as alkyl groups having 1 to 10 carbon atoms that may optionally have a substituent. Examples of substituents that can be introduced in the alkyl groups include halogen atoms such as chlorine, bromine, and fluorine, alkoxycarbonyl groups such as methoxycarbonyl, and ethoxycarbonyl, hydroxyl groups, sulfo groups and salts thereof, and carboxyl groups and salts thereof.

Preferable alkenyl groups are those having 2 to 10 carbon atoms, which may have a substituent, and examples of the alkenyl groups include 2-pentenyl, vinyl, allyl, 2-butenyl, and 1-propenyl. As substituents that can be introduced into the alkenyl groups, there may be mentioned the same ones as those that can be introduced into the alkyl groups.

Preferably aralkyl groups are those having 7 to 12 carbon atoms, which may have a substituent, and examples of the aralkyl groups include benzyl and phenethyl. As substituents that can be introduced into the aralkyl groups, there may be mentioned the same ones as those that can be introduced into the $Z^1$ and $Z^2$.

L is a linking group including a structure in which 5 to 9 methine groups are linked by conjugated double bonds. The number of the methine groups is preferably 7 or 9, and more preferably 7.

The methine groups may combine together to form a five- or six-membered ring. In addition, the methine groups may have a substituent. The methine group having a substituent is preferably a methine group at the center (meso position). As the substituent, there may be mentioned methyl groups, ethyl groups, methoxy groups, phenoxy groups, halogen atoms (Cl, Br, and F), aryl groups (including phenyl and naphthyl and may have a substituent, in which examples of the substituent include methyl, ethyl, methoxy, ethoxy, phenoxy, Cl, Br, F, ethoxycarbonyl, cyano, and nitro), —$NR^3R^4$, —$OR^3$, —$SR^3$, —$SO_2R^3$, hydroxyl groups, or ketones. Herein, $R^3$ and $R^4$ each independently represent a hydrogen atom, an alkyl group, or aryl group. Examples of the alkyl group and the aryl group are the same as those mentioned above.

In the general formula (I), a and b each are 0 or 1.

X represents a counter anion. Examples of the anion include halide ions ($Cl^-$, $Br^-$, and $I^-$), p-toluene sulfonate ions, ethyl sulfate ions, $PF_6^-$, $BF_4^-$, and $ClO_4^-$. When the dye represented by the general formula (I) has an anionic substituent in the structure thereof and charge neutralization is unnecessary, X is not present. For example, as in carboxyl group, when an anionic substituent and $N^+$ form an inner salt, the dye is formed such that, apparently, X is not present.

(Dye Represented by General Formula (II))

Next, a description will be given of an infrared ray absorbing dye represented by the general formula (II), which is suitably usable as an infrared ray shielding material. The dye represented by the general formula (II) is a dihydroperimidine squarylium compound included in squarylium dyes.

General Formula (II)

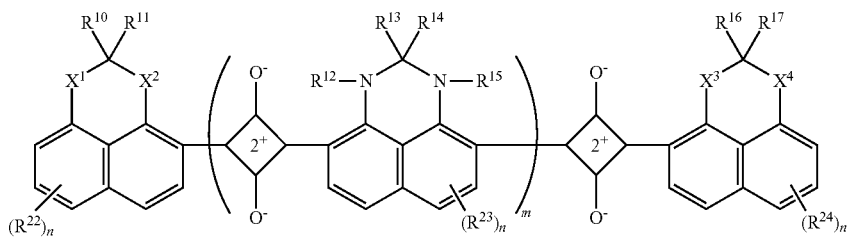

In the general formula (II), $R^{10}$, $R^{11}$, $R^{12}$, $R^{13}$, $R^{14}$, $R^{15}$, $R^{16}$, and $R^{17}$ each independently represent a hydrogen atom, an alkyl group, a cycloalkyl group, an aryl group, an aralkyl group, or a heterocyclic group, and one or more pairs of $R^{10}$ and $R^{11}$, $R^{12}$ and $R^{13}$, $R^{14}$ and $R^{15}$, and $R^{16}$ and $R^{17}$ may be bonded to each other to form a five- or six-membered ring structure. $X^1$ represents an oxygen atom or —$NR^{18}$; $X^2$ represents an oxygen atom or —NR$^{19}$; X$^3$ represents an oxygen atom or —NR$^{20}$; and X$^4$ represents an oxygen atom or —NR$^{21}$. R$^{18}$, R$^{19}$, R$^{20}$, and R$^{21}$ each independently represent a hydrogen atom, an alkyl group, a cycloalkyl group, an aryl group, an aralkyl group, or a heterocyclic group, and one or more pairs of R$^{18}$ and R$^{10}$, R$^{19}$ and R$^{11}$, R$^{19}$ and R$^{11}$, R$^{20}$ and R$^{16}$, and R$^{21}$ and R$^{17}$ may be bonded to each other to form a five- or six-membered ring structure. R$^{22}$, R$^{23}$, and R$^{24}$ each independently represent a hydrogen atom or a monovalent group; n each independently represents an integer of 1 to 3; and m represents an integer of 0 to 6. When n represents 2 or 3, a plurality of R$^{22}$s, R$^{23}$s, or R$^{24}$s may be the same as or different from each other.

In the general formula (II), when R$^{10}$ to R$^{21}$ represent alkyl, examples of the alkyl group include alkyl groups having 1 to 20 carbon atoms, and more preferably alkyl groups having 1 to 12 carbon atoms (such as methyl, ethyl, propyl, butyl, hexyl, and undecyl), and the alkyl group may be substituted with a halogen atom (F, Cl, or Br), an alkoxycarbonyl group (such as methoxycarbonyl or ethoxycarbonyl), an hydroxyl group, an alkoxy group (such as methoxy, ethoxy, phenoxy, or isobutoxy), an acyloxy group (such as acetyloxy, butyryloxy, hexyryloxy, or benzoyloxy), a sulfo group (or salt thereof), a carboxyl group (or salt thereof), or the like.

When R$^{10}$ to R$^{21}$ represent a cycloalkyl group, the cycloalkyl group may be cyclopentyl or cyclohexyl.

When R$^{10}$ to R$^{21}$ represent an aryl group, the aryl group is preferably an aryl group having 6 to 12 carbon atoms and may be a phenyl group or a naphthyl group. The aryl group may have a substituent. Examples of the substituent include an alkyl group having 1 to 8 carbon atoms (such as methyl, ethyl, or butyl), an alkoxy group having 1 to 6 carbon atoms (such as methoxy or ethoxy), an aryloxy group (such as phenoxy or p-chlorophenoxy), a halogen atom (F, Cl, or Br), an alkoxycarbonyl group (such as methoxycarbonyl or ethoxycarbonyl), an amino group (such as methylamino, acetylamino, or methanesulfonamide), a cyano group, a nitro group, a carboxyl group (or a salt thereof), and a sulfo group (or a salt thereof).

When R$^{10}$ to R$^{21}$ represent an aralkyl group, the aralkyl group is preferably an aralkyl group having 7 to 12 carbon atoms (such as benzyl or phenylethyl), and may have a substituent (such as methyl, methoxy, or a chloro atom).

When R$^{10}$ to R$^{21}$ represent a heterocyclic group, the heterocyclic group may be thienyl, furyl, pyrrolyl, pyrazolyl, pyridyl, indolyl, or the like.

Examples of the monovalent group represented by R$^{22}$ to R$^{24}$ may be the substituents mentioned in the section of the above aryl group.

One or more pairs of R$^{10}$ and R$^{11}$, R$^{12}$ and R$^{13}$, R$^{14}$ and R$^{15}$, R$^{16}$ and R$^{17}$, R$^{18}$ and R$^{10}$, R$^{19}$ and R$^{11}$, R$^{20}$ and R$^{16}$, and R$^{21}$ and R$^{17}$ may be bonded to each other to form a five- or six-membered ring structure, such as a cyclopentane or cyclohexane ring.

m represents an integer of 0 or 1 to 6 and may be a mixture.

(Dye Represented by General Formula (III))

Next, a description will be given of an infrared ray absorbing dye represented by the general formula (III), which is suitably usable as an infrared ray shielding material. The dye represented by the general formula (III) is included in indoaniline dyes.

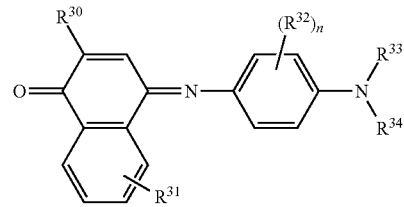

General Formula (III)

In the general formula (III), R$^{30}$ represents —CONHR$^{35}$, —SO$_2$NHR$^{35}$, —NHSO$_2$R$^{35}$, —NHCOR$^{35}$, —NHCONHR$^{35}$, a hydrogen atom, a halogen atom, a carboxyl group, or a sulfo group. R$^{31}$ represents a hydrogen atom, an alkyl group, —NHSO$_2$R$^{35}$, or —NHCOR$^{35}$. R$^{35}$ represents an alkyl group, an aryl group, or a heterocyclic group. R$^{32}$ represents a hydrogen atom, an alkyl group, an alkoxy group, a hydroxyl group, an amino group, or a halogen atom. When a plurality of R$^{32}$s are present, they may be the same as or different from each other. n represents an integer of 0 to 3. R$^{33}$ and R$^{34}$ each independently represent an alkyl group, an aryl group, or an aralkyl group. One or more pairs of R$^{33}$ and R$^{34}$, R$^{32}$ and R$^{33}$, and R$^{32}$ and R$^{34}$ may be bonded to each other to form a five- or six-membered ring structure.

In the general formula (III), when R$^{30}$ to R$^{35}$ represent an alkyl group, an alkyl group having 1 to 20 carbon atoms, and more preferably 1 to 12 carbon atoms (such as methyl, ethyl, propyl, butyl, hexyl, and undecyl) may be exemplified, and the alkyl group may be substituted with a halogen atom (F, Cl, or Br), an alkoxycarbonyl group (such as methoxycarbonyl or ethoxycarbonyl), an hydroxyl group, an alkoxy group (such as methoxy, ethoxy, phenoxy, or isobutoxy), an acyloxy group (such as acetyloxy, butyryloxy, hexyryloxy, or benzoyloxy), a carboxyl group (or salt thereof), a sulfo group (or salt thereof), or the like.

When R$^{30}$ to R$^{35}$ represent an aryl group, the aryl group is preferably an aryl group having 6 to 12 carbon atoms and may be a phenyl group or a naphthyl group. The aryl group may have a substituent. Examples of the substituent include an alkyl group having 1 to 8 carbon atoms (such as methyl, ethyl, or butyl), an alkoxy group having 1 to 6 carbon atoms (such as methoxy or ethoxy), an aryloxy group (such as phenoxy or p-chlorophenoxy), a halogen atom (F, Cl, or Br), an alkoxycarbonyl group (such as methoxycarbonyl or ethoxycarbonyl), an amino group (such as methylamino, acetylamino, or methanesulfonamide), a cyano group, a nitro group, a carboxyl group, or a sulfo group.

When R$^{30}$ to R$^{35}$ represent an aralkyl group, the aralkyl group is preferably an aralkyl group having 7 to 12 carbon atoms (such as benzyl or phenylethyl) and may have a substituent (such as methyl, methoxy, a chloro atom, carboxyl, or sulfo).

When R$^{35}$ represents a heterocyclic group, examples of the heterocyclic group include pyridine, 1,3-thiazole, 1,3,4-triazole, benzothiazole, benzoimidazole, benzoxazole, and 1,2,4-thiazole.

When R$^{30}$ and R$^{32}$ represent a halogen atom, the halogen atom is F, Br, or Cl.

When R$^{32}$ represents an alkoxy group, examples of the alkoxy group include methoxy, ethoxy, phenoxy, and isobutoxy.

When R$^{32}$ represents an amino group, examples of the amino group include methyl amino, acetyl amino, and methanesulfonamide.

One or more pairs of $R^{33}$ and $R^{34}$, $R^{32}$ and $R^{33}$, and $R^{32}$ and $R^{34}$ may be bonded to each other to form a five- or six-membered ring structure, and $R^{33}$ and $R^{34}$ may be bonded to each other to form a ring such as a piperazine ring, a piperidine ring, a morpholine ring, or a pyrrolidine ring.

In addition, one or more pairs of $R^{32}$ and $R^{33}$ and $R^{32}$ and $R^{34}$ may be bonded to each other to form a five- or six-membered ring structure such as a julolidine ring or a tetrahydroquinoline ring.

When $R^{32}$ represents an alkoxy group, examples of the alkoxy group include methoxy and ethoxy.

When $R^{32}$ represents an amino group, examples of the amino group include —NHCOR$^{35}$, —NHSO$_2$R$^{35}$, —NHCONHR$^{35}$, —NHCOOR$^{35}$, —NHR$^{35}$ (R$^{35}$ has the same definition as above) and —NH$_2$.

When $R^{30}$ and $R^{32}$ represent a halogen atom, the halogen atom is F, Cl, or Br.

The dyes represented by the general formulas (I) to (III) are described in detail in JP-A-11-109126, and compounds mentioned therein can be suitably used in the present invention. In the present invention, specific examples of the dyes usable as the infrared ray shielding material include the compounds mentioned in paragraph Nos. [0021] to [0033] of the patent application publication.

When those dyes are applied to the polymerizable composition for a solder resist, usually, they are used by dissolving in an organic solvent or water, but may be used by directly dissolving in a monomer used for polymerization formation. In addition, the dyes may be used in a state of solid minute particles. When using the dyes in the state of solid minute particles, they are used by uniformly dispersing by a known disperser.

The dye usable as the infrared ray shielding material in the present invention is also obtainable as a commercially available product, and suitable examples of the commercially available dye are as follows:

S0345, S0389, S0450, S0253, S0322, S0585, S0402, S0337, S0391, S0094, S0325, S0260, S0229, S0447, S0378, S0306, and S0484 manufactured by FEW Chemicals GmbH;

ADS795WS, ADS 805 WS, ADS 819 WS, ADS 820 WS, ADS 823 WS, ADS 830 WS, ADS 850 WS, ADS 845 MC, ADS 870 MC, ADS 880 MC, ADS 890 MC, ADS 920 MC, ADS 990 MC, ADS 805 PI, ADSW 805 PP, ADS 810 CO, ADS 813 MT, ADS 815 EI, ADS 816 EI, ADS 818 HT, ADS 819 MT, ADS 819 MT, ADS 821 NH, ADS 822 MT, ADS 838 MT, ADS 840 MT, ADS 905 AM, ADS 956 BP, ADS 1040P, ADS1040T, ADS1045P, ADS1040P, ADS1050P, ADS1065A, ADS1065P, ADS1100T, and ADS1120F manufactured by American Dye Source, Inc;

YKR-4010, YKR-3030, YKR-3070, YKR-5010, YKR-3090, MIR-327, MIR-371, SIR-159, PA-1005, MIR-369, MIR-379, SIR-128, PA-1006, YKR-2080, MIR-370, YKR-3040, YKR-3081, SIR-130, MIR-362, YKR-3080, SIR-132, and PA-1001 manufactured by Yamamoto Chemicals Inc.; and NK-123, NK-124, NK-1144, NK-2204, NK-2268, NK-3027, NKX-113, NKX-1199, NK-2674, NK-3508, NKX-114, NK-2545, NK-3555, NK-3509, and NK-3519 manufactured by Hayashibara Co., Ltd.

Among those dyes, from the viewpoint of thermal resistance, phthalocyanine dyes, naphthalocyanine-based dyes, the dye represented by the general formula (I), the dye represented by the general formula (II), the dye represented by the general formula (III), and metal complex dyes.

The phthalocyanine dyes and the naphthalocyanine-based dyes are more preferably those having a λmax of 900 nm or more but 1200 nm or less. Suitable examples of commercially available products of them include MIR-370, YKR-3040, YKR-3081, MIR-3081, MIR-362, and YKR-3080 (Yamamoto Chemical) and EXCOLOR IR-906 and EXCOLOR-IR-910 (NIPPON SHOKUBAI Co., Ltd.).

In addition, among the dyes represented by the general formulas (I) to (III), squarylium dyes represented by the general formula (II) are preferable. From the viewpoint of absorption wavelength, more preferable is a dihydroperimidine squarylium compound represented by general formula (I), described in Japanese Patent No. 3690707.

Those infrared ray absorbing dyes may be used alone, but two or more kinds thereof according to purpose may be used in combination in order to allow the dyes to exhibit excellent light shielding properties in the range of 800 to 1200 nm.

Examples of infrared ray absorbing metal-containing inorganic pigments usable as the infrared ray shielding material in the present invention include zinc oxide, white lead, lithopone, titanium oxide, chromium oxide, iron oxide, precipitated barium sulfate and baryta powder, red lead, red iron oxide, chrome yellow, zinc yellow (zinc yellow, type 1; zinc yellow, type 2), ultramarine blue, Prussian blue (potassium ferricyanide), zircon gray, Praseodymium yellow, chrome titan yellow, chrome green, Peacock, Victoria green, deep blue (irrelevant to Prussian blue), vanadium zircon blue, chrome tin pink, manganese pink, and salmon pink. In addition, as a black pigment, there may be used a metal oxide, a metal nitride, or a mixture thereof, which include one or two or more metal elements selected from the group consisting of Co, Cr, Cu, Mn, Ru, Fe, Ni, Sn, Ti, and Ag.

Regarding particle diameter of the inorganic pigment used as the infrared ray shielding material, an average primary particle diameter of 5 nm to 0.01 mm is preferable, and from the viewpoint of dispersibility, light shielding properties, and precipitability over time, an average primary particle diameter of 10 nm to 1 μm is preferable Among those infrared ray absorbing pigments, titanium black as a black pigment containing titanium nitride is preferable since it exhibits excellent shielding properties in the infrared region having a wavelength of 800 to 1200 nm.

Titanium black usable as an infrared ray shielding material suitable in the present invention can be obtained by a known technique. In addition, examples of commercially available products of titanium black include those manufactured by Ishihara Sangyo Kaisha, Ltd., Ako Kasei Co., Ltd., Jemco Co., Ltd., Mitsubishi Materials Corp., and Mitsubishi Materials Electronic Chemicals Co., Ltd.

It is necessary for an infrared ray shielding material used in the polymerizable composition of the present invention to have light shielding properties in infrared region, as well as to have excellent light transmission properties at a wavelength of 200 to 450 nm used for an exposure light source in patterning by photolithography, in other words, to have low light shielding properties in a range from UV region to visible light region.

In terms of a balance between the infrared ray shielding properties and the visible light transmission properties, for example, when a cured film having a thickness of 20 μm is made from the polymerizable composition of the present invention, a lowest value of optical density (OD value) of the cured film in the wavelength of 800 to 1200 nm as the infrared region is preferably less than three times a lowest value of optical density of the cured film in a wavelength of 300 to 450 nm, more preferably not more than twice that thereof, and most preferably not more than 1.5 times that thereof.

In addition, when an equivalent amount of carbon black as a pigment containing no metal is used instead of titanium black as a metal-containing inorganic pigment, a lowest value of optical density (OD value) in the wavelength of 800 to 1200 nm becomes a value of three times or more than the lowest value of optical density of the cured film in the wavelength of 300 to 450 nm.

As infrared ray shielding materials that can achieve such light shielding conditions, there may be mentioned the infrared ray absorbing dyes and the metal-containing inorganic pigments, such as titanium black, as described above. From the viewpoint of thermal resistance and pattern formability by exposure, most preferred are metal-containing inorganic pigments, such as titanium black.

Titanium black in the present invention means black particles having titanium atoms. Preferred are low-order titanium oxide, titanium oxynitride, and the like. As the titanium black particles, particles having modified surfaces may be used if needed, for purposes of improvement of dispersibility, suppression of aggregation, and the like.

Examples of surface modification method include a method for coating with one or more materials selected from silicon oxide, titanium oxide, germanium oxide, aluminum oxide, magnesium oxide, and zirconium oxide. Alternatively, surface treatment may be performed using water-repellent substances as shown in paragraph Nos. [0010] to [0027] of JP-A-2007-302836.

In addition, the titanium black may be used in combination with one or two or more of black pigments other than titanium black, such as composite oxides including Cu, Fe, Mn, V, and Ni, cobalt oxides, iron oxides, carbon black, or aniline black, for purposes of adjusting dispersibility, colorability, and the like. In this case, preferably, 50% by mass or more of the pigment is composed of titanium black particles.

Examples of a method for producing titanium black include a method in which a mixture of titanium dioxide and metallic titanium is heated for reduction in a reduction atmosphere (JP-A-49-5432), a method in which ultrafine titanium dioxide obtained by high temperature hydrolysis of titanium tetrachloride is reduced in a reduction atmosphere containing hydrogen (JP-A-57-205322), a method in which titanium dioxide or titanium hydroxide is subjected to high temperature reduction in the presence of ammonia (JP-A-60-65069 and JP-A-61-201610), and a method in which a vanadium compound is adhered to titanium dioxide or titanium hydroxide, followed by high temperature reduction in the presence of ammonia (JP-A-61-201610), although not restricted thereto.

Particle diameter of the particles of metal-containing inorganic pigments such as titanium black is not specifically restricted. From the viewpoint of dispersibility and colorability, the particle diameter of the particles thereof is preferably 3 to 2000 nm, and more preferably 10 to 500 nm.

Specific surface area of the metal-containing inorganic pigments such as titanium black is not specifically restricted. However, to obtain a predetermined water repellency after surface treatment of the metal-containing inorganic pigment using a water repellent agent, a value measured by BET method is usually about 5 to 150 $m^2/g$, and particularly preferably about 20 to 100 $m^2/g$.

(Dispersant)

In the present invention, when using a metal-containing inorganic pigment as the infrared ray shielding material, to improve dispersibility and dispersion stability in the polymerizable composition, the pigment may be dispersed by using a known dispersant.

Examples of the dispersant to be used in the present invention include polymeric dispersants [for example, polyamide amine and a salt thereof, polycarboxylic acid and a salt thereof, high molecular weight unsaturated acid ester, modified polyurethane, modified polyester, modified poly(meth)acrylate, (meth)acrylic copolymer, and naphthalene sulfonate-formalin condensate], polyoxyethylene alkyl phosphoric ester, polyoxyethylene alkyl amine, alkanol amine, and pigment derivatives.

The polymeric dispersants can be further classified into linear polymers, terminal-modified polymers, graft polymers, and block polymers in terms of their structure.

The polymeric dispersants serve to adsorb onto the pigment surface to prevent reaggregation. Accordingly, as polymeric dispersants having a preferable structure, there can be mentioned a terminal modified polymer, a graft polymer, and a block polymer, which have an anchoring site for the pigment surface.

On the other hand, the pigment derivatives exhibit effect of promoting adsorption of the polymeric dispersant by modification of the pigment surface.

Examples of the terminal-modified polymer having an anchoring site for the pigment surface include polymers having a phosphate group at a terminal thereof described in JP-A-3-1129992, JP-A-2003-533455 and the like, polymers having a sulfonate group at a terminal thereof described in JP-A-2002-273191 and the like, polymers having a partial skeleton of an organic dye or a hetero ring described in JP-A-9-77994 and the like, polymers produced by modifying an oligomer or polymer having a hydroxyl group or an amino group at one terminal thereof with an acid anhydride described in JP-A-2008-29901 and the like. In addition, a polymer produced by introducing two or more anchoring sites (such as an acid group, a basic group, a partial skeleton of an organic dye, and a hetero ring) for pigment surfaces to the polymer terminal described in JP-A-2007-277514 is also preferable because of its dispersion stability.

Examples of the graft polymer having an anchoring site for the pigment surface include reaction products of a poly(lower alkyleneimine) and polyester described in JP-A-54-37082, JP-A-8-507960, JP-A-2009-258668, and the like, reaction products of polyallylamine and polyester described in JP-A-9-169821 and the like, copolymers of a macromonomer and a nitrogen atom monomer described in JP-A-10-339949, JP-A-2004-37986, and the like, graft polymers having a partial skeleton of an organic dye or a hetero ring described in JP-A-2003-238837, JP-A-2008-9426, JP-A-2008-81732, and the like, and copolymers of a macromonomer and a monomer containing an acid group described in JP-A-2010-106268 and the like. Particularly, an amphoteric dispersion resin having a basic group and an acid group described in JP-A-2009-203462 is particularly preferable from the viewpoint of dispersibility and dispersion stability of a pigment dispersion composition and developability exhibited by a polymerizable composition using the pigment dispersion composition.

Examples of a macromonomer used to produce the graft polymer having an anchoring site for the pigment surface by radical polymerization include known macromonomers, such as AA-6 (polymethyl methacrylate having a methacryloyl group as a terminal group), AS-6 (polystyrene having a methacryloyl group as a terminal group), AN-6S (a copolymer of styrene and acrylonitrile having a methacryloyl group as a terminal group), and AB-6 (polybutyl acrylate having a methacryloyl group as a terminal group) as macromonomers manufactured by Toagosei Co., Ltd; PRACCEL FM5 (a 5-mole ε-caprolactone adduct of 2-hydroxyethyl methacrylate) and FA 10L (a 10-mole ε-caprolactone adduct of 2-hydroxyethyl methacrylate) manufactured by Daicel Chemical industries Ltd.; and a polyester-based macromonomer described in JP-A-2-272009. Among them, particularly, the polyester-based macromonomer having excellent flexibility and solvophilic properties is particularly preferable from the viewpoint of dispersibility and dispersion stability of a pigment dispersion composition and developability exhibited by a polymerizable composition using the pigment dispersion composition. Furthermore, a polyester-based macromonomer represented by the polyester-based macromonomer described in JP-A-2-272009 is most preferable.

As the block polymer having an anchoring site for the pigment surface, preferred are block polymers described in JP-2003-49110, JP-A-2009-52010, and the like.

The dispersant usable in the present invention can also be obtained as a commercially available product.

Specifically, many kinds of compounds are usable. Examples of usable compounds include "DYSPERBYK-101 (polyamideamine phosphate), 107 (carboxylate), 110 (copolymer containing an acid group), 130 (polyamide), 161, 162, 163, 164, 165, 166, and 170 (high molecular weight copolymer)" and "BYK-P104 and P105 (high molecular weight unsaturated polycarboxylic acid)" that are manufactured by BYK Chemie GmbH; "EFKA4047, 4050-4010-4165 (polyurethane-based), EFKA4330-4340 (block copolymer), 4400-4402 (modified polyacrylate), 5010 (polyesteramide), 5765 (high molecular weight polycarboxylate), 6220 (fatty acid polyester), 6745 (phthalocyanine derivative), and 6750 (azo pigment derivative)" manufactured by BASF Japan Co. Ltd.; "AJISPER PB821, PB822, PB880, and PB881" manufactured by Ajinomoto Fine-Techno Co., Inc.; "FLOWLEN TG-710 (urethane oligomer)" and "POLYFLOW No. 50E and No. 300 (acrylic copolymer)" manufactured by Kyoeisya Chemical Co., Ltd.; "DISPAR-LON KS-860, 873SN, 874, #2150 (aliphatic polyvalent carboxylic acid), #7004 (polyether ester), and DA-703-50, DA-705, and DA-725" manufactured by Kusumoto Chemicals Ltd.; "DEMOL RN, N (naphthalenesulfonate-formalin poly-condensation product), MS, C, SN-B (aromatic sulfonate-formalin poly-condensation product)", "HOMOGE-NOL L-18 (high molecular polycarboxylic acid)", "EMUL-GEN 920, 930, 935, and 985 (polyoxyethylene nonylphenyl ether)", and "ACETAMIN 86 (stearylamine acetate)" manufactured by Kao Corporation; "SOLSPERSE 5000 (phthalocyanine derivative), 22000 (azo pigment derivative), 13240 (polyesteramine), 3000, 17000, 27000 (polymer having a functional group at a terminal thereof), 24000, 28000, 32000, and 38500 (graft polymer)" manufactured by Avecia Co., Ltd.; "NIKKOLE T106 (polyoxyethylene sorbitanmonooleate) and MYS-IEX (polyoxyethylene monostearate)" manufactured by Nikko Chemicals Co., Ltd.; and "HINO-ACT T-8000E" manufactured by Kawaken Fine Chemicals Co., Ltd.

Those dispersants may be used alone or in combination of two or more kinds thereof. In the present invention, particularly, it is preferable to use a combination of a pigment derivative and a polymeric dispersant. In addition, the dispersant usable in the present invention may be used in combination of an alkali-soluble resin and the terminal-modified polymer, the graft polymer, or the block polymer having an anchoring site for the pigment surface. Examples of the alkali-soluble resin include (meth)acrylic acid copolymers, itaconic acid copolymers, crotonic acid copolymers, maleic acid copolymers, partially esterified maleic acid copolymers, and the like, as well as acidic cellulose derivatives having a carboxylic acid in the side chain, and resin prepared by modifying a polymer having a hydroxyl group with an acid anhydride. Particularly, preferred are (meth)acrylic acid copolymers. In addition, an N-position-substituted maleimide monomer copolymer described in JP-A-10-300922, a copolymer of ether dimer described in JP-A-2004-300204, and an alkali-soluble resin containing a polymerizable group described in JP-A-7-319161 are also preferable.

From the viewpoint of dispersibility, developability, and precipitability, preferably, resins shown blow are preferable, and particularly from the viewpoint of dispersibility, preferred is a polymeric dispersant having a polyester chain at a side chain thereof. In addition, from the viewpoint of dispersibility and developability of a pattern formed by photolithography, preferred is a resin having an acid group and a polyester chain. Preferable acid groups in the dispersant are acid groups having a pKa of 6 or less, and particularly preferred are carboxylic acid, sulfonic acid, and phosphoric acid, from the viewpoint of adsorption properties.

Hereinafter, a description will be given of a dispersion resin preferably used in the present invention.

The preferable dispersion resin has a number of atoms excluding hydrogen atoms in the molecule thereof ranging from 40 to 10000 and is a graft copolymer having a graft chain selected from a polyester structure, a polyether structure, and a polyacrylate structure. In addition, the preferable dispersion resin is a graft copolymer including a structural unit represented by any one of the following formulas (11) to (15).

Particularly, when using the graft copolymer including a structural unit represented by any one of the following formulas (11) to (15) as preferable embodiments of the present invention in the polymerizable composition, hydrophilicity of the graft chain is further improved. This further improves developability of the graft copolymer, so that excellent dispersibility and residue reduction in development can be both obtained at high level

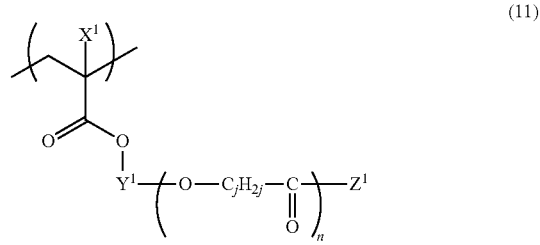

(11)

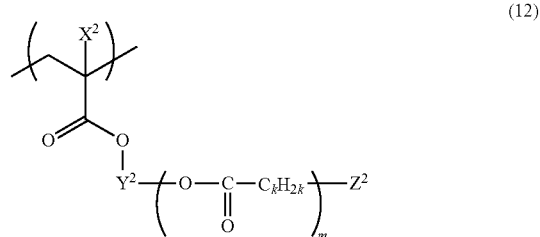

(12)

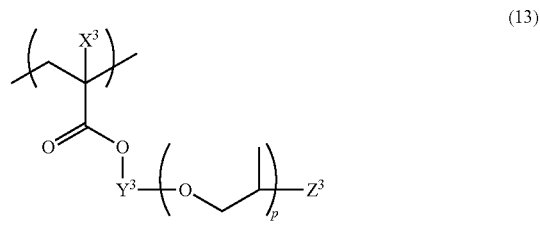

(13)

-continued

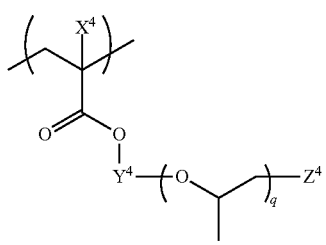
(14)

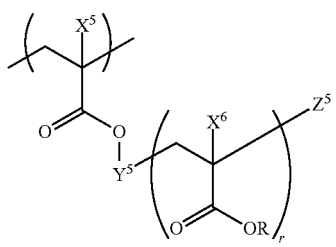
(15)

In the formulas (11) to (15), $X^1$, $X^2$, $X^3$, $X^4$, $X^5$, and $X^6$ each independently represent a hydrogen atom or a monovalent organic group. From the viewpoint of synthetic restrictions, $X^1$, $X^2$, $X^3$, $X^4$, $X^5$, and $X^6$ each independently represent, preferably a hydrogen atom or an alkyl group having 1 to 12 carbon atoms, more preferably a hydrogen atom or a methyl group, and particularly preferably a methyl group.

In the formulas (11) to (15), $Y^1$, $Y^2$, $Y^3$, $Y^4$, and $Y^5$ each independently are a divalent linking group and not restricted to any specific structure. Specific examples of the divalent linking group include those represented by the following (Y-1) to (Y-20). In the following structures, A means bonding of $Y^1$, $Y^2$, $Y^3$, $Y^4$, or $Y^5$ with a left terminal group in the formulas (11) to (15), and B means bonding of $Y^1$, $Y^2$, $Y^3$, $Y^4$, or $Y^5$ with a right terminal group in the formulas (11) to (15). Among the structures shown below, the structures of (Y-2) and (Y-13) are more preferable in terms of synthetic convenience.

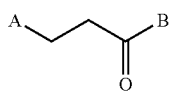
(Y-1)

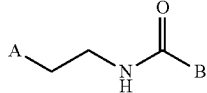
(Y-2)

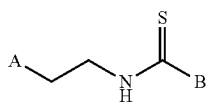
(Y-3)

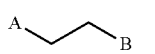
(Y-4)

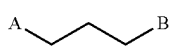
(Y-5)

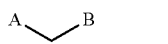
(Y-6)

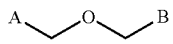
(Y-7)

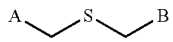
(Y-8)

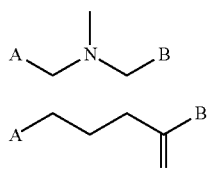
(Y-9)

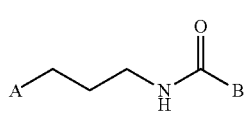
(Y-10)

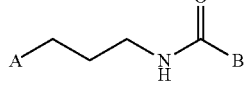
(Y-11)

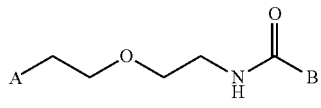
(Y-12)

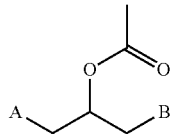
(Y-13)

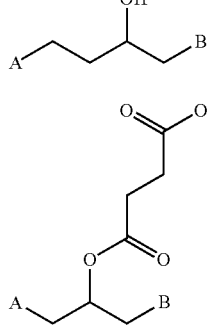
(Y-14)

(Y-15)

(Y-16)

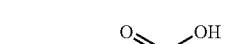
(Y-17)

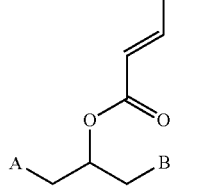

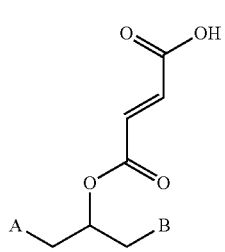
(Y-18)

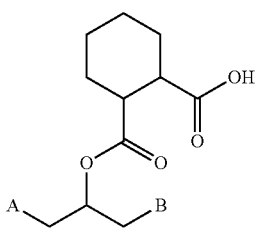

(Y-19)

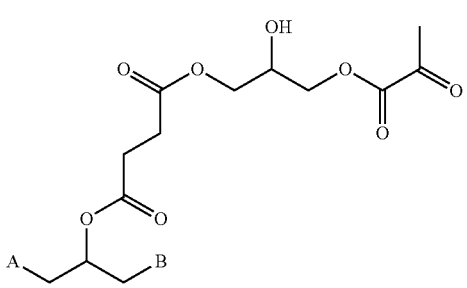

(Y-20)

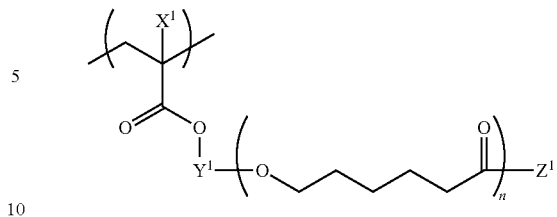

In the formulas (11) to (15), $Z^1$, $Z^2$, $Z^3$, $Z^4$, and $Z^5$ each independently represent a hydrogen atom or a monovalent organic group and are not restricted to any specific structure. Specific examples of the organic group include alkyl groups, hydroxyl groups, alkoxy groups, aryloxy groups, heteroaryloxy groups, alkylthioether group, arylthioether groups, heteroarylthioether groups, and amino groups. Among them, particularly from the viewpoint of dispersibility improvement, it is preferable to have steric repulsion effect, and preferred are alkoxy groups having 5 to 24 carbon atoms, among which, particularly, branched alkoxy groups having 5 to 24 carbon atoms or cyclic alkyloxy groups having 5 to 24 carbon atoms are preferred.

In the formulas (11) to (15), n, m, p, q, and r each are an integer of 1 to 500, preferably an integer of 3 to 100, and more preferably an integer of 5 to 50.

In the formulas (11) and (12), j and k each independently represent an integer of 2 to 8. From dispersion stability and developability, the j and the k in the formulas (11) and (12) each independently represent preferably an integer of 4 to 6, and most preferably 5.

In the formula (15), R represents a hydrogen atom or a monovalent organic group and is not restricted to any specific structure. Preferably, the R is a hydrogen atom, an alkyl group, an aryl group, or a heteroaryl group, and more preferably, a hydrogen atom or an alkyl group. When the R is an alkyl group, the alkyl group is preferably a linear alkyl group having 1 to 20 carbon atoms, a branched alkyl group having 3 to 20 carbon atoms, or a cyclic alkyl group having 5 to 20 carbon atoms, more preferably a linear alkyl group having 1 to 20 carbon atoms, and particularly preferably a linear alkyl group having 1 to 6 carbon atoms.

In addition, as R in the formula (15), two or more Rs having different structures may be included in a specific resin.

The structural unit represented by the formula (11) is more preferably a structural unit represented by the following formula (1A) from the viewpoint of dispersion stability and developability.

In addition, the structural unit represented by the formula (12) is more preferably a structural unit represented by the following formula (2A) from the viewpoint of dispersion stability and developability.

In the formula (1A), $X^1$, $Y^1$, $Z^1$, and n have the same definitions and the same preferable definitions as $X^1$, $Y^1$, $Z^1$, and n in the formula (11), respectively.

In the formula (2A), $X^2$, $Y^2$, $Z^2$, and m have the same definitions and the same preferable definitions as $X^2$, $Y^2$, $Z^2$, and m in the formula (12), respectively.

In the specific resin to be used in the present invention, an amount of the structural units represented by any of the formulas (11) to (15) (a total amount of the structural units when plural kinds of the structural units represented by any of the formulas (11) to (15) are included) is preferably in a range of 10 to 90% by mass, and more preferably in a range of 30 to 70% by mass, with respect to a total mass of the specific resin. Within the above range, dispersibility of titanium dioxide particles is high, so that developability of the polymerizable composition prepared becomes more favorable. In addition, the specific resin to be used in the present invention may be a combination of two or more graft copolymers having different structures.

In the formula (15), R represents a hydrogen atom or a monovalent organic group and is not restricted to any specific structure. Preferably, the R is a hydrogen atom, an alkyl group, an aryl group, or a heteroaryl group, and more preferably, a hydrogen atom or an alkyl group. In addition, two or more Rs having different structures may be included in the specific resin. For example, when plural Rs are present in the structural units represented by the formula (15), the plural Rs may be the same or different. Alternatively, in the specific resin, the structural units represented by the formula (15) may be the same or different.

Specific examples of compounds will be shown as below. In the following exemplary compounds, numerical values added to the respective structural units indicate contents of the structural units [% by mass: shown as wt % as needed].

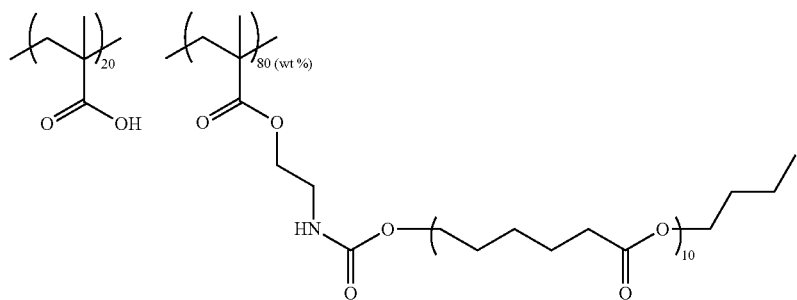
(Exemplary Compound 1)
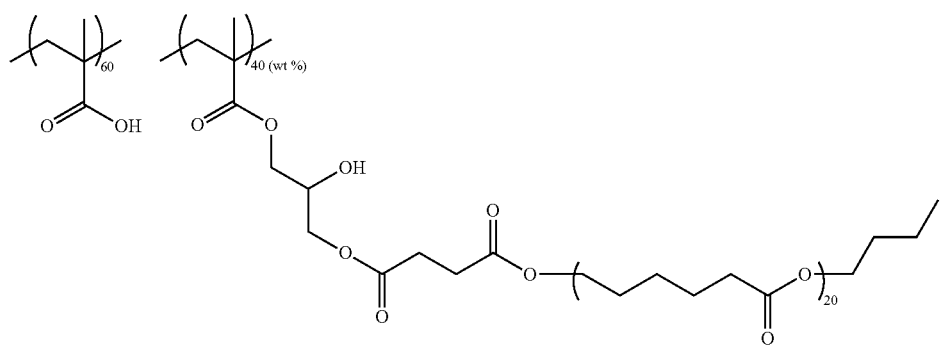
(Exemplary Compound 2)
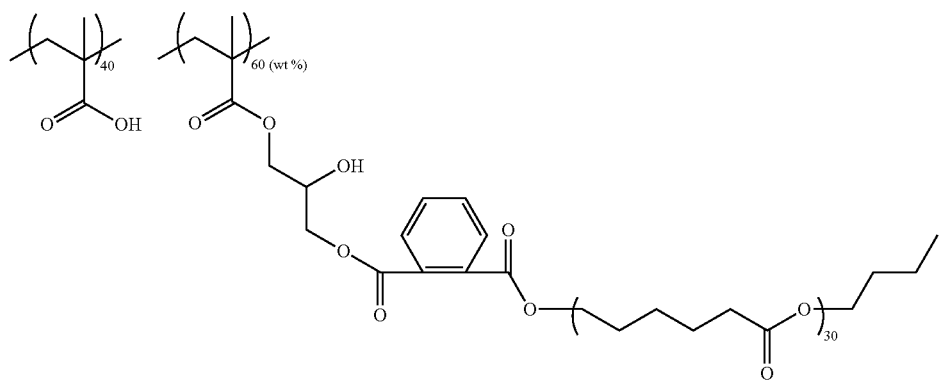
(Exemplary Compound 3)
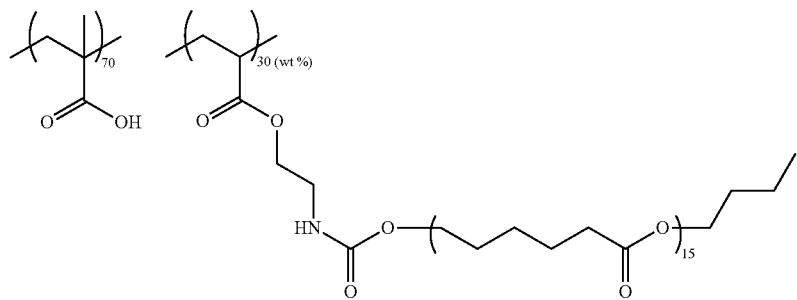
(Exemplary Compound 4)

(Exemplary Compound 5)
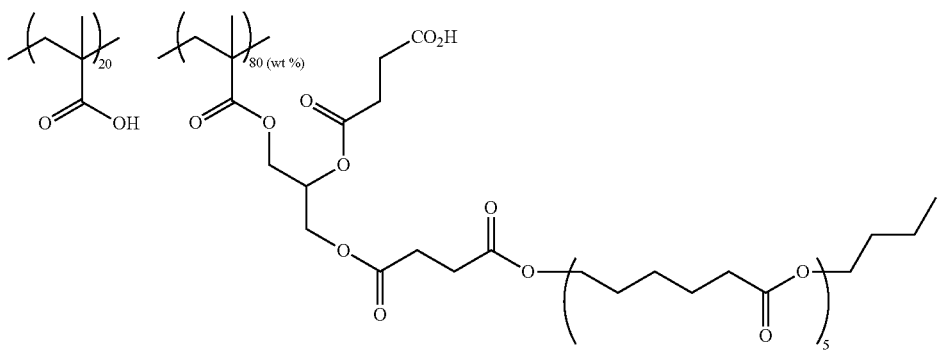
(Exemplary Compound 6)
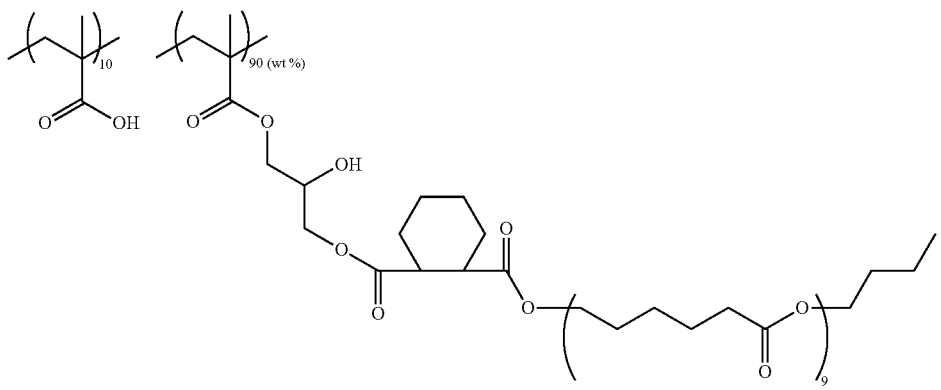
(Exemplary Compound 7)
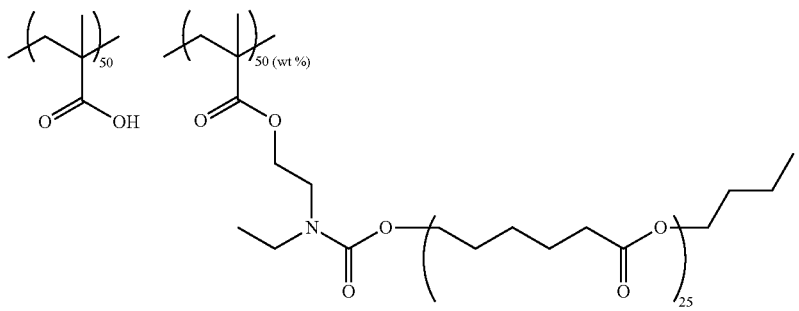
(Exemplary Compound 8)
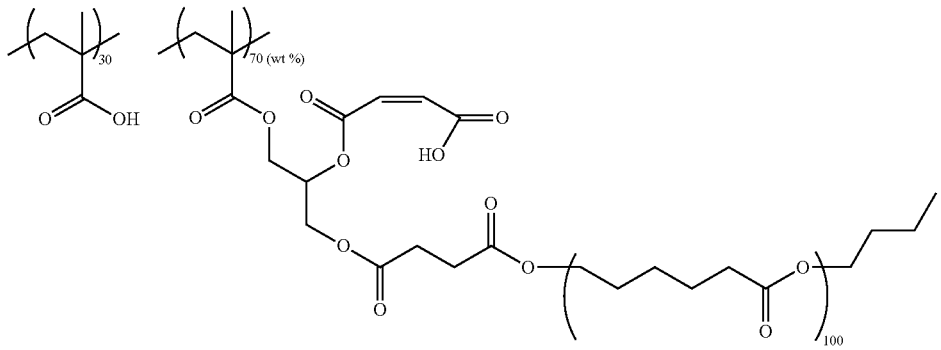

(Exemplary Compound 9)
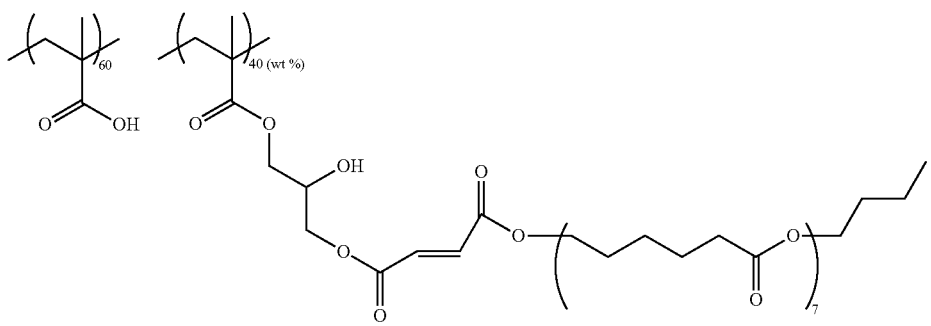
(Exemplary Compound 10)
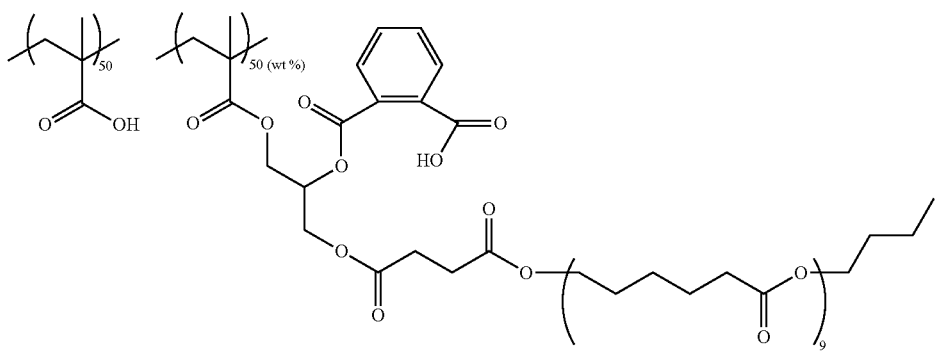
(Exemplary Compound 11)
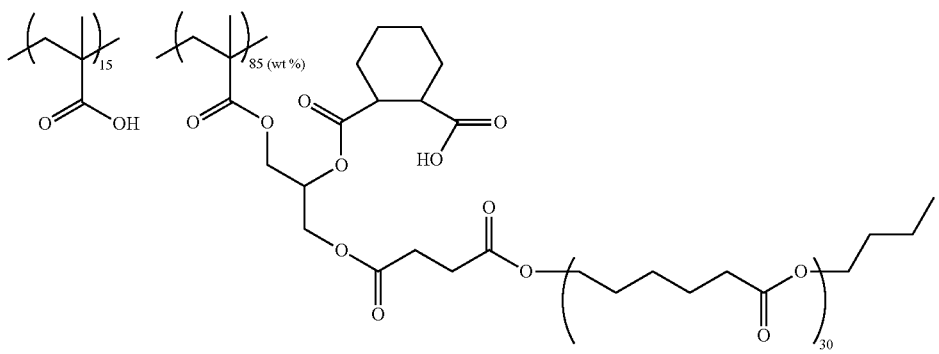
(Exemplary Compound 12)
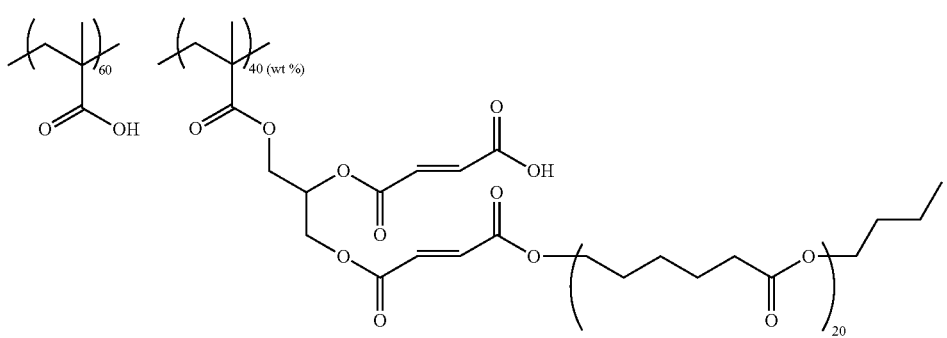

-continued
(Exemplary Compound 13)
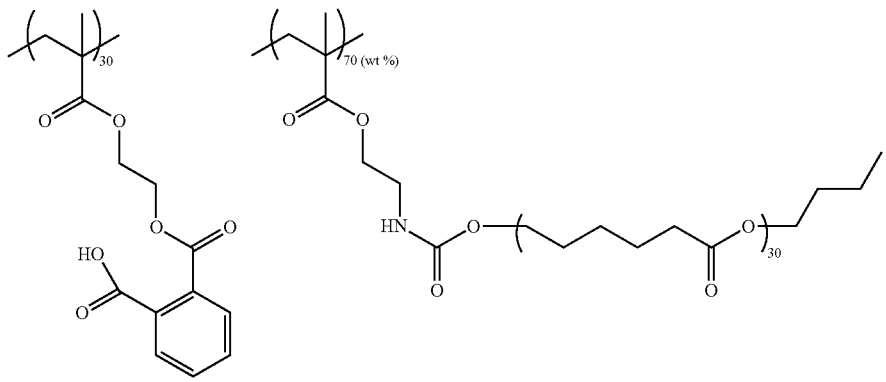
(Exemplary Compound 14)
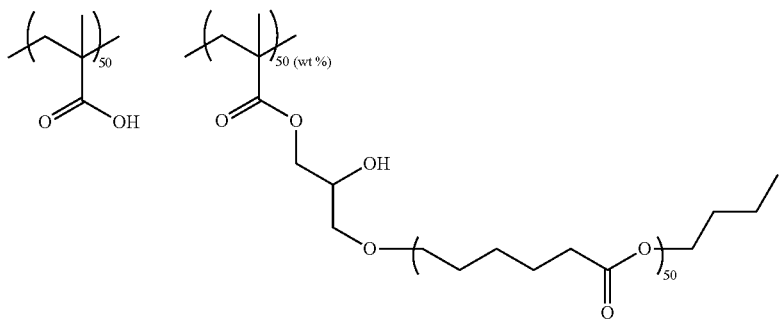
(Exemplary Compound 15)
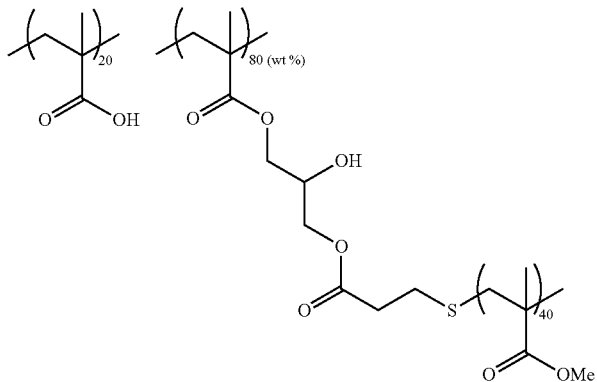
(Exemplary Compound 16)
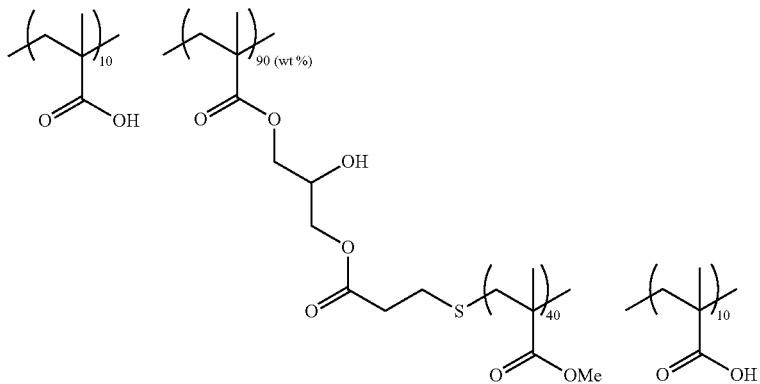

(Exemplary Compound 20)
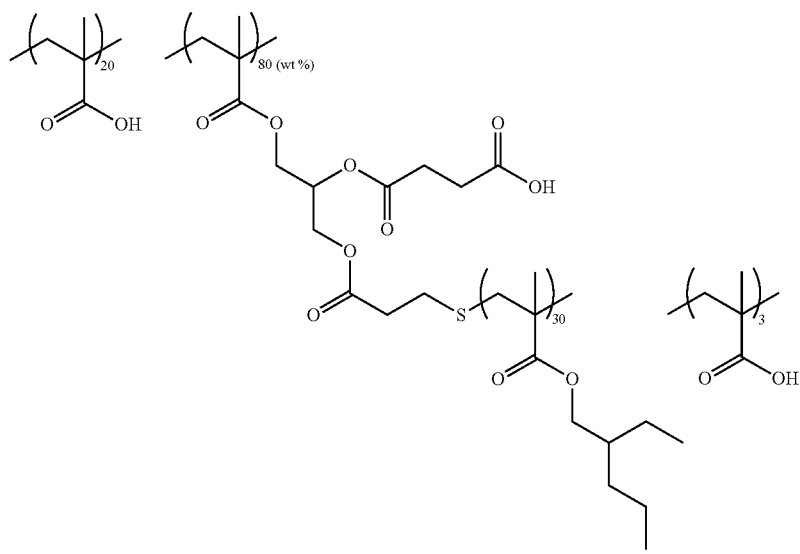
(Exemplary Compound 21)
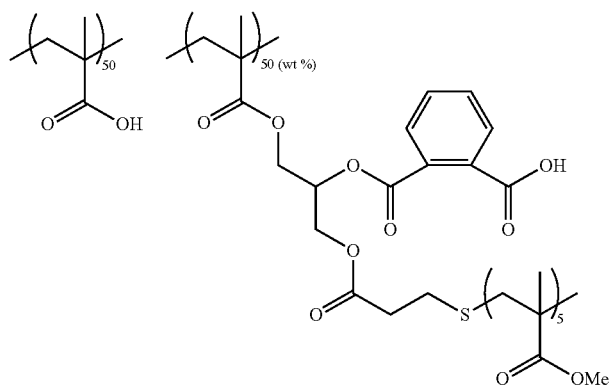
(Exemplary Compound 22)
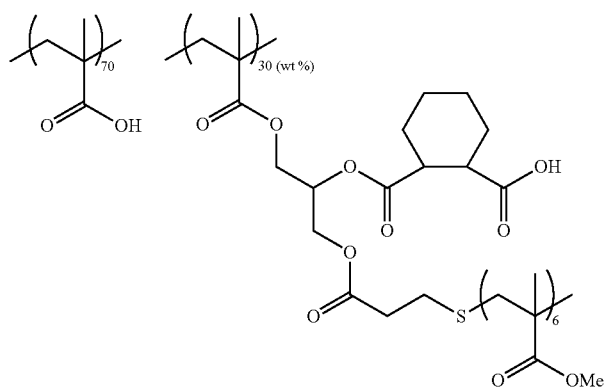

(Exemplary Compound 23)
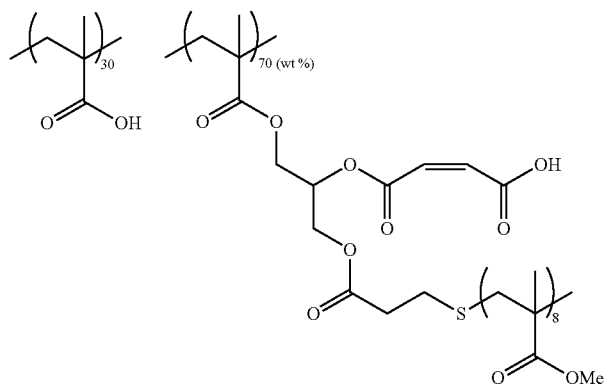
(Exemplary Compound 24)
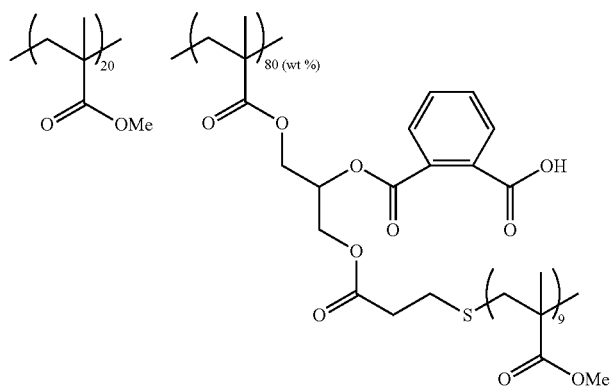
(Exemplary Compound 25)
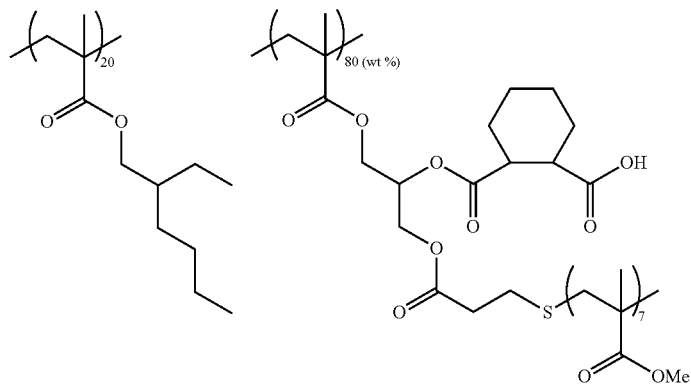
(Exemplary Compound 26)
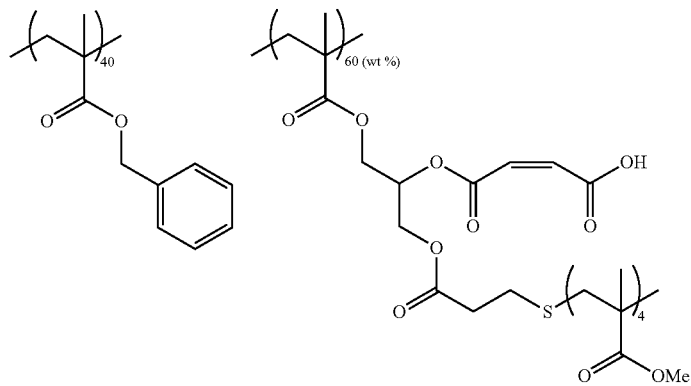

(Exemplary Compound 27)
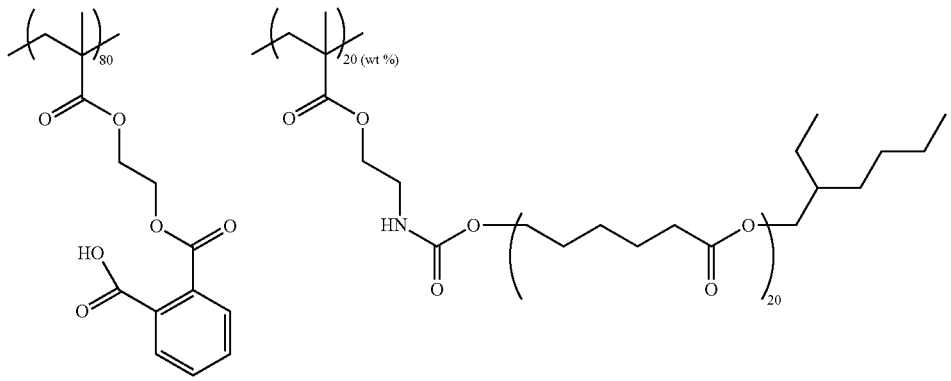
(Exemplary Compound 28)
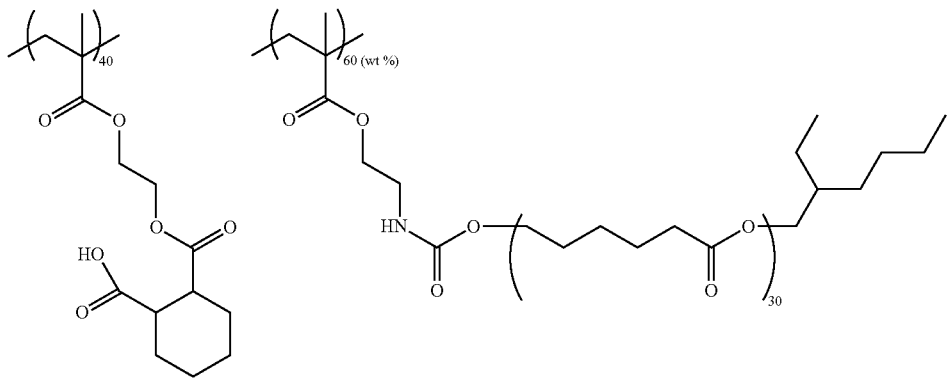
(Exemplary Compound 29)
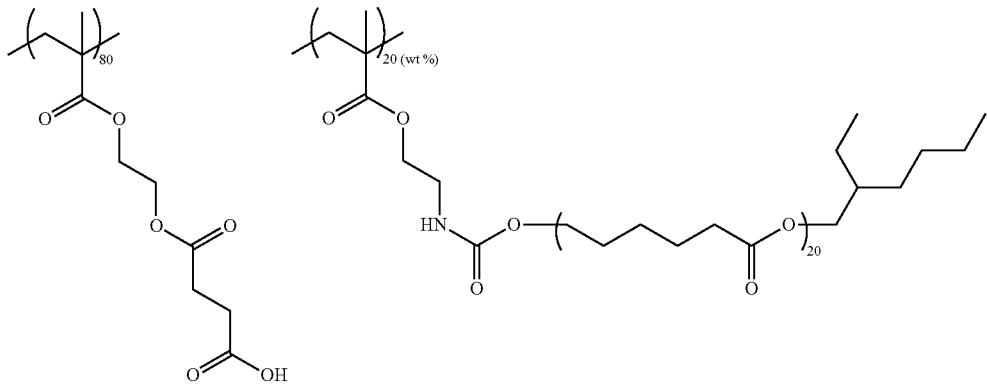
(Exemplary Compound 30)
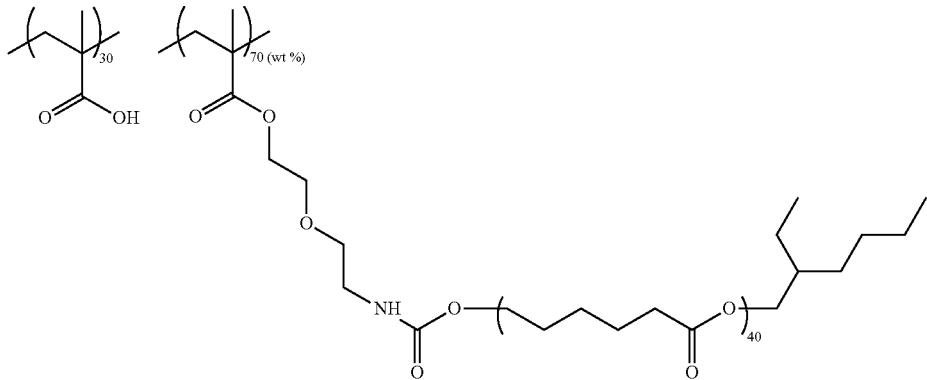

(Exemplary Compound 31)
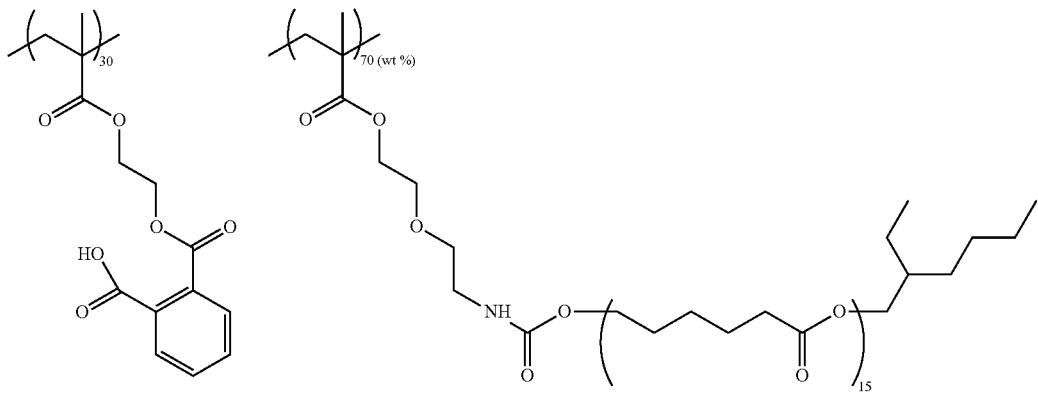
(Exemplary Compound 32)
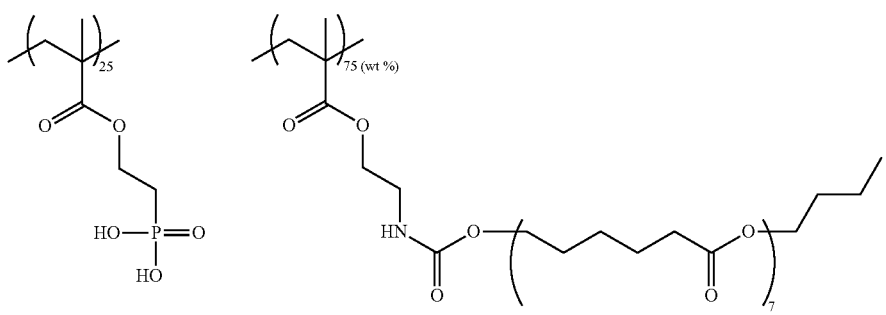
(Exemplary Compound 33)
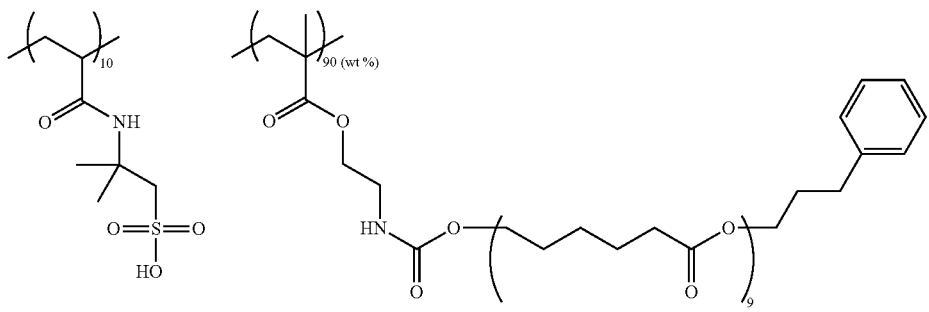
(Exemplary Compound 34)
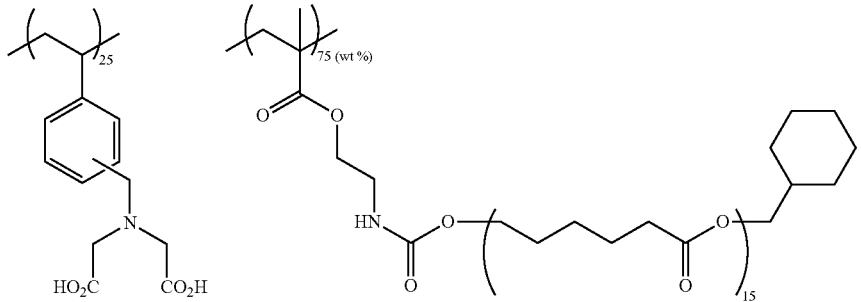

-continued
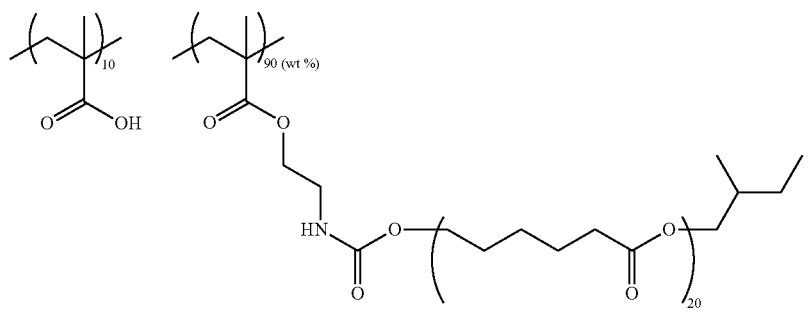
(Exemplary Compound 35)
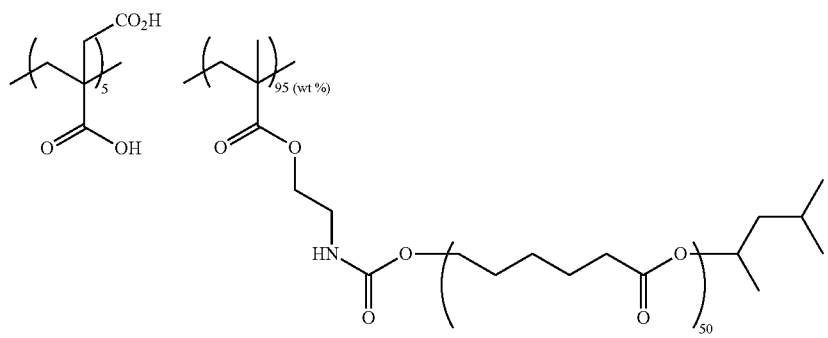
(Exemplary Compound 36)
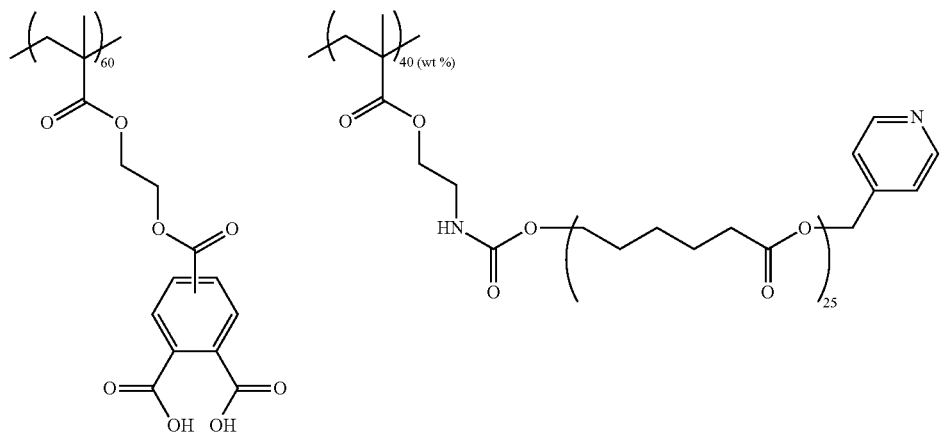
(Exemplary Compound 37)
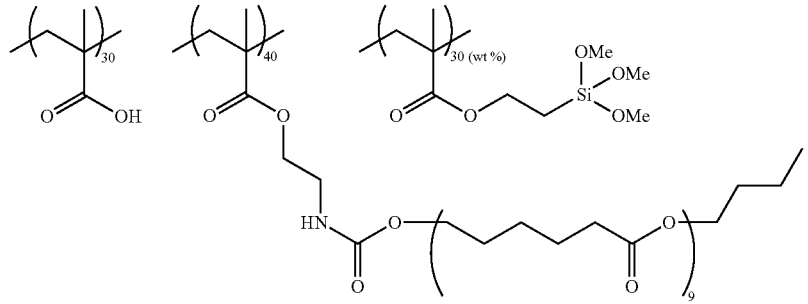
(Exemplary Compound 38)

-continued
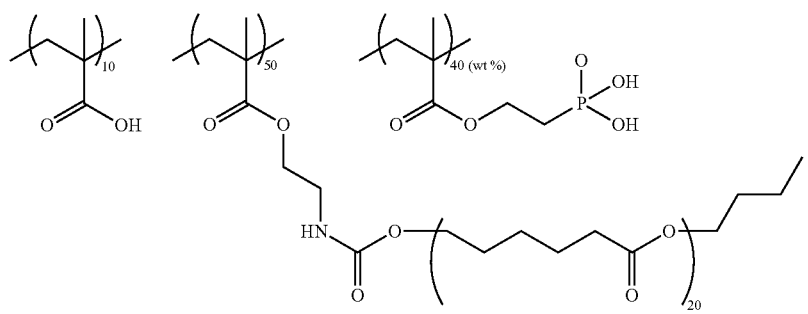
(Exemplary Compound 39)
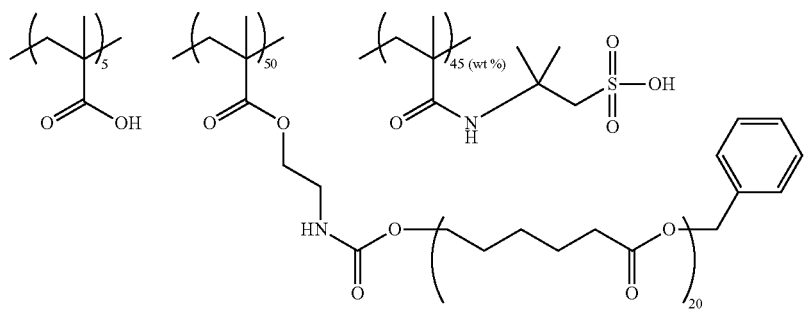
(Exemplary Compound 40)
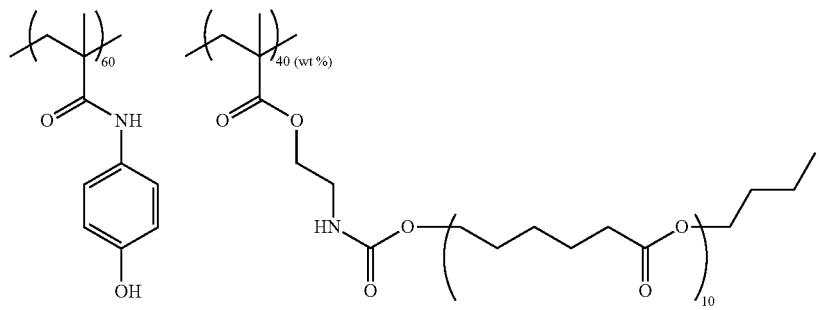
(Exemplary Compound 41)
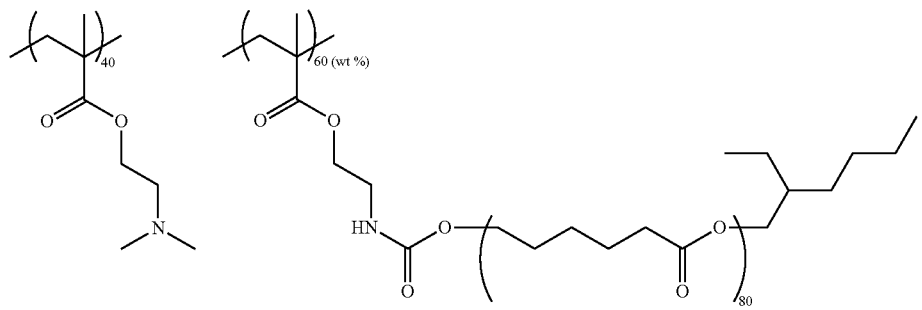
(Exemplary Compound 42)
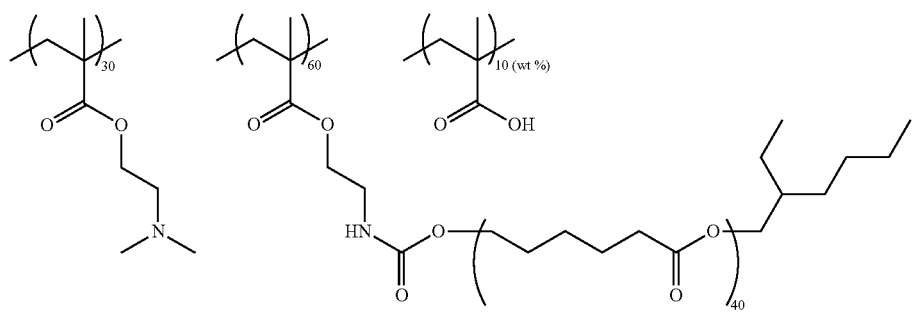
(Exemplary Compound 43)

-continued
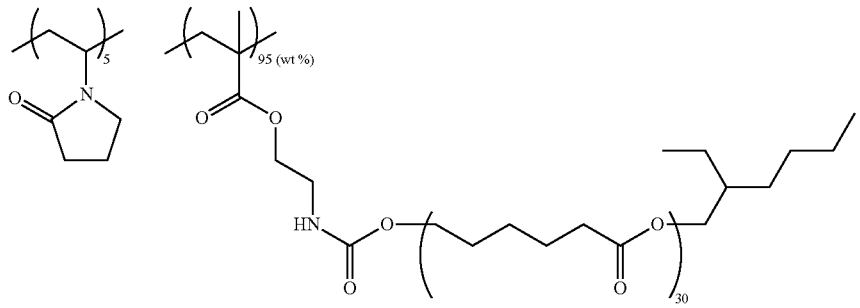
(Exemplary Compound 44)
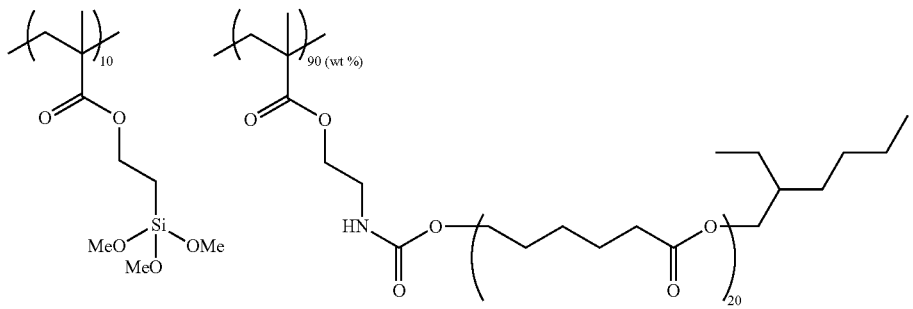
(Exemplary Compound 45)
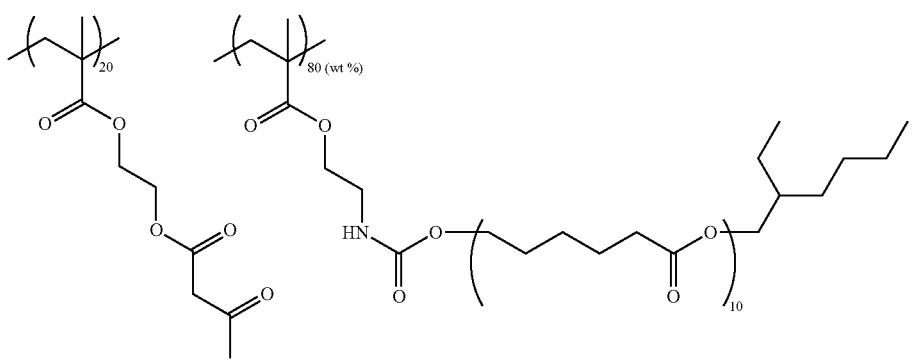
(Exemplary Compound 46)
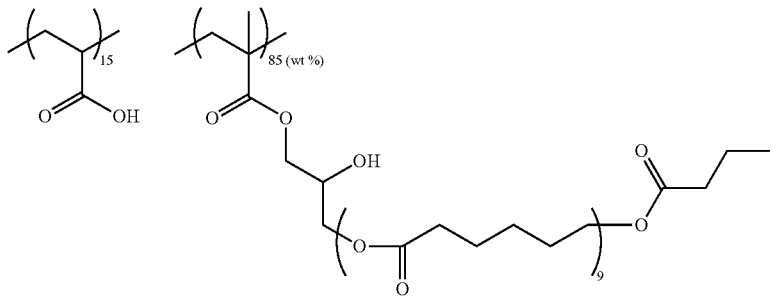
(Exemplary Compound 47)
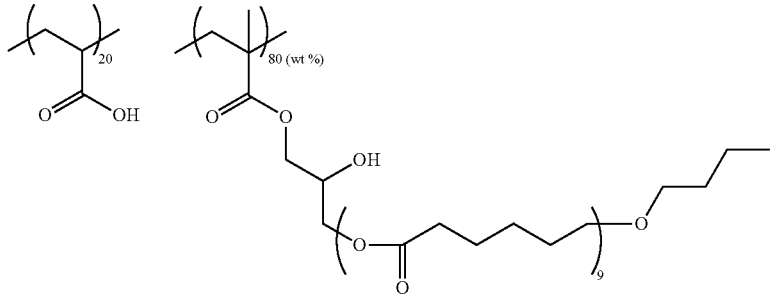
(Exemplary Compound 48)

-continued
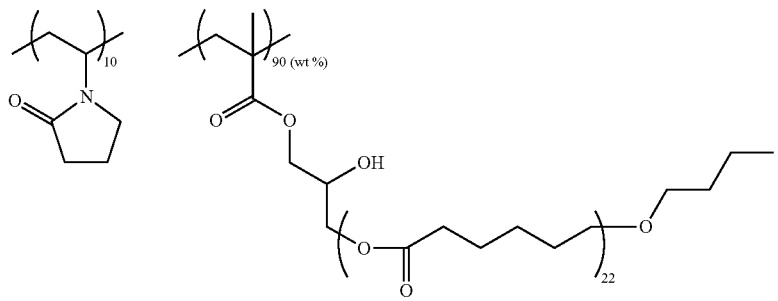
(Exemplary Compound 49)
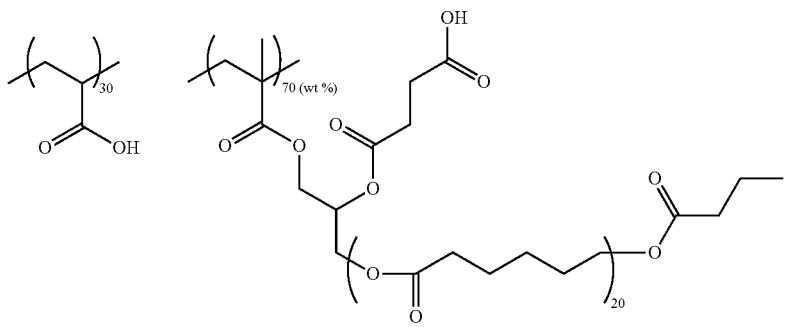
(Exemplary Compound 50)
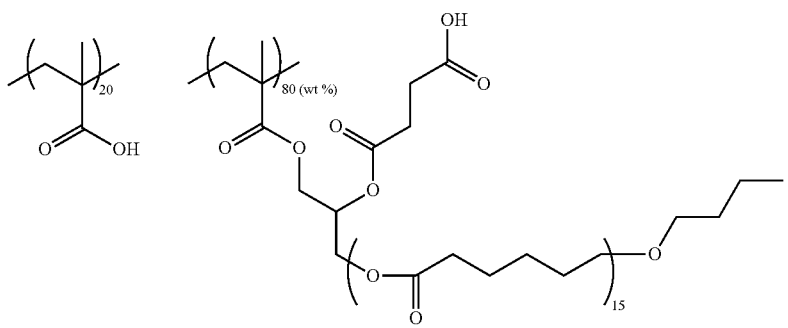
(Exemplary Compound 51)
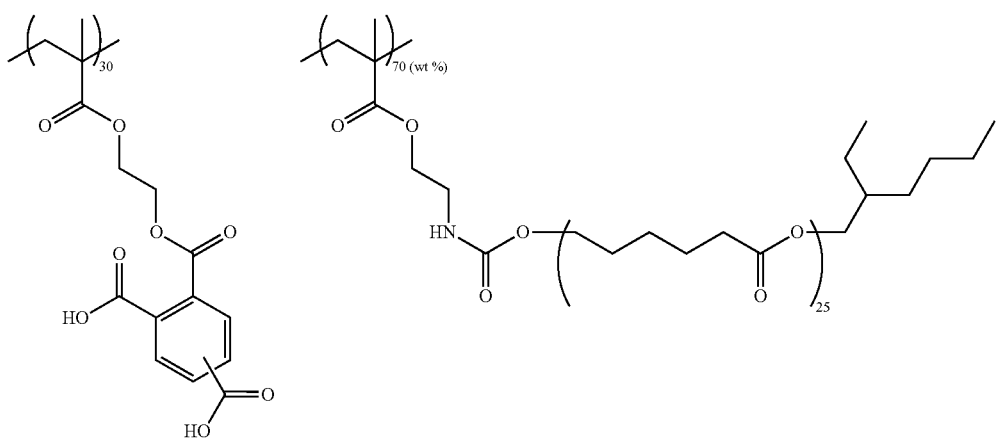
(Exemplary Compound 52)

(Exemplary Compound 53)
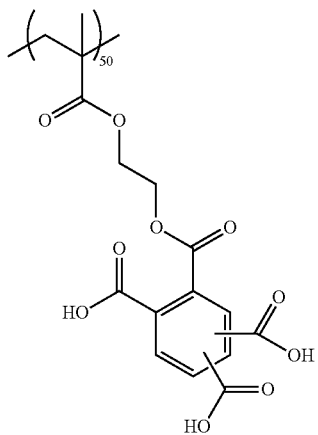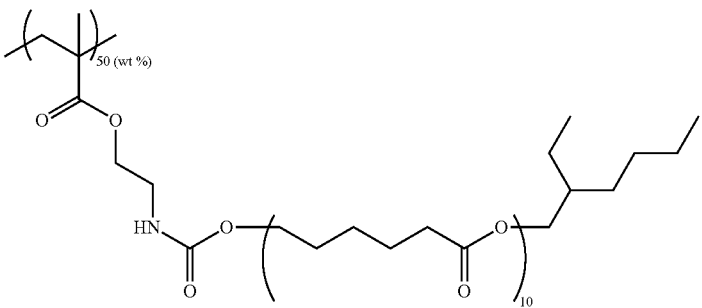
(Exemplary Compound 54)
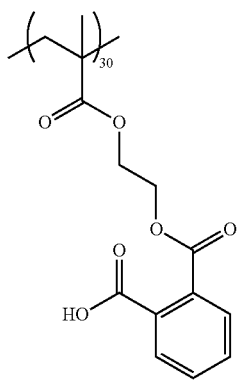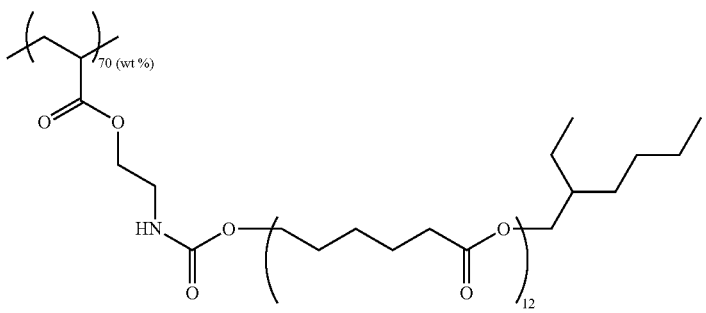
(Exemplary Compound 55)
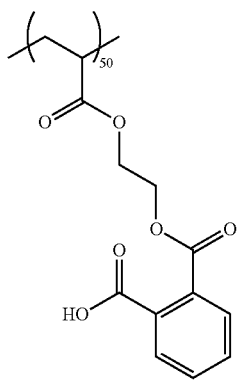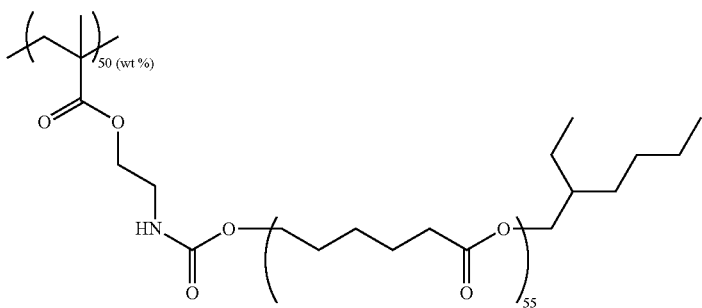
(Exemplary Compound 56)
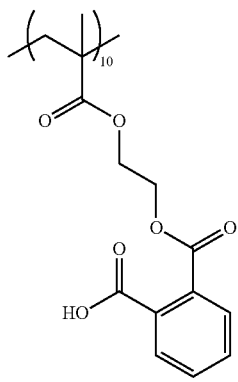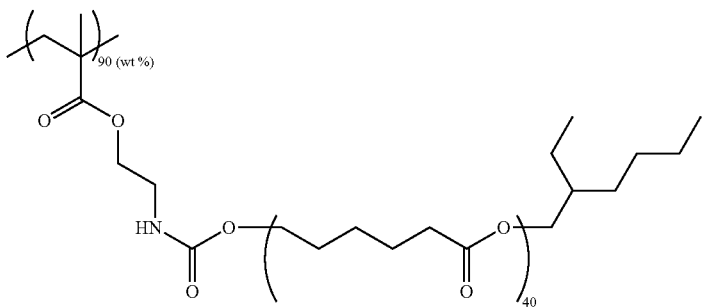

(Exemplary Compound 57)
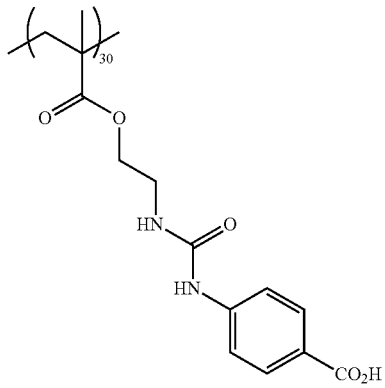 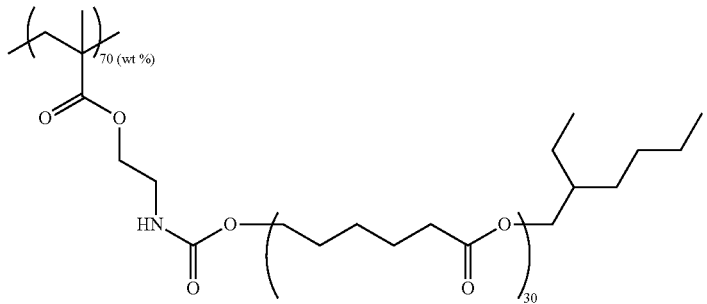
(Exemplary Compound 58)
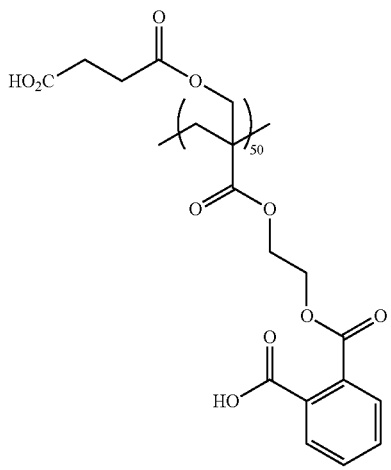 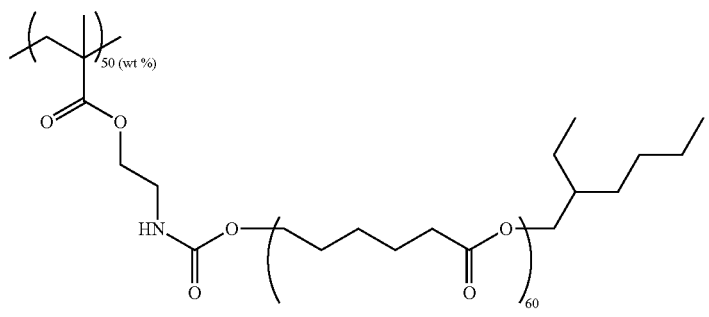
(Exemplary Compound 59)
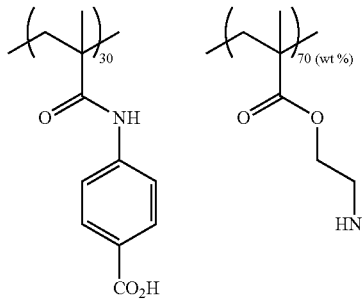 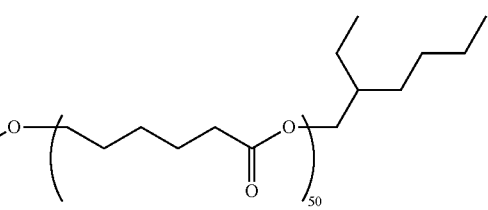
(Exemplary Compound 60)
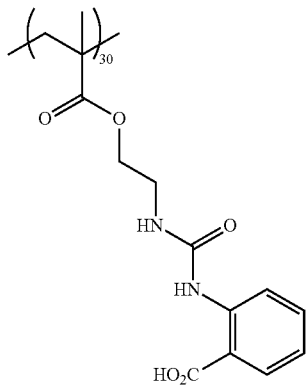 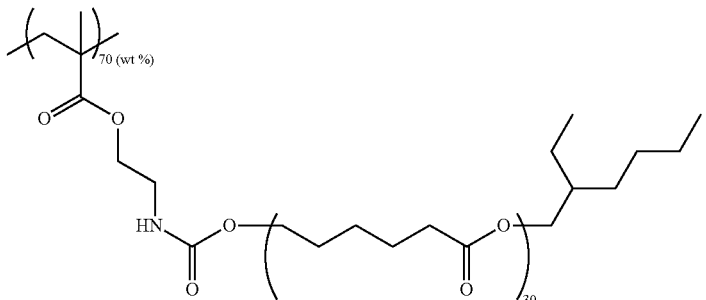

(Exemplary Compound 61)
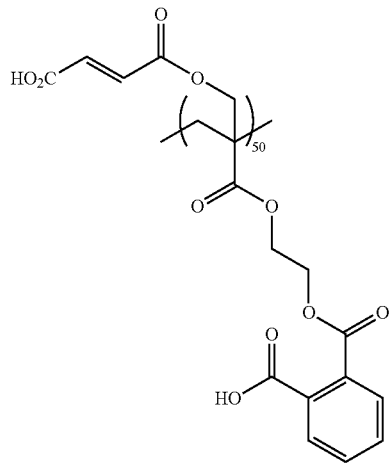 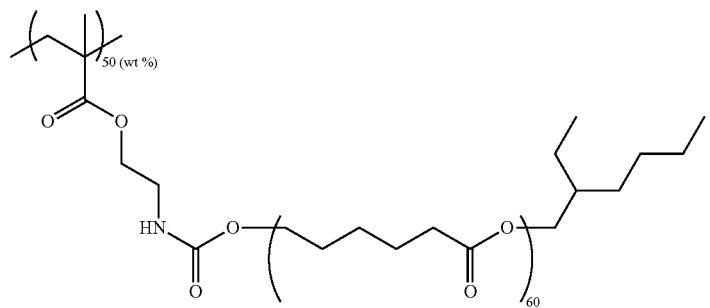
(Exemplary Compound 62)
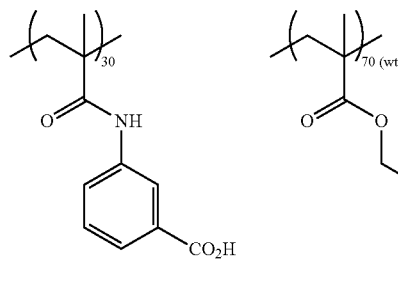 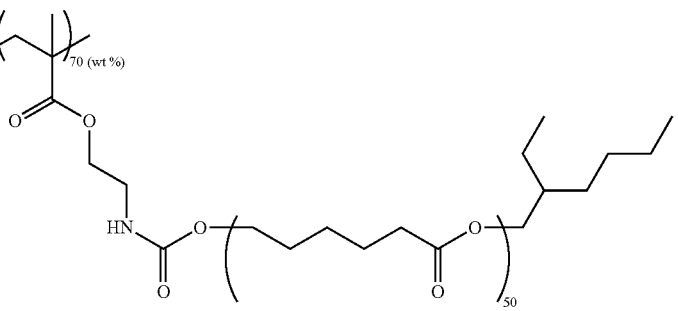
(Exemplary Compound 63)
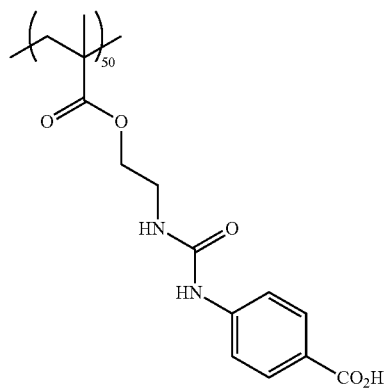 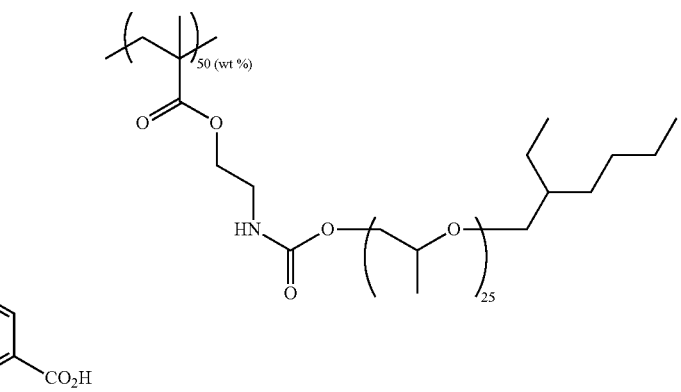
(Exemplary Compound 64)
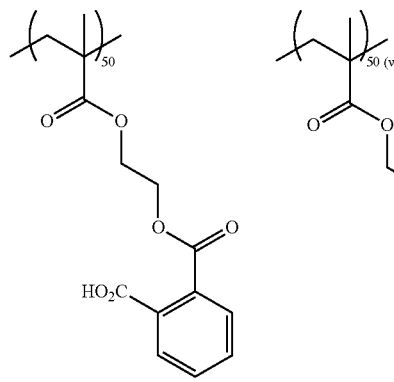 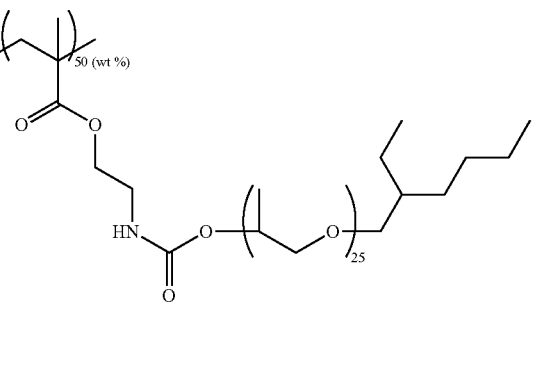

-continued
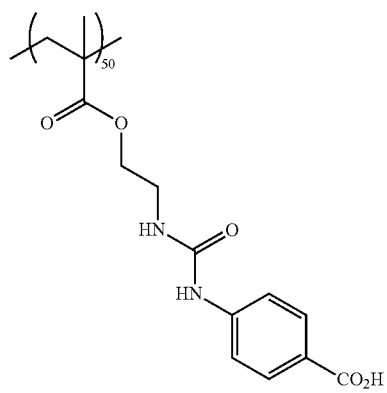 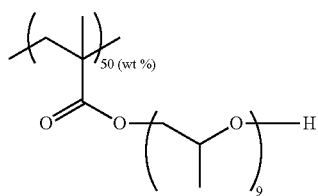
(Exemplary Compound 65)
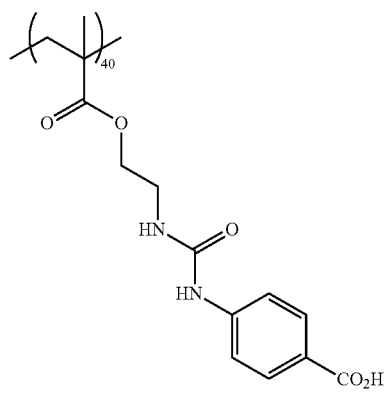 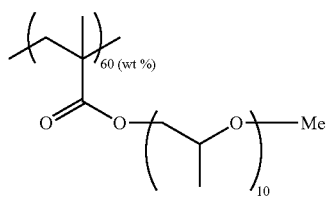
(Exemplary Compound 66)
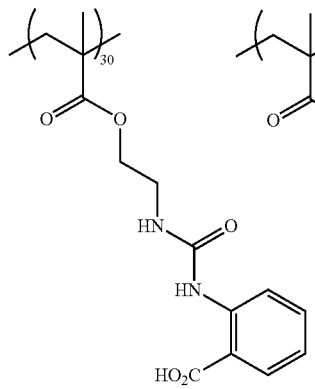 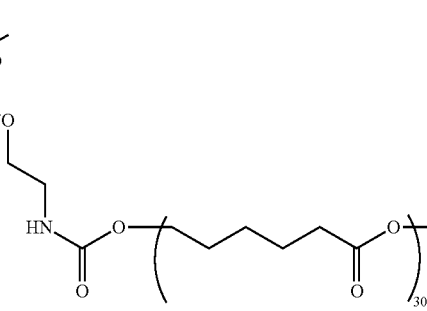 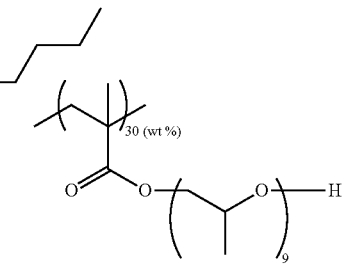
(Exemplary Compound 67)

-continued
(Exemplary Compound 68)
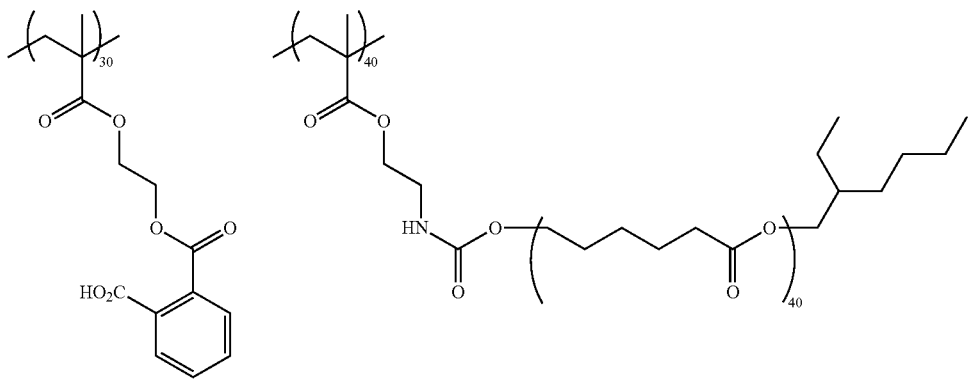
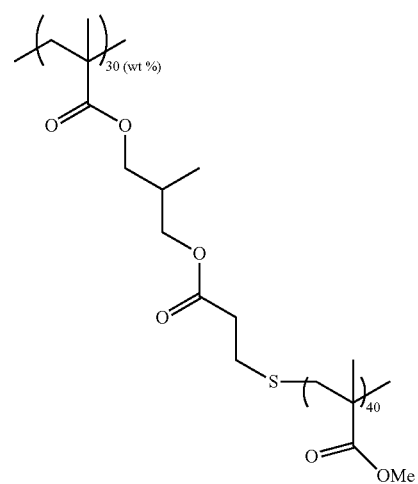
(Exemplary Compound 69)
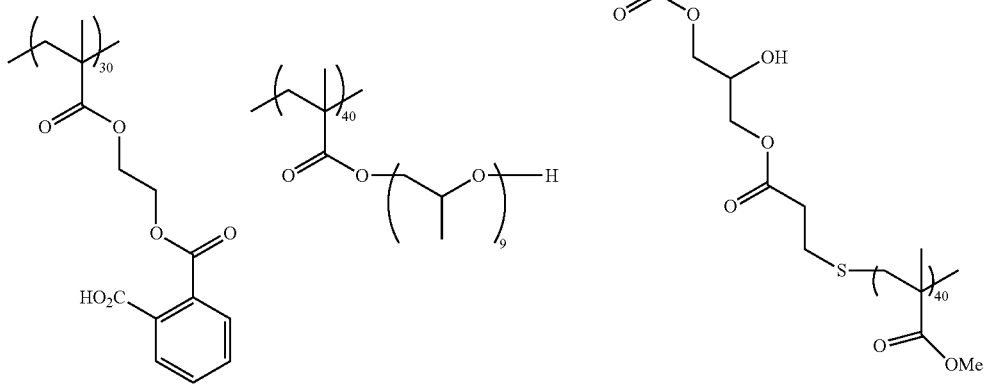

-continued

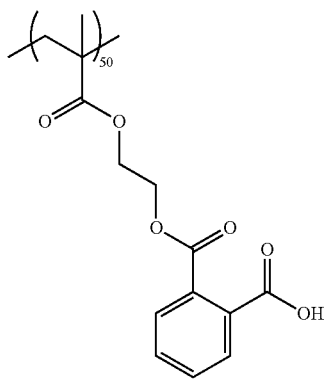

(Exemplary Compound 70)

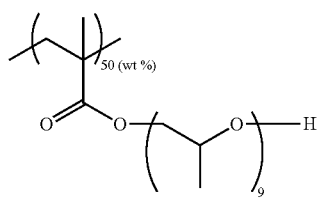

(Exemplary Compound 71)

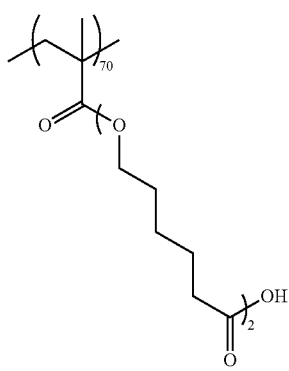

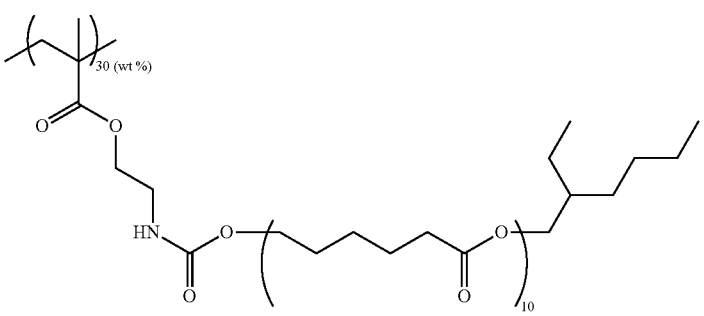

When using an inorganic pigment as the infrared ray shielding material, it is preferable to first prepare a pigment dispersion composition by using a pigment, a dispersant, and an appropriate solvent and then mixing it in the polymerizable composition, from the viewpoint of improving dispersibility.

Even in the case of using an inorganic pigment or an infrared ray absorbing dye as the infrared ray shielding material, in order to achieve a desired spectral transmittance, any pigment or dye appropriately selected from existing organic pigments having hues such as red, blue, green, yellow, cyan, magenta, and gray and dyes other than those exemplified as the infrared ray shielding material may be used in combination therewith.

Examples of such organic pigments include C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279; C.I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214; C.I. Pigment Orange 2, 5, 13, 16, 17:1, 31, 34, 36, 38, 43, 46, 48, 49, 51, 52, 55, 59, 60, 61, 62, 64, 71, and 73; C.I. Pigment Green 7, 10, 36, 37, and 58; C.I. Pigment Blue 1, 2, 15, 15:1, 15:2, 15:3, 15:4, 15:6, 16, 22, 60, 64, 66, 79, a pigment in which a Cl substituent of 79 is changed to OH, and 80; C.I. Pigment Violet 1, 19, 23, 27, 32, 37, and 42; and C.I. Pigment Brown 25 and 28.

A content of the dispersant in the pigment dispersion composition thus prepared is preferably 1 to 90% by mass, and more preferably 3 to 70% by mass, with respect to a total solid content mass of coloring agents (including a black pigment and other coloring agents) in the pigment dispersion composition.

<Polymerization Initiator>

The polymerization initiator to be used in the polymerizable composition of the present invention is not specifically restricted as long as it has an ability to initiate the polymerization of the polymerizable compound by either light or heat or both thereof. The polymerization initiator can be appropriately selected according to the purpose. However, in the case of initiating polymerization by light, it is preferable to use a polymerization initiator having photosensitivity in a range of UV to visible light.

In addition, when initiating polymerization by heat, the initiator to be used is preferably decomposed at 150 to 250° C.

The polymerization initiator usable in the present invention is preferably a compound at least having an aromatic group. Examples of such a compound include (bis)acylphosphine oxide or esters thereof, acetophenone-based compounds, α-aminoketone compounds, benzophenone-based compounds, benzoin ether-based compounds, ketal derivative compounds, thioxanthone compounds, oxime ester compounds, hexaarylbiimidazole compounds, trihalomethyl compounds, azo compounds, organic peroxides, diazonium compounds, iodonium compounds, sulfonium compounds, azinium compounds, benzoinether compounds, ketal derivative compounds, onium salt compounds such as a metallocene compound, organic borate compounds, and disulfone compounds.

From the viewpoint of sensitivity, preferred are oxime ester compounds, acetophenone-based compounds, α-aminoketone compounds, trihalomethyl compounds, hexaarylbiimidazole compounds, and thiol compounds.

Hereinafter, examples of the polymerization initiator suitable to the present invention will be shown, although the present invention is not restricted thereto.

Specific examples of the acetophenone-based compounds include 2,2-diethoxyacetophenone, p-dimethylaminoacetophenone, 2-hydroxy-2-methyl-1-phenyl-propane-1-one, p-dimethylaminoacetophenone, 4'-isopropyl-2-hydroxy-2-methyl-propiophenone, 1-hydroxy-cyclohexyl-phenyl-ketone, 2-benzyl-2-dimethylamino-1-(4-morpholinophenyl)-butanone-1,2-tolyl-2-dimethylamino-1-(4-morpholinophenyl)-butanone-1,2-methyl-1-[4-(methylthio)phenyl]-2-morpholinopropanone-1,2-methyl-1-(4-methylthiophenyl)-2-morpholinopropane-1-one, 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone, and 2-methyl-1-(4-methylthiophenyl)-2-morpholinopropane-1-one. Among them, preferably used 2-methyl-1-(4-methylthiophenyl)-2-morpholinopropane-1-one is available as product name "IRGACURE-907 manufactured by BASF Japan Co. Ltd.", and 2-(dimethylamino)-2-[(4-methylphenyl)methyl]-1-[4-(4-morpholinyl)phenyl]-1-butanone is available as product name "IRGACURE-379 manufactured by BASF Japan Co. Ltd".

As the trihalomethyl compounds, more suitable are s-triazine derivatives in which at least one mono-, di-, or trihalogen substituted methyl group is bonded to an s-triazine ring. Specific examples of the derivatives include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,αβ-trichloromethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4-6-bis(trichloromethyl)-s-triazine, 2-(p-chlorophenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis(tribromomethyl)-s-triazine.

As the hexaarylbiimidazole compounds, for example, there can be mentioned various compounds described in Japanese Examined Patent Application Publication (JP-B) No. 6-29285, U.S. Pat. Nos. 3,479,185; 4,311,783; and 4,622,286. Specific examples of the compounds include 2,2-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

Examples of the oxime ester compounds include compounds described in J. C. S. Perkin II (1979) 1653-1660, J. C. S. Perkin II (1979) 156-162, Journal of Photopolymer Science and Technology (1995) 202-232, and JP-2000-66385, compounds described in JP-A-2000-80068 and JP-A-2004-534797. Suitable examples of commercially available oxime ester compounds include IRGACURE OXE 01 (1,2-octanedione, 1-[4-(phenylthio)-, 2-(o-benzoyloxime)]) and IRGACURE OXE 02 (ethanone, 1-(9-ethyl-6-(2-methylbenzoyl)-9H-carbazole-3-yl)-, 1-(o-acetyloxime).

Furthermore, cyclic oxime compounds described in JP-A-2007-231000 and JP-A-2007-322744 can also be suitably used.

The most preferable examples include an oxime compound having a specific substituent described in JP-A-2007-269779 and an oxime compound having a thioaryl group described in JP-A-2009-191061.

Hereinafter, a detailed description will be given of oxime-based photopolymerization initiator preferably used in the polymerizable composition of the present invention.

As the oxime-based photopolymerization initiator suitably used in the present invention, in addition to IRGACURE OXE 01 and IRGACURE OXE 02 manufactured by BASF Japan Co. Ltd., as mentioned above, there can be mentioned, as a preferable initiator, a compound represented by the following formula (1). The compound represented by the formula (1) below is an oxime compound in which the N—O bond of the oxime moiety may be (E) isomer, (Z) isomer or a mixture of (E) isomer and (Z) isomer.

(1)

(In the formula (1), R and B each independently represent a monovalent substituent; A represents a divalent organic group; and Ar represents an aryl group).

The monovalent substituent represented by the R is preferably a monovalent non-metal atomic group. Examples of the non-metal atomic group include alkyl groups, aryl groups, acyl groups, alkoxycarbonyl groups, aryloxycarbonyl groups, heterocyclic ring groups, alkylthiocarbonyl groups, and arylthiocarbonyl groups. In addition, these groups may have one or more substituents. Additionally, the above-mentioned substituents may be further substituted with other substituent(s).

Examples of the substituents include halogen atoms, aryloxy groups, alkoxycarbonyl groups or aryloxycarbonyl groups, acyloxy groups, acyl groups, alkyl groups and aryl groups.

The alkyl groups that may have a substituent are preferably alkyl groups having 1 to 30 carbon atoms. Specific examples of such alkyl groups include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanyl phenacyl group, a 4-phenylsulfanyl phenacyl group, a 4-dimethylamino phenacyl group, a 4-cyano phenacyl group, a 4-methyl phenacyl group, a 2-methyl phenacyl group, a 3-fluoro phenacyl group, a 3-trifluoromethyl phenacyl group, and a 3-nitro phenacyl group.

The aryl groups that may have a substituent are preferably aryl groups having 6 to 30 carbon atoms. Specific examples of such aryl groups include phenyl groups, biphenyl groups, 1-naphthyl groups, 2-naphthyl groups, 9-anthryl groups, 9-phenanthryl groups, 1-pyrenyl groups, 5-naphthacenyl groups, 1-indenyl groups, 2-azulenyl groups, 9-fluorenyl groups, terphenyl groups, a quarter phenyl group, an o-tolyl group, a m-tolyl group, a p-tolyl group, a xylyl group, an o-cumenyl group, a m-cumenyl group, a p-cumenyl group, a mesityl group, a pentalenyl group, a binaphthalenyl group, a ternaphthalenyl group, a quarter naphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quarter anthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The acyl groups that may have a substituent are preferably acyl groups having 2 to 20 carbon atoms. Specific examples of such acyl groups include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl groups that may have a substituent are preferably alkoxycarbonyl groups having 2 to 20 carbon atoms. Specific examples of such alkoxycarbonyl groups include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl groups that may have a substituent include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The heterocyclic groups that may have a substituent are preferably aromatic or aliphatic heterocyclic groups containing a nitrogen atom, an oxygen atom, a sulfur atom, or a phosphorous atom.

Specific examples of the heterocyclic groups include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthonyl group.

Specific examples of the alkylthiocarbonyl groups that may have a substituent include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethyl thiocarbonyl group.

Specific examples of the arylthiocarbonyl groups that may have a substituent include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimemylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

The monovalent substituent represented by the B represents an aryl group, a heterocyclic group, an arylcarbonyl group, or a heterocyclic carbonyl group. These groups may have one or more substituents. Examples of the substituent(s) are the same as those mentioned above. The substituent(s) may be further substituted with another substituent.

Among them, particularly preferable are structures shown below.

In the following structures, Y, X, and n have the same definitions and the same preferable definitions as Y, X, and n in a formula (2) described later, respectively.

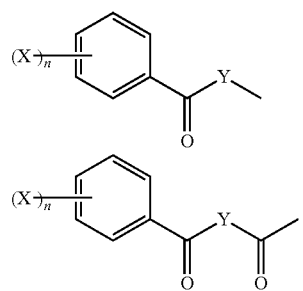

Examples of the divalent organic groups represented by the A include alkylene groups having 1 to 12 carbon atoms, cyclohexylene groups, and alkynylene groups. In addition, these groups may have one or more substituents. Examples of the substituent(s) are the same as those mentioned above. The substituent(s) may be further substituted with another substituent.

Among other things, in terms of increasing sensitivity and suppressing coloring due to heating and aging, the A is preferably an unsubstituted alkylene group, an alkylene group substituted with an alkyl group (such as a methyl group, an ethyl group, a tert-butyl group, or a dodecyl group), an alkylene group substituted with an alkenyl group (such as a vinyl group or an allyl group), or an alkylene group substituted with an aryl group (such as a phenyl group, a p-tolyl group, a xylyl group, a cumenyl group, a naphthyl group, an anthryl group, a phenanthryl group or a styryl group).

The aryl group represented by the Ar is preferably an aryl group having 6 to 30 carbon atoms and also may have a substituent. Examples of the substituent are the same as the substituents to be introduced in the substituted aryl group mentioned above as the specific examples of the aryl groups that may have a substituent.

Above all, in terms of increasing sensitivity and suppressing coloring due to heating and aging, preferred are substituted or unsubstituted phenyl groups.

In the formula (1), a structure of "SAr" formed by the Ar and the adjacent S is preferably the structure shown below in terms of sensitivity. In addition, Me represents a methyl group and Et represents an ethyl group.

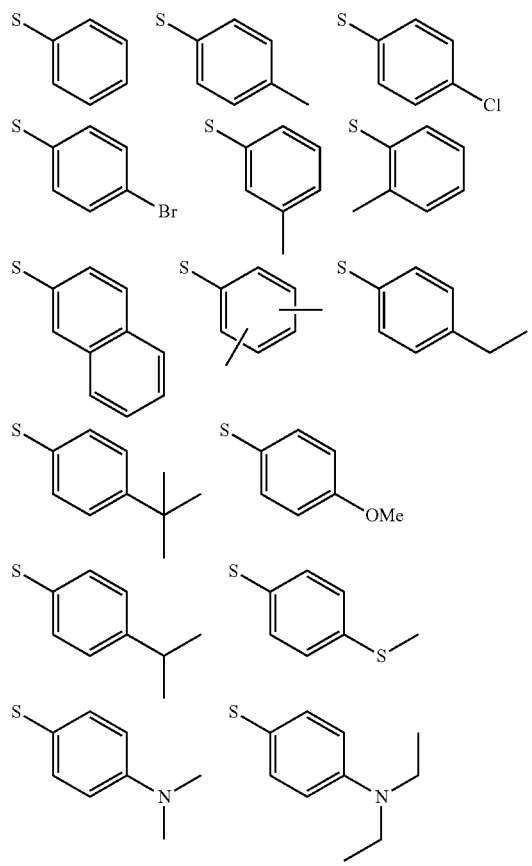

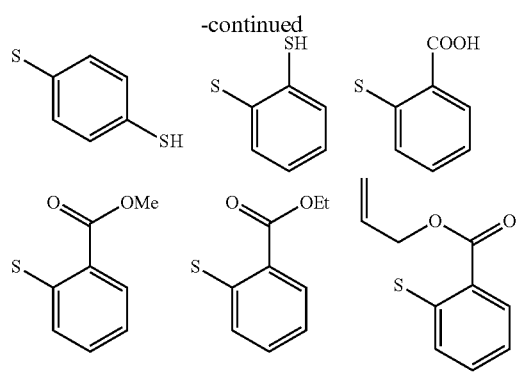

The oxime compound is preferably a compound represented by the following formula (2).

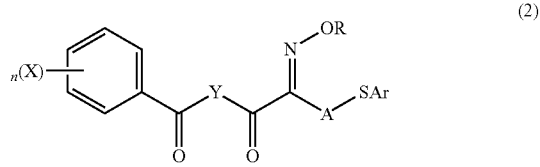

(In the formula (2), R and X each independently represents a monovalent substituent; A and Y each independently represent a divalent organic group; Ar represents an aryl group; and n represents an integer of 0 to 5).

The R, A, and Ar in the formula (2) have the same definitions and the same preferable definitions as the R, A, and Ar in the formula (1), respectively.

Examples of the monovalent substituent represented by the X include an alkyl group, an aryl group, an alkoxy group, an aryloxy group, an acyloxy group, an acyl group, an alkoxycarbonyl group, an amino group, a heterocyclic group, and a halogen atom. In addition, these groups may have one or more substituents. Examples of the substituent(s) may be those mentioned above. Additionally, the substituents mentioned above may be further substituted with other substituent(s).

Among them, the X is preferably an alkyl group in terms of solvent solubility and improvement of absorption efficiency in long wavelength region.

In addition, the n in the formula (2) represents an integer of 0 to 5, in which an integer of 0 to 2 is preferable.

As the divalent organic group represented by the Y, there can be mentioned structures shown below. In the groups shown below, the symbol "*" indicates a bonding position of Y and an adjacent carbon atom in the formula (2).

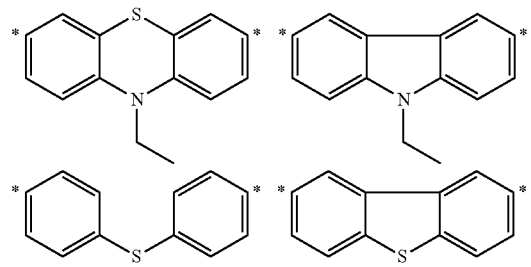

-continued

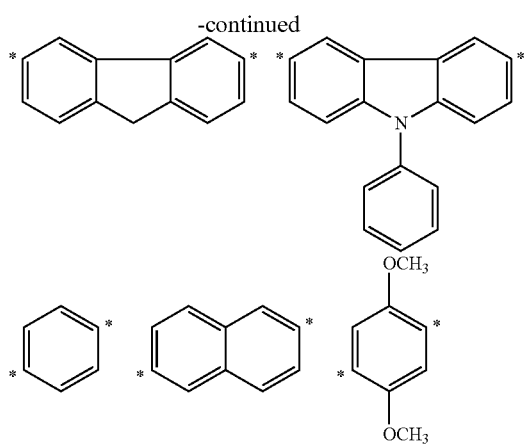

Above all, in terms of sensitivity improvement, the following structures are preferable.

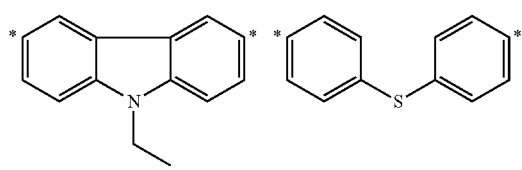

Furthermore, the oxime compound is preferably a compound represented by the following formula (3).

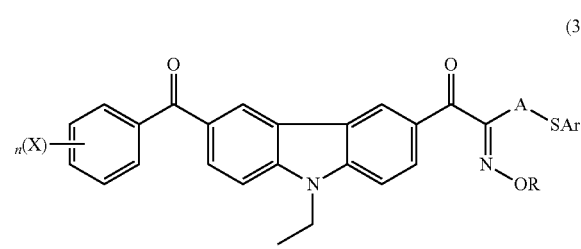
(3)

(In the formula (3), R and X each independently represents a monovalent substituent; A represents a divalent organic group; Ar represents an aryl group; and n represents an integer of 0 to 5).

The R, X, A, Ar, and n in the formula (3) have the same definitions and the same preferable definitions as the R, X, A, Ar, and n in the formula (2), respectively.

Hereinafter, specific examples (0-1) to (0-10) of the suitably used oxime compound will be shown, although the present invention is not restricted thereto.

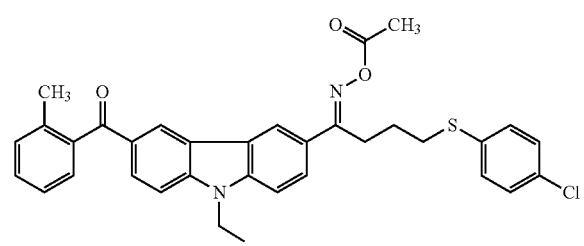
(0-1)

-continued

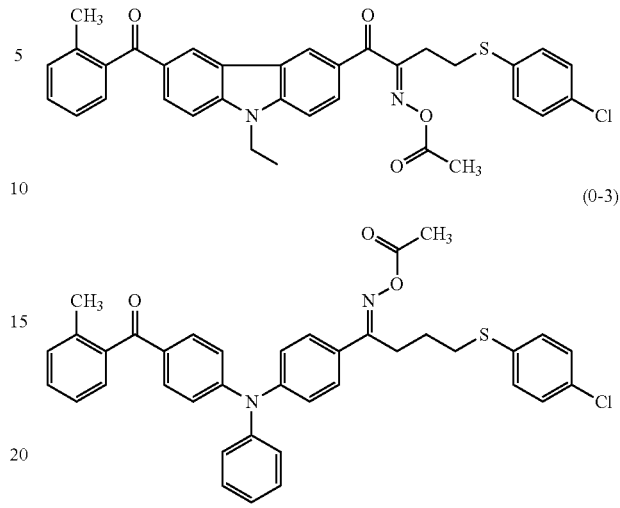

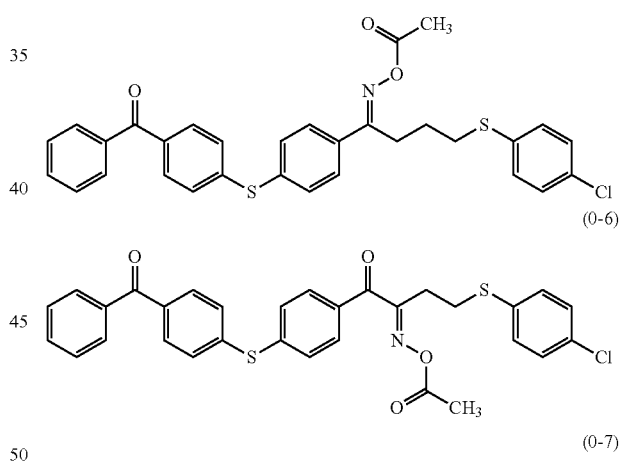

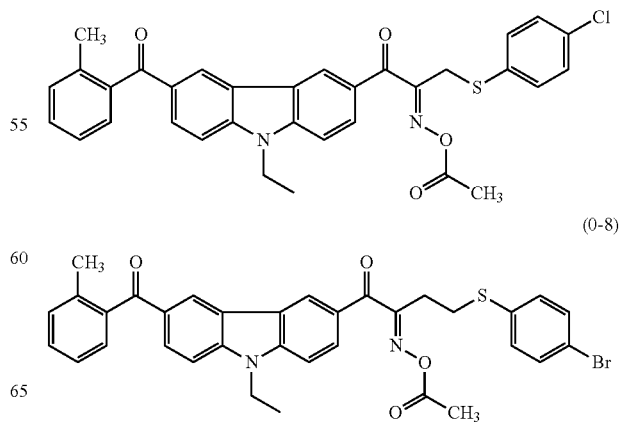

-continued

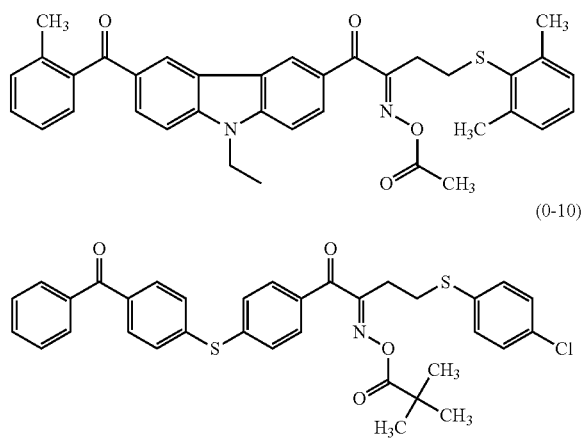

The oxime compound has a maximum absorption wavelength in a wavelength region of 350 to 500 nm, and preferably has an absorption wavelength in a wavelength range of 360 to 480 nm, in which, particularly preferably, the oxime compound has high absorbance in a range of 365 to 455 nm.

The oxime compound has a molar absorption coefficient at 365 or 405 nm of preferably 3,000 to 300,000, more preferably 5.000 to 300,000, and particularly preferably 10000 to 200,000 from the viewpoint of sensitivity.

The molar absorption coefficient of compound can be measured by a known method. Specifically, for example, the molar absorption coefficient is preferably measured by a UV-visible spectrophotometer (CARRY-5 spectrophotometer manufactured by Varian Inc.), using an ethyl acetate solvent at a concentration of 0.01 g/L.

The photopolymerization initiator may be used alone or in combination of two or more kinds.

A content of the photopolymerization initiator in the polymerizable composition of the present invention is preferably 0.01 to 30% by mass, more preferably 0.1 to 20% by mass, and particularly preferably 0.1 to 15% by mass, with respect to a total solid content of the polymerizable composition.

<Sensitizer>

The polymerizable composition for resist formation of the present invention may include a sensitizer for the purposes of improving radical generation efficiency in the polymerization initiator and extending a photosensitive wavelength. The sensitizer usable in the present invention preferably sensitizes the photopolymerization initiator by an electron transfer mechanism or an energy transfer mechanism. The sensitizer usable in the present invention belongs to compounds listed below, and as examples of the sensitizer, there can be mentioned those having absorption wavelength in the wavelength region of 300 to 450 nm.

Examples of preferable sensitizers include compounds belonging to the following compounds and having absorption wavelength in a range of 330 to 450 nm.

Examples of the preferable sensitizers include polynuclear aromatic series (such as phenanthrene, anthracene, pyrene, perylene, triphenylene, and 9,10-dialkoxyanthracene), xanthenes (such as fluorescein, eosin, erythrosine, Rhodamine B, and Rose Bengal), thioxanthones (such as isopropylthioxanthone, diethylthioxanthone, and chlorothioxanthone), cyanines (such as thiacarbocyanine and oxacarbocyanine), merocyanines (such as merocyanine and carbomerocyanine), phthalocyanines, thiazines (such as thionine, methylene blue, and toluidine blue), acridines (such as acridine orange, chloroflavin, and acriflavin), anthraquinones (such as anthraquinone), squarylium (such as squarylium), acridine orange, coumarins (such as 7-diethylamino-4-methylcoumarin), ketocoumarin, phenothiazines, phenazines, styrylbenzenes, azo compounds, diphenylmethane, triphenylmethane, distyrylbenzenes, carbazoles, porphyrin, spiro compounds, quinacridone, indigo, styryl, pyrylium compounds, pyrromethene compounds, pyrazolotriazole compounds, benzothiazole compounds, barbituric acid derivatives, thiobarbituric acid derivatives, aromatic ketone compounds such as acetophenone, benzophenone, thioxanthone and Michler's ketone, and heterocyclic compounds such as N-aryl oxazolidinone.

In addition, the examples thereof include compounds described in European Patent No. 568,993; U.S. Pat. Nos. 4,508,811 and 5,227,227; and JP-A-2001-125255, and JP-A-11-271969.

The sensitizers may be used alone or in combination of two or more thereof.

A content of the sensitizer in the polymerizable composition of the present invention is preferably 0.1 to 5% by mass, and more preferably 0.5 to 2% by mass with respect to the total solid content of the polymerizable composition. When the content of the sensitizer is in the range, a pattern having a more favorable shape can be obtained.

<Polymerizable Compound>

The polymerizable composition of the present invention includes a polymerizable compound. The polymerizable compound to be used herein can be any as long as it is a compound having, in its molecule, functional group(s) (herein, the functional group(s) may be referred to as "polymerizable group(s)") that react(s) with at least one of acid, radical, and heat. The polymerizable compound is preferably a polyfunctional polymerizable compound having two or more of the polymerizable groups in its molecule.

Examples of the polymerizable compound having polymerizable functional group(s) reacting with at least any of acid, radical, and heat include an ethylenically unsaturated group-containing compound having an ethylenically unsaturated group such as an unsaturated ester functional group, an unsaturated amide group, a vinyl ether group, or an allyl group; a cyclic ether compound having a cyclic ether group such as a styrene group, an epoxy group, or an oxetane group; a methylol compound; a bismaleimide compound; a cyanate compound a benzocyclobutene compound, a bisallylnadiimide compound; and a benzoxazine compound.

As the polymerizable compound suitably usable in the present invention, there can be mentioned general radically polymerizable compounds, and compounds widely known as those having an ethylenically unsaturated double bond in the relevant industrial field can be used without any specific restriction.

Those compounds have chemical forms such as monomer, prepolymer, that is, dimer, trimer and oligomer, or mixtures thereof, copolymers thereof, and the like, but are structurally different from a binder polymer described below.

Examples of the monomer and a copolymer thereof include unsaturated carboxylic acids (e.g. acrylic acid, methacrylic acid, itaconic acid, crotonic acid, isocrotonic acid, maleic acid, etc.), esters thereof, and amides thereof. Preferably used are esters of unsaturated carboxylic acids and aliphatic polyhydric alcohol compounds and amides of unsaturated carboxylic acids and aliphatic polyamine compounds. In addition, suitably usable examples thereof include adducts of unsaturated carboxylic acid esters or amides having a nucleophilic substituent such as a hydroxy group, an amino group, or a mercapto group and monofunctional or polyfunctional isocyanates or epoxies, and dehydration-condensation reaction products of the esters or the amides and monofunctional or polyfunctional carboxylic acids.

In addition, other suitable ones are adducts of unsaturated carboxylic acid esters or amides having an electrophilic substituent such as an isocyanate group or an epoxy group and monofunctional or polyfunctional alcohols, amines, or thiols, and substitution reaction products of unsaturated carboxylic acid esters or amides having a leaving substituent such as a halogen group or a tosyloxy group and monofunctional or polyfunctional alcohols, amines, or thiols. Furthermore, as other examples, instead of the above-mentioned unsaturated carboxylic acids, unsaturated phosphonic acids, styrenes, vinyl ethers, or the like can also be used.

Specific examples of the esters of unsaturated carboxylic acids and aliphatic polyhydric alcohol compounds include, as (meth)acrylic acid esters, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, tricyclodecanedimethanol diacrylate, tricyclodecanedimethanol dimethacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, and polyester acrylate oligomer. There can also be mentioned EO-modified or PO-modified products of these compounds.

Examples of methacrylate include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane. There can also be mentioned EO-modified or PO-modified products of these compounds.

Examples of itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. Examples of crotonic acid esters include ethylene glycol dicrotonate, tetramethylene glycol dicrotonate, pentaerythritol dicrotonate, and sorbitol tetracrotonate. Examples of isocrotonic acid esters include ethylene glycol diisocrotonate, pentaerythritol diisocrotonate, and sorbitol tetraisocrotonate. Examples of maleic acid esters include ethylene glycol dimaleate, triethylene glycol dimaleate, pentaerythritol dimaleate, and sorbitol tetramaleate.

Other suitably used examples of the ester include aliphatic alcohol-based esters described in JP-B-51-47334 and JP-A-57-196231, esters having aromatic skeletons described in JP-A-59-5240, JP-A-59-5241, and JP-A-2-226149, and an ester containing an amino group described in JP-A-1-65613. Furthermore, the above-mentioned ester monomer can be used also as a mixture.

In addition, specific examples of the monomers of amides of aliphatic polyamine compounds and unsaturated carboxylic acids include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, and xylylenebismethacrylamide. Other preferable examples of amide-based monomers include a cyclohexylene structure-containing monomer described in JP-B-54-21726.

Also suitable is an addition-polymerizable urethane-based compound produced by the addition reaction of isocyanate and a hydroxyl group. Specific examples of such a compound include a vinyl urethane compound containing two or more polymerizable vinyl groups per molecule prepared by adding a hydroxyl group-containing vinyl monomer represented by the following formula (E) to a polyisocyanate compound having two or more isocyanate groups per molecule described in JP-B-48-41708.

$$CH_2=C(R^4)COOCH_2CH(R^5)OH \qquad (E)$$

[provided that $R^4$ and $R^5$ each independently represent H or $CH_3$.]

Also suitable are urethane acrylates described in JP-A-51-37193, JP-B-2-32293, and JP-B-2-16765, respectively, and urethane compounds having an ethylene oxide-based skeleton described in JP-B-58-49860, JP-B-56-17654, JP-B-62-39417, and JP-B-62-39418. Furthermore, by using addition-polymerizable compounds having an amino structure or a sulfide structure in the molecule described in JP-A-63-277653, JP-A-63-260909, and JP-A-1-105238, there can be obtained polymerizable compositions exhibiting extremely high speed photosensitivity.

As other examples, there can also be mentioned polyfunctional acrylates and methacrylates, such as polyester acrylates as described in the respective patent application publications: JP-A-48-64183, JP-B-49-43191, and JP-B-52-30490, and epoxy acrylates prepared by reaction of epoxy resin and (meth)acrylic acid. In addition, there can also be mentioned specific unsaturated compounds described in JP-B-46-43946, JP-B-1-40337, and JP-B-1-40336, a vinylphosphonic acid-based compound described in JP-A-2-25493, and the like. Furthermore, in some cases, a perfluoroalkyl group-containing structure described in JP-A-61-22048 is suitably used. Still furthermore, there can also be used those introduced as photocurable monomers and oligomers in Journal of the Adhesion Society of Japan, vol. 20, No. 7, pp. 300-308 (1984).

Additionally, as a polymerizable monomer, a polyfunctional monomer having a caprolactone structure can also be preferably used.

The polyfunctional monomer having a caprolactone structure is not specifically restricted as long as it has a caprolactone structure in its molecule. For example, there can be mentioned ε-caprolactone-modified polyfunctional (meth)acrylates obtained by esterifying a polyhydric alcohol such as trimethylolethane, ditrimethylolethane, trimethylolpropane, ditrimethylolpropane, pentaerythritol, dipentaerythritol, tripentaerythritol, glycerin, diglycerol, or trimethylolmelamine, (meth)acrylic acid, and ε-caprolactone. Among them, preferred is a polyfunctional monomer having a caprolactone structure represented by the following formula (i).

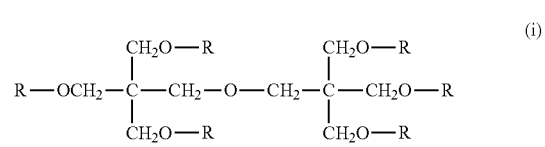

(In the formula (i), all of six Rs are a group represented by the following formula (ii), or one to five of the six Rs are a group represented by the following formula (ii) and a rest thereof is a group represented by the following formula (iii)).

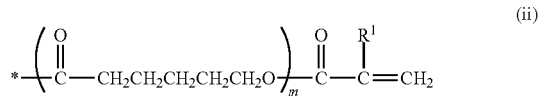

(ii)

(In the formula (ii), $R^1$ represents a hydrogen atom or a methyl group; m represents a number of 1 or 2; and "*" indicates a bonding position).

(iii)

(In the formula (iii), $R^1$ represents a hydrogen atom or a methyl group and "*" indicates a bonding position).

Such a polyfunctional monomer having a caprolactone structure is commercially available as KAYARAD DPCA series from Nippon Kayaku Co. Ltd., and examples of the product include KAYARAD DPCA-20 (a compound in which in the above formulas (i) to (iii), m=1; the number of groups represented by the formula (ii)=2; and all of the $R^1$s are a hydrogen atom); DPCA-30 (a compound in which in the same formulas, m=1; the number of groups represented by the formula (ii)=3; and all of the $R^1$s are a hydrogen atom); DPCA-60 (a compound in which in the same formulas, m=1; the number of groups represented by the formula (ii)=6; and all of the $R^1$s are a hydrogen atom); and DPCA-120 (a compound in which in the same formulas, m=2; the number of groups represented by the formula (ii)=6 and all of the $R^1$s are a hydrogen atom).

In the present invention, when adding a radically polymerizable compound, from the viewpoint of curing sensitivity, it is preferable to use a polyfunctional polymerizable compound containing two or more ethylenically unsaturated bonds, and more preferably, such a compound contains three or more ethylenically unsaturated bonds. Particularly, the compound contains preferably two or more, more preferably three or more, and most preferably four or more (meth)acrylic acid ester structures.

In addition, from the viewpoint of curing sensitivity and the developability of unexposed portion, a compound containing an EO-modified product is preferable, and from the viewpoint of curing sensitivity and the strength of exposed portion, a compound containing a urethane bond is also preferably used. Furthermore, from the viewpoint of developability in pattern formation, a compound having an acid group is preferably used.

From the above viewpoints, preferable examples of the polymerizable compound used in the present invention include bisphenol A diacrylate, EO-modified bisphenol A diacrylate, trimethylolpropane triacrylate, trimethylolpropane tri(acryloyloxypropyl)ether, trimethylolethane triacrylate, tetraethylene glycol diacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, EO-modified pentaerythritol tetraacrylate, and EO-modified dipentaerythritol hexaacrylate. In addition, as commercially available products, preferred are urethane oligomers: UAS-10 and UAB-140 (manufactured by Sanyo Kokusaku Pulp Co., Ltd.); DPHA-40H (manufactured by Nippon Kayaku Co., Ltd.); and UA-306H, UA-306T, UA-306I, AH-600, T-600 and AI-600 (manufactured by Kyoeisha Chemical Co., Ltd).

Among them, more preferred are EO-modified bisphenol A diacrylate, pentaerythritol triacrylate, pentaerythritol tetraacrylate, dipentaerythritol pentaacrylate, dipentaerythritol hexaacrylate, tri(acryloyloxyethyl)isocyanurate, EO-modified pentaerythritol tetraacrylate, and EO-modified dipentaerythritol hexaacrylate. More preferred as commercially available products are DPHA-40H (manufactured by Nippon Kayaku Co., Ltd.); and UA-306H, UA-306T, UA-306I, AH-600, T-600 and AI-600 (manufactured by Kyoeisha Chemical Co., Ltd).

Additionally, ethylenically unsaturated compounds having an acid group are also suitable. Examples of commercially available products thereof include TO-756 as a carboxyl group-containing trifunctional acrylate and TO-1382 as a carboxyl group-containing pentafunctional acrylate, which are manufactured by Toagosei Co., Ltd.

A content of the polymerizable compound is preferably 3 to 80% by mass, and more preferably 5 to 50% by mass, with respect to the total solid content of the polymerizable composition of the present invention.

In addition, the polymerizable compound can be used in combination of two or more kinds.

<Thermal Crosslinking Agent>

Preferably, the polymerizable composition for a solder resist of the present invention further includes a thermal crosslinking agent. The thermal crosslinking agent is not specifically restricted and can be appropriately selected according to the purpose. To improve film strength after curing of a photosensitive layer formed using the polymerizable composition, within a range that does not have negative influence on developability and the like, for example, there can be used an epoxy compound having at least two oxirane groups per molecule or an oxetane compound having at least two oxetanyl groups per molecule.

Examples of the epoxy compound having at least two oxirane groups per molecule include a bixylenol-type or biphenol-type epoxy resin (such as "YX 4000 manufactured by Japan Epoxy Resins Co., Ltd.") or a mixture thereof, a heterocyclic epoxy resin having an isocyanurate skeleton or the like (such as "TEPIC manufactured by Nissan Chemicals Industries, Ltd.", "ARALDITE PT 810 manufactured by BASF Japan Co., Ltd."), a bisphenol A-type epoxy resin, a novolac-type epoxy resin, and a bisphenol F-type epoxy resin (EPOTOTO YDF-170 manufactured by Toto Kasei Co., Ltd.), a hydrogenated bisphenol A-type epoxy resin, a bisphenol S-type epoxy resin, a phenol novolac-type epoxy resin, a cresol novolac-type epoxy resin, and a halogenated epoxy resin (such as a low brominated epoxy resin, a high halogenated epoxy resin, and a brominated phenol novolac-type epoxy resin), an allyl group-containing bisphenol A-type epoxy resin, a trisphenolmethane-type epoxy resin, a diphenyldimethanol-type epoxy resin, a phenol biphenylene-type epoxy resin, and a dicyclopentadiene-type epoxy resin (such as "HP-7200 and HP-7200H manufactured by Dainippon Ink and Chemicals, Inc."), a glycidylamine-type epoxy resin (such as diaminodiphenylmethane-type epoxy resin, diglycidylaniline, or triglycidylaminophenol), a glycidyl ester-type epoxy resin (such as diglycidyl phthalate, diglycidyl adipate, diglycidyl hexahydrophthalate, or diglycidyl dimerate), a hydantoin-type epoxy resin, and an alicyclic epoxy resin (such as 3,4-epoxycyclohexylmethyl-3',4'-epoxycyclohexanecarboxylate, bis(3,4-epoxycyclohexylmethyl)adipate, and dicyclopentadiene diepoxide, "GT-300, GT-400, and EHPE 3150 manufactured by Daicel Chemical Industries, Ltd."), an imide-type alicyclic epoxy resin, a trihydroxyphenylmethane-type epoxy resin, bisphenol A novolac-type epoxy resin, a tetraphenylolethane-type epoxy resin, a glycidyl phthalate resin, a tetraglycidyl xylenoylethane resin, a naphthalene group-containing epoxy resin (such as naphthol aralkyl-type epoxy resin, naphthol novolac-type epoxy resin, tetrafunctional naphthalene-type epoxy resin, and as commercially available products, "ESN-190 and ESN-360 manufactured by Nippon Steel Chemical Co., Ltd.", and "HP-4032, EXA-4750, and EXA-4700 manufactured by Dainippon Ink Chemicals, Inc."), a reaction product of a polyphenol compound obtained by an addition reaction between a phenol compound and a diolefin compound such as divinylbenzene or dicyclopentadiene and epichlorohydrin, a product obtained by epoxidizing a ring-opened polymerization product of 4-vinylcyclohexene-1-oxide with peracetic acid or the like, an epoxy resin having a linear phosphorus-containing structure, an epoxy resin having a cyclic phosphorus-containing structure, an α-methylstilbene-type liquid crystal epoxy resin, a dibenzoyloxybenzene-type liquid crystal epoxy resin, an azophenyl-type liquid crystal epoxy resin, an azomethine phenyl-type liquid crystal epoxy resin, a binaphthyl-type liquid crystal epoxy resin, an azine-type epoxy resin, a glycidyl methacrylate copolymer-based epoxy resin (such as "CP-50S and CP-50M manufactured by NOF Corporation"), a copolymerized epoxy resin of cyclohexyl maleimide and glycidyl methacrylate, a bis(glycidyloxyphenyl)fluorene-type epoxy resin, and a bis(glycidyloxyphenyl)adamantane-type epoxy resin, although not limited thereto. These epoxy resins may be used alone or as a combination of two or more thereof.

In addition, other than the epoxy compound containing at least two oxirane groups per molecule, there can be used an epoxy compound containing at least two epoxy groups per molecule, each of which has an alkyl group at β-position. Particularly preferred is a compound containing an epoxy group substituted with an alkyl group at the β-position (more specifically, a β-alkyl-substituted glycidyl group or the like).

In the epoxy compound containing at least an epoxy group having an alkyl group at the β-position, all of the two or more epoxy groups contained per molecule may be β-alkyl-substituted glycidyl groups, or at least one epoxy group may be a β-alkyl-substituted glycidyl group.

Regarding the epoxy compound containing an epoxy group having an alkyl group at the β-position, from the viewpoint of storage stability at room temperature, a proportion of β-alkyl-substituted glycidyl groups in all epoxy groups in a total amount of the epoxy compound included in the polymerizable composition is preferably 30% by mass or more, more preferably 40% by mass or more, and particularly preferably 50% by mass or more.

The β-alkyl-substituted glycidyl group is not specifically restricted and can be appropriately selected according to the purpose. Examples of the β-alkyl-substituted glycidyl group include β-methyl glycidyl groups, β-ethyl glycidyl groups, β-propyl glycidyl groups, and β-butyl glycidyl groups. Among them, preferred are β-methyl glycidyl groups, from the viewpoint of improving the preservation stability of the polymerizable composition and the viewpoint of ease of synthesis.

As the epoxy compound containing an epoxy group having an alkyl group at the β-position, preferred are, for example, epoxy compounds derived from polyhydric phenol compounds and β-alkylepihalohydrin.

Additionally, the β-alkylepihalohydrin is not specifically restricted and can be appropriately selected. Examples of the β-alkylepihalohydrin include β-methylepihalohydrins such as β-methylepichlorohydrin, β-methylepibromohydrin, and β-methylepifluorohydrin; β-ethylepihalohydrins such as β-ethylepichlorohydrin, β-ethylepibromohydrin, and β-ethylepifluorohydrin; β-propylepihalohydrins such as β-propylepichlorohydrin, β-propylepibromohydrin, and β-propylepifluorohydrin; and β-butylepihalohydrins such as β-butylepichlorohydrin, β-butylepibromohydrin, and β-butylepifluorohydrin. Among them, from the viewpoint of reactivity with the polyhydric phenol and fluidity, β-methylepihalohydrins are preferable.

The polyhydric phenol compound is not specifically restricted as long as it is a compound containing two or more aromatic hydroxyl groups per molecule and can be appropriately selected according to the purpose. Examples of the polyhydric phenol compound include bisphenol compounds such as bisphenol A, bisphenol F, and bisphenol S, biphenol compounds such as biphenol and tetramethyl biphenol, naphthol compounds such as dihydroxynaphthalene and binaphthol, phenol novolac resins such as phenol-formaldehyde poly-condensation products, mono $C_{1-10}$ alkyl-substituted phenol-formaldehyde poly-condensation products such as cresol-formaldehyde poly-condensation products, di $C_{1-10}$ alkyl-substituted phenol-formaldehyde poly-condensation products such as xylenol-formaldehyde poly-condensation products, bisphenol compound-formaldehyde poly-condensation products such as bisphenol A-formaldehyde poly-condensation products, copoly-condensation products of phenol and a mono $C_{1-10}$ alkyl-substituted phenol with formaldehyde, and poly-adducts of phenol compounds and divinylbenzene. Among them, for example, when selecting to improve fluidity and preservation stability, the bisphenol compounds are preferable.

Examples of the epoxy compounds containing an epoxy group having an alkyl group at the β-position include di-β-alkyl glycidyl ethers of bisphenol compounds such as di-β-alkyl glycidyl ethers of bisphenol A, di-β-alkyl glycidyl ethers of bisphenol F, and di-β-alkyl glycidyl ethers of bisphenol S; di-β-alkyl glycidyl ethers of biphenol compounds such as di-β-alkyl glycidyl ethers of biphenol and di-β-alkyl glycidyl ethers of tetramethyl biphenol; β-alkyl glycidyl ethers of naphthol compounds such as di-β-alkyl glycidyl ethers of dihydroxynaphthalene and di-β-alkyl glycidyl ethers of binaphthol; poly-β-alkyl glycidyl ethers of phenol-formaldehyde poly-condensation products; poly-β-alkyl glycidyl ethers of mono $C_{1-10}$ alkyl-substituted phenol-formaldehyde poly-condensation products such as poly-β-alkyl glycidyl ethers of cresol-formaldehyde poly-condensation products; poly-β-alkyl glycidyl ethers of di $C_{1-10}$ alkyl-substituted phenol-formaldehyde poly-condensation products such as poly-β-alkyl glycidyl ethers of xylenol-formaldehyde poly-condensation products; poly-β-alkyl glycidyl ethers of bisphenol compound-formaldehyde poly-condensation products such as poly-β-alkyl glycidyl ethers of bisphenol A-formaldehyde poly-condensation products; and poly-β-alkyl glycidyl ethers of poly-adducts of phenol compounds and divinylbenzene.

Among them, preferred are a bisphenol compound represented by the following general formula (D-1) and a β-alkyl glycidyl ether derived from a polymer obtained from the bisphenol compound and epichlorohydrin or the like, and a poly-β-alkyl glycidyl ether of a polycondensate of a phenol compound represented by the following general formula (D-2) and formaldehyde.

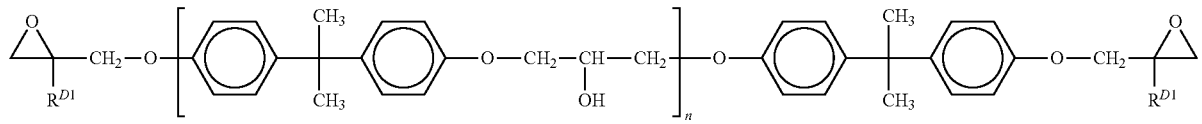

General Formula (D-1)

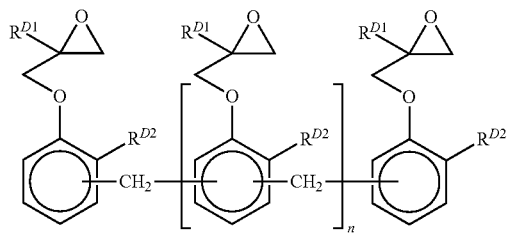

General Formula (D-2)

In the general formula (D-1), $R^{D1}$ represents a hydrogen atom or an alkyl group having 1 to 6 carbon atoms, and n represents an integer of 0 to 20.

In the general formula (D-2), $R^{D1}$ represents a hydrogen atom or an alkyl group having 1 to 6 carbon atoms; $R^{D2}$ represents a hydrogen atom or $CH_3$; and n represents an integer of 0 to 20.

In the general formulas (D-1) and (D-2), a plurality of $R^{D1}$s and $R^{D2}$s may be the same as or different from each other.

Those epoxy compounds containing an epoxy group having an alkyl group at the β-position may be used alone or in combination of two or more kinds thereof. It is also possible to use an epoxy compound having at least two oxirane rings per molecule and an epoxy compound including an epoxy group having an alkyl group at the β-position in combination.

A skeleton of the epoxy compound is preferably at least one selected from bisphenol-type epoxy resins, novolac-type epoxy resins, alicyclic group-containing type epoxy resins, and slightly soluble epoxy resins.

Examples of the oxetane compound include polyfunctional oxetanes such as bis[(3-methyl-3-oxetanylmethoxy)methyl] ether, bis[(3-ethyl-3-oxetanylmethoxy)methyl]ether, 1,4-bis [(3-methyl-3-oxetanylmethoxy)methyl]benzene, 1,4-bis[(3-ethyl-3-oxetanylmethoxy)methyl]benzene, (3-methyl-3-oxetanyl)methyl acrylate, (3-ethyl-3-oxetanyl)methyl acrylate, (3-methyl-3-oxetanyl)methyl methacrylate, (3-ethyl-3-oxetanyl)methyl methacrylate, and oligomers or copolymers thereof, as well as ether compounds of an oxetane group-containing compound and a hydroxyl group-containing resin such as novolac resin, poly(p-hydroxystyrene), cardo-type bisphenols, calixarenes, calixresorcinarenes, or silsesquioxane, or the like. Other than those, the examples thereof also include copolymers of oxetane ring-containing unsaturated monomers and alkyl(meth)acrylate.

In addition, to accelerate thermal curing of the epoxy compound or the oxetane compound, for example, there can be used an amine compound (such as dicyandiamide, benzyldimethylamine, 4-(dimethylamino)-N,N-dimethylbenzylamine, 4-methoxy-N,N-dimethylbenzylamine, or 4-methyl-N,N-dimethylbenzylamine); a quaternary ammonium compound (such as triethyl benzyl ammonium chloride); a blocked isocyanate compound (such as dimethylamine); an imidazole derivative-bicyclic amidine compound and a salt thereof (such as imidazole, 2-methylimidazole, 2-ethylimidazole, 2-ethyl-4-methylmidazole, 2-phenylimidazole, 4-phenylimidazole, 1-cyanoethyl-2-phenylimidazole, or 1-(2-cyanoethyl)-2-ethyl-4-methylimidazole); a phosphorus compound (such as triphenylphosphine); a guanamine compound (such as melamine, guanamine, acetoguanamine, or benzoguanamine); and an S-triazine derivative (such as 2,4-diamino-6-methacryloyloxyethyl-S-triazine, 2-vinyl-2,4-diamino-S-triazine, 2-vinyl-4,6-diamino-S-triazine-isocyanuric acid adduct, or 2,4-diamino-6-methacryloyloxyethyl-S-triazine-isocyanuric acid adduct), or the like.

These may be used alone or in combination of two or more kinds thereof. In addition, any compound that can accelerate thermal curing other than those above, can be used without specific restriction, as long as the compound is a curing catalyst of the epoxy resin compound or the oxetane compound or can accelerate the reaction between these compounds and a carboxyl group.

A content of the compound that can accelerate the thermal curing of the epoxy compound or the oxetane compound, and the thermal curing of these compounds and carboxylic acid in the solid content of the polymerizable composition is usually 0.01 to 15% by mass.

In addition, as the thermal crosslinking agent, there can be used a polyisocyanate compound described in JP-A-5-9407. The polyisocyanate compound may be derived from aliphatic compounds, cyclic aliphatic compounds, or aromatic group-substituted aliphatic compounds, each of which contains at least two isocyanate groups. Examples of such a polyisocyanate compound include bifunctional isocyanates (such as mixtures of 1,3-phenylene diisocyanate and 1,4-phenylene diisocyanate, 2,4- and 2,6-toluene diisocyanate, 1,3- and 1,4-xylylene diisocyanate, bis(4-isocyanate-phenyl)methane, bis (4-isocyanatecyclohexyl)methane, isophorone diisocyanate, hexamethylene diisocyanate, trimethylhexamethylene diisocyanate), adducts of polyfunctional alcohols such as trimethylolpropane, pentaerythritol, and glycerin, or alkylene oxide adducts of the polyfunctional alcohols with the above bifunctional isocyanates; and cyclic trimers such as hexamethylene diisocyanate, hexamethylene-1,6-diisocyanate, and derivatives thereof. Additionally, as an example of commercially available products of the polyisocyanate compound, there is mentioned BL 317 (manufactured by Sumitomo Bayer Urethane Co., Ltd).

As other examples of the thermal crosslinking agent used in the polymerizable composition of the present invention, there are mentioned compounds obtained by reacting isocyanate groups of the polyisocyanates and the derivatives thereof with a blocking agent.

Examples of the isocyanate group blocking agent include alcohols such as isopropanol and tert-butanol; lactams (such as ε-caprolactam); phenols (such as phenol, cresol, p-tert-butylphenol, p-sec-butylphenol, p-sec-aminophenol, p-octylphenol, and p-nonylphenol); heterocyclic hydroxyl compounds (such as 3-hydroxypyridine and 8-hydroxyquinoline); active methylene compounds (such as dialkyl malonate, methyl ethyl ketoxime, acetylacetone, alkyl acetoacetate oxime, acetooxime, and cyclohexanone oxime). As an example other than these, there may be used a compound described in JP-A-6-295060, which has either at least one polymerizable double bond or at least one blocked isocyanate group in its molecule.

Additionally, as the thermal crosslinking agent, a melamine derivative can be used. Examples of the melamine derivatives include methylolmelamine and alkylated methylol melamine (a compound obtained by etherifying a methylol group with methyl, ethyl, butyl, or the like). These may be used alone or in combination of two or more. Of these compounds, alkylated methylol melamine is preferable, and particularly preferable is hexa-methylated methylol melamine, in terms of the fact that preservation stability is excellent, and the derivative is effective in improvement of surface hardness of a photosensitive layer or film strength itself of a cured film.

A content of the thermal crosslinking agent in the solid content of the polymerizable composition for a solder resist is preferably 1 to 50% by mass, and more preferably 3 to 30% by mass. By setting the content thereof in the range of 1% by mass or more but 50% by mass or less, the effect of improving the film strength of a cured film can be obtained, and influences such as reduction of developability, reduction of exposure sensitivity, and the like are suppressed.

<Binder Polymer>

In the polymerizable composition of the present invention, a binder polymer can additionally be used as necessary, for the purpose of improving coating properties and the like. The binder polymer to be used is preferably a linear organic polymer.

The above linear organic polymer is preferably a polymer having a carboxylic acid in a side chain. Examples of such a polymer include a methacrylic acid copolymer, an acrylic acid copolymer, an itaconic acid copolymer, a crotonic acid copolymer, a maleic acid copolymer, a partially esterified maleic acid copolymer, as described in JP-A-59-44615, JP-B-54-34327, JP-B-58-12577, JP-B-54-25957, JP-A-59-53836, and JP-A-59-71048, as well as an acidic cellulose derivative having a carboxylic acid in a side chain, and an adduct of a polymer having a hydroxyl group and an acid anhydride.

Among them, particularly suitable are a copolymer of benzyl(meth)acrylate and (meth)acrylic acid and a multi-component copolymer of a benzyl(meth)acrylate and (meth)acrylic acid, and other monomer(s).

Besides that, as another useful example of the polymer, there can be mentioned a copolymer of 2-hydroxyethylmethacrylate or the like. The polymers can be used as a mixture in an arbitrary amount.

Regarding a specific structural unit of the binder polymer, particularly, a copolymer of (meth)acrylic acid and another monomer that can be copolymerized therewith is suitable. Herein, the term "(meth)acrylic acid" is a generic term that encompasses both acrylic acid and methacrylic acid. Hereinbelow, similarly, the term "(meth)acrylate" is a generic term of acrylate and methacrylate.

As the above other monomer(s) that can be copolymerized with (meth)acrylic acid, there may be mentioned alkyl(meth) acrylate, aryl(meth)acrylate, vinyl compounds, and the like. Herein, hydrogen atoms of alkyl and aryl groups may be substituted with a substituent.

Specific examples of the alkyl(meth)acrylate and the aryl (meth)acrylate include methyl(meth)acrylate, ethyl(meth) acrylate, propyl(meth)acrylate, butyl(meth)acrylate, isobutyl (meth)acrylate, pentyl(meth)acrylate, hexyl(meth)acrylate, octyl(meth)acrylate, phenyl(meth)acrylate, benzyl(meth) acrylate, tolyl(meth)acrylate, naphthyl(meth)acrylate, and cyclohexyl(meth)acrylate.

In addition, examples of the vinyl compound include styrene, α-methylstyrene, vinyltoluene, glycidyl methacrylate, acrylonitrile, vinyl acetate, N-vinyl pyrrolidone, tetrahydrofurfuryl methacrylate, polystyrene macromonomer, polymethylmethacrylate macromonomer, $CH_2=CR^1R^2$, and $CH_2=C(R^1)(COOR^3)$ [in which $R^1$ represents a hydrogen atom or an alkyl group having 1 to 5 carbon atoms; $R^2$ represents an aromatic hydrocarbon ring having 6 to 10 carbon atoms; and $R^3$ represents an alkyl group having 1 to 8 carbon atoms or an aralkyl group having 6 to 12 carbon atoms].

These other monomers that can be copolymerized may be used alone or in combination of two or more. Other preferable monomers that can be copolymerized are at least one selected from $CH_2=CR^1R^2$, $CH_2=C(R^1)(COOR^3)$, phenyl(meth) acrylate, benzyl(meth)acrylate, and styrene, and particularly preferable are $CH_2=CR^1R^2$ and/or $CH_2=C(R^1)(COOR^3)$.

In the binder polymer, by including an alkali-soluble resin having a double bond in a side chain, it is possible to improve particularly both the curability of an exposed portion and the alkali developability of an unexposed portion.

The alkali-soluble binder polymer having a double bond in the side chain, which can be used in the present invention, has a structure containing an acid group that renders resin alkali-soluble and at least one unsaturated double bond to improve various performances such as removability of non-image area. A binder resin having such a partial structure has been described in detail in JP-A-2003-262958, and the compound described therein can also be used in the present invention.

Examples of these binder polymers having polymerizable groups are shown below but not restricted to those below, as long as the polymer includes an alkali-soluble group such as a COOH group or an OH group and a carbon-carbon unsaturated bond.

(1) A urethane-modified polymerizable double bond-containing acrylic resin obtained by reacting a compound containing at least one (meth)acryloyl group, in which isocyanate groups have been reacted with OH groups in advance to leave one unreacted isocyanate group, with an acrylic resin containing a carboxyl group.

(2) An unsaturated group-containing acrylic resin obtained by reaction of an acrylic resin containing a carboxy group with a compound having both an epoxy group and a polymerizable double bond in a molecule thereof.

(3) A polymerizable double bond-containing acrylic resin obtained by reacting an acrylic resin containing an OH group with a dibasic acid anhydride having a polymerizable double bond.

Among those above, particularly the resins of (1) and (2) are preferable.

As a preferable example of the binder polymer having a double bond in the side chain usable in the present invention, there is preferably mentioned a binder polymer having at least one polymerizable group in a side chain (hereinafter referred, as needed, to as specific binder resin A), such as a compound having at least one ethylenically unsaturated double bond in a side chain and an epoxy acrylate compound. Of those, more preferable is a compound having at least one ethylenically unsaturated double bond in a side chain.

Additionally, preferably, the compound having at least one ethylenically unsaturated double bond in a side chain further has at least one acid group in a side chain.

Examples of the acid group include a carboxyl group, a phosphoric acid group, and a sulfonic acid group, and preferred is a carboxyl group in terms of availability of raw material.

For the specific binder resin A, there can be used various kinds of polymerizable double bonds, such as a (meth)acrylic group, for example, a (meth)acrylate group or a (meth)acrylamide group, vinyl ester of carboxylic acid, vinyl ether, and allyl ether. Specific examples include a compound obtained by adding, to an acrylic resin containing a carboxyl group as an acid group, a cyclic ether group-containing polymerizable compound, for example, glycidyl acrylate, glycidyl methacrylate, a glycidyl ester of unsaturated fatty acid such as cinnamic acid, or an epoxy group-containing polymerizable compound such as a compound having an cycloaliphatic epoxy group (for example, an epoxy group such as cyclohexene oxide in the same molecule) and a (meth)acryloyl group. Also, the examples include a compound obtained by adding, to an acrylic resin containing an acid group and a hydroxyl group, a polymerizable compound containing an isocyanate group such as isocyanate ethyl(meth)acrylate, and a compound obtained by adding, to an acrylic resin containing an anhydride group, a polymerizable compound containing a hydroxyl group such as hydroxyalkyl(meth)acrylate, as well as include a compound obtained by copolymerizing a cyclic ether group-containing polymerizable compound such as glycidyl methacrylate and a vinyl monomer such as (meth) acryloyl alkylester and adding (meth)acrylic acid to an epoxy group in a side chain.

As these examples, there are mentioned compounds described in Japanese Patent No. 2763775, JP-A-3-172301, and JP-A-2000-232264.

Among them, more preferably, the specific binder resin A is a high molecular compound selected either from a compound obtained by adding, to a part of acid groups of a high molecular compound, a polymerizable compound containing a cyclic ether group (for example, a group having an epoxy group or an oxetane group in its partial structure) or a compound obtained by adding, to some or all of cyclic ether groups of a high molecular compound, a polymerizable compound containing a carboxyl group. In this case, the addition reaction between the acid group and the compound containing a cyclic ether group is preferably performed in the presence of a catalyst, and particularly preferably, the catalyst is selected from acid compounds and neutral compounds.

Above all, in terms of development stability over time in the polymerizable composition, preferably, the specific binder resin A is a high molecular compound that includes a carboxyl group in a side chain, as well as includes, in a side chain, an aromatic group that may contain a hetero ring, and an ethylenically unsaturated bond.

As the aromatic group that may contain a hetero ring (hereinafter may be simply referred to as "aromatic group"), for example, there may be mentioned a benzene ring, a ring formed by condensation of two or three benzene rings, a ring formed by condensation of a benzene ring and a five-membered unsaturated ring, and the like.

Specific examples of the aromatic group include a phenyl group, a naphthyl group, an anthryl group, a phenanthryl group, an indenyl group, an acenaphthenyl group, a fluorenyl group, a benzopyrrole ring group, a benzofuran ring group, a benzothiophene ring group, a pyrazole ring group, an isoxazole ring group, an isothiazole ring group, an indazole ring group, a benzisoxazole ring group, a benzisothiazole ring group, an imidazole ring group, an oxazole ring group, a thiazole ring group, a benzimidazole ring group, a benzoxazole ring group, a benzothiazole ring group, a pyridine ring group, a quinoline ring group, an isoquinoline ring group, a pyridazine ring group, a pyrimidine ring group, a pyrazine ring group, a phthalazine ring group, a quinazoline ring group, a quinoxaline ring group, an aciridine ring group, a phenanthridine ring group, a carbazole ring group, a purine ring group, a pyran ring group, a piperidine ring group, a piperazine ring group, an indole ring group, an indolizine ring group, a chromene ring group, a cinnoline ring group, an acridine ring group, a phenothiazine ring group, a tetrazole ring group, and a triazine ring group. Among them, hydrocarbon aromatic group is preferable, and phenyl and naphthyl groups are more preferable.

The aromatic group may have a substituent, and examples of the substituent include a halogen atom, an amino group that may have a substituent, an alkoxycarbonyl group, a hydroxyl group, an ether group, a thiol group, a thioether group, a silyl group, a nitro group, a cyano group, and an alkyl group, an alkenyl group, an alkynyl group, an aryl group, and a hetero cyclic group each of which may have a substituent.

A content of the ethylenically unsaturated double bond in a side chain per molecule in the specific binder resin A is not specifically restricted. The content thereof is preferably 0.5 to 3.0 meq/g, more preferably 1.0 to 3.0 meq/g, and particularly preferably 1.5 to 2.8 meq/g. When the content thereof is 0.5 meq/g or more, an amount of curing reaction is sufficient, so that sensitivity improvement effect can be obtained. In addition, by setting the content thereof to 3.0 meq/g or less, favorable preservation stability can be maintained.

Herein the content (meq/g) can be measured, for example, by iodine value titration.

A carboxyl group in the specific binder resin A can be introduced by copolymerization of a radically polymerizable compound having an acid group.

As the acid group possessed by the radically polymerizable compound, for example, there are mentioned carboxylic acid, sulfonic acid, and phosphoric acid, and as mentioned above, carboxylic acid is particularly preferable.

The radically polymerizable compound having a carboxyl group is not specifically restricted and can be appropriately selected according to the purpose. Examples include acrylic acid, methacrylic acid, itaconic acid, crotonic acid, incrotonic acid, maleic acid, and p-carboxylstyrene. Among these, acrylic acid, methacrylic acid, and p-carboxylstyrene are preferable. These may be used alone or in combination of two or more.

A content of carboxyl group in the specific binder resin A is preferably 1.0 to 4.0 meq/g, and more preferably 1.5 to 3.0 meq/g. When the content of carboxyl group is 1.0 meq/g or more, sufficient developability can be obtained, and when the content thereof is 4.0 meq/g or less, image damage due to alkali water development is suppressed, whereby developability and image strength retention can be both achieved.

Another preferable example used as a binder polymer in the present invention is polyimide-based resin (hereinafter referred, as necessary, to as "specific binder resin B"). Examples of the polyimide-based resin include polyimide resin, silicon-containing polyimide resin, polyimide siloxane resin, and polymaleimide resin.

The polyimide resin used in the present invention is, for example, formed by thermal ring-closing imidization of polyamic acid as a precursor.

Polyamic acid used for synthesis of polyimide-based resin usually contains, as a main component, a structural unit represented by the following general formula (IV).

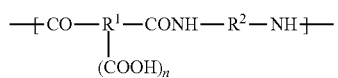

General Formula (VI)

In the general formula (IV), n represents an integer of 0 to 4, and $R^1$ is an acid component residue group and represents a trivalent or tetravalent organic group containing at least two carbon atoms.

In terms of thermal resistance, preferably, $R^1$ is a trivalent or tetravalent group containing a cyclic hydrocarbon, an aromatic ring, or an aromatic hetero ring, and having 6 to 30 carbon atoms.

Examples of the organic group represented by $R^1$ include groups derived from a phenyl group, a biphenyl group, a terphenyl group, a naphthalene group, a perylene group, a diphenyl ether group, a diphenyl sulfone group, a diphenyl propane group, a benzophenone group, a biphenyltrifluoropropane group, a cyclobutyl group, and cyclopentyl group, although not limited thereto. Among them, $R^1$ is preferably a phenyl group or a cyclobutyl group.

$R^2$ represents a divalent organic group having at least two carbon atoms. In terms of thermal resistance, $R^2$ is preferably a divalent group containing a cyclic hydrocarbon, an aromatic ring, or an aromatic hetero ring, and having 6 to 30 carbon atoms.

Examples of the divalent organic group represented by $R^2$ include divalent groups derived from a phenyl group, a biphenyl group, a terphenyl group, a naphthalene group, a perylene group, a diphenyl ether group, a diphenyl sulfone group, a diphenyl propane group, a benzophenone group, a biphenyltrifluoropropane group, a diphenyl methane group, and cyclohexyl methane group, although not limited thereto. Among them, $R^2$ is preferably a diphenyl ether group, a diphenyl sulfone group, a diphenyl propane group, or a diphenyl methane group.

The polymer including, as a main component, the structural unit represented by the general formula (IV) may be a homopolymer containing only one kind of structural units represented by the general formula (IV) or a copolymer containing two or more kinds of mutually different structural units represented by the general formula (IV).

In addition, the polymer may include, as a copolymer component, a structural unit other than structural units represented by the general formula (IV)

As another preferable example used as a binder polymer in the present invention, there is mentioned a urethane resin having a polymerizable group in a side chain (hereinafter referred, as necessary, to as "specific binder resin C").

The specific binder resin C used in the present invention has, in its side chain, at least one of functional groups represented by the following general formulas (C-1) to (C-3). First, a description will be given of functional groups represented by the general formulas (C-1) to (C-3) below.

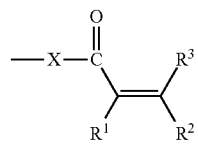

(C-1)

In the general formula (C-1), $R^1$ to $R^3$ each independently represent a hydrogen atom or a monovalent organic group. As $R^1$, there may be mentioned a hydrogen atom or an alkyl group that may have a substituent. Of these, preferable is a hydrogen atom or a methyl group because of high radical reactivity. In addition, $R^2$ and $R^3$ each independently may represent a hydrogen atom, a halogen atom, an amino group, a carboxyl group, an alkoxycarbonyl group, a sulfo group, a nitro group, a cyano group, an alkyl group that may have a substituent, an aryl group that may have a substituent, an alkoxy group that may have a substituent, an aryloxy group that may have a substituent, an alkylamino group that may have a substituent, an arylamino group that may have a substituent, an alkylsulfonyl group that may have a substituent, or an arylsulfonyl group that may have a substituent. Among them, preferable are a hydrogen atom, a carboxyl group, an alkoxycarbonyl group, an alkyl group that may have a substituent, and an aryl group that may have a substituent because of high radical reactivity.

X represents an oxygen atom, a sulfur atom, or $-N(R^{12})-$, in which $R^{12}$ represents a hydrogen atom or a monovalent organic group. Herein, examples of $R^{12}$ include alkyl groups that may have a substituent, and among them, a hydrogen atom, a methyl group, an ethyl group, and an isopropyl group are preferable because of high radical reactivity.

Herein, examples of substituents that can be introduced include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amide group, an alkylsulfonyl group, and an arylsulfonyl group.

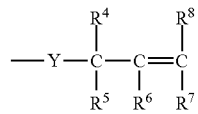

(C-2)

In the general formula (C-2), $R^4$ to $R^8$ each independently represent a hydrogen atom or a monovalent organic group. Preferably, $R^4$ to $R^8$ are a hydrogen atom, a halogen atom, an amino group, a dialkylamino group, a carboxyl group, an alkoxycarbonyl group, a sulfo group, a nitro group, a cyano group, an alkyl group that may have a substituent, an aryl group that may have a substituent, an alkoxy group that may have a substituent, an aryloxy group that may have a substituent, an alkylamino group that may have a substituent, an arylamino group that may have a substituent, an alkylsulfonyl group that may have a substituent, or an arylsulfonyl group that may have a substituent. Among them, preferred are a hydrogen atom, a carboxyl group, an alkoxycarbonyl group, an alkyl group that may have a substituent, and an aryl group that may have a substituent.

As substituents that can be introduced, there are exemplified the same ones as those of the general formula (C-1). Additionally, Y represents an oxygen atom, a sulfur atom, or —N(R$^{12}$)—, in which R$^{12}$ has the same definition and the same preferable definition as R$^{12}$ of the general formula (C-1).

(C-3)

In the general formula (C-3), R$^9$ preferably represents a hydrogen atom, an alkyl group that may have a substituent, or the like. Among them, a hydrogen atom and a methyl group are preferable because of high radical activity. R$^{10}$ and R$^{11}$ each independently may represent a hydrogen atom, a halogen atom, an amino group, a dialkylamino group, a carboxyl group, an alkoxycarbonyl group, a sulfo group, a nitro group, a cyano group, an alkyl group that may have a substituent, an aryl group that may have a substituent, an alkoxy group that may have a substituent, an aryloxy group that may have a substituent, an alkylamino group that may have a substituent, an arylamino group that may have a substituent, an alkylsulfonyl group that may have a substituent, and an arylsulfonyl group that may have a substituent. Among them, preferred are a hydrogen atom, a carboxyl group, an alkoxycarbonyl group, an alkyl group that may have a substituent, and an aryl group that may have a substituent because of high radical reactivity.

Herein, as substituents that can be introduced, there are exemplified the same ones as those of the general formula (C-1). Additionally, Z represents an oxygen atom, a sulfur atom, —N(R$^{13}$)—, or a phenylene group that may have a substituent, and R$^{13}$ is an alkyl group that may have a substituent, or the like. Among them, preferred are a methyl group, an ethyl group, and an isopropyl group because of high radical reactivity.

Next, a description will be given of a basic skeleton of the specific binder resin C according to the present invention.

The specific binder resin C according to the present invention is a polyurethane resin including, as a basic skeleton, a structural unit represented by a reaction product of at least one diisocyanate compound represented by the following general formula (C-4) and at least one diol compound represented by a general formula (C-5).

OCN—X$^0$—NCO (C-4)

HO—Y$^0$—OH (C-5)

In the general formulas (C-4) and (C-5), X$^0$ and Y$^0$ each independently represent a divalent organic residue group.

When at least one of the diisocyanate compound represented by the general formula (C-4) and the diol compound represented by the general formula (C-5) has at least one of the groups represented by the general formulas (C-1) to (C-3), there is produced a specific polyurethane resin in which the group represented by the general formulas (C-1) to (C-3) has been introduced in a side chain, as the reaction product of the diisocyanate compound and the diol compound. In this manner, a specific polyurethane resin according to the present invention can be more easily produced than in substitution or introduction of a desired side chain after reaction production of the polyurethane resin.

1) Diisocyanate Compound

As the diisocyanate compound represented by the general formula (C-4), for example, there is a product obtained by addition reaction of a triisocyanate compound and 1 equivalent of a monofunctional alcohol or a monofunctional amine compound having an unsaturated group.

Specific examples of the above compounds used to obtain the diisocyanate compound are described in paragraph Nos. [0034] to [0040] of JP-A-2006-63550, so that the compounds can be used. In addition, as the diisocyanate compound, it is also preferable to use a compound having a polymerizable group in a side chain, described in paragraph Nos. [0042] to [0049] of the same Patent Literature.

2) Diol Compound

Examples of the diol compound represented by the general formula (C-5) widely include polyether diol compounds, polyester diol compounds, and polycarbonate diol compounds.

Herein, as a method for obtaining the specific binder resin C by introducing an unsaturated group in a side chain of the polyurethane resin, besides the above-mentioned method, a method using a diol compound containing an unsaturated group in a side chain as a raw material for producing the polyurethane resin is also suitable. Such a diol compound may be, for example, a commercially available product, as trimethylol propane monoallyl ether, or a compound easily produced by the reaction of a halogenated diol compound, a triol compound, or an aminodiol compound and an saturated group-containing carboxylic acid, acid chloride, isocyanate, alcohol, amine, thiol, or halogenated alkyl compound. Specific examples of these compounds include compounds described in paragraph Nos. [0057] to [0066] of the same Patent Literature, which can also suitably used in the present invention.

Furthermore, for the synthesis of the specific binder resin C, it is also possible to use a carboxyl group-containing diol compound other than the above diol compound.

Examples of such a diol compound include those described as formulas (17) to (19) in the same Patent Literature. Specific examples thereof include 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethylglycine, and N,N-bis(2-hydroxyethyl)-3-carboxy-propionamide.

The presence of such a carboxyl group can provide the properties of hydrogen bondability and alkali solubility to the specific binder resin C, which is thus preferable.

The polyurethane resin having an ethylenically unsaturated bond group in a side chain is preferably a resin further having a carboxyl group in a side chain. More specifically, a particularly preferable polyurethane resin as the binder polymer of the present invention is a polyurethane resin containing an ethylenically unsaturated bond group in a side chain in an equivalent amount of 0.3 meq/g or more, and furthermore, from 0.35 to 1.50 meq/g and also containing a carboxyl group in a side chain in an equivalent amount of 0.4 meq/g or more, and more preferably 0.45 to 1.00 meq/g.

A weight average molecular weight of the binder polymer usable in the polymerizable composition of the present invention is preferably 3,000 or more, more preferably in a range of 5,000 to 300,000, and most preferably in a range of 10,000 to 30,000. A number average molecular weight of the binder polymer is preferably 1,000 or more, and more preferably in a range of 2,000 to 250,000. A polydispersity (weight average molecular weight/number average molecular weight) thereof is preferably 1 or more, and more preferably in a range of 1.1 to 10.

These binder polymers may be a random polymer, a block polymer, a graft polymer, or the like.

The binder polymer usable in the present invention can be synthesized by a conventionally known method. Examples of a solvent used for the synthesis include tetrahydrofuran, ethylene dichloride, cyclohexanone, propylene glycol monomethyl ether, propylene glycol monomethyl ether acetate, and butyl acetate. These solvents may be used alone or in combination of two or more thereof.

As a radical polymerization initiator used for the synthesis of the binder polymer usable in the polymerizable composition using a monomer having a vinyl bond, there are mentioned known compounds such as azo-based initiators and peroxide initiators.

In addition, as the binder polymer usable in the present invention, acetal-modified polyvinyl alcohol-based binder polymers having an acid group described in European Patent No. 993966, European Patent No. 1204000, JP-A-2001-318463, and the like are suitable because of their excellent balance between film strength and developability. Furthermore, besides them, as a water-soluble linear organic polymer, polyvinyl pyrrolidone, polyethyleneoxide, and the like are useful. Additionally, to increase the strength of a cured coating film, alcohol-soluble nylon, polyether of 2,2-bis-(4-hydroxyphenyl)-propane and epichlorohydrin, and the like are also useful.

In addition, there may be mentioned a high molecular compound having an acid group and an ethylenically unsaturated bond in a side chain and having a bisphenol A-type skeleton and a bisphenol F-type skeleton, a novolac resin having an acid group and an ethylenically unsaturated bond, resol resin, and the like. These resins can be obtained by a technique described in paragraph Nos. [0008] to [0027] in JP-A-11-240930.

A total content of the binder resins A to C in the total solid content of the polymerizable composition of the present invention is preferably 5 to 80% by mass, and more preferably 10 to 70% by mass.

When the content thereof is in the above range, exposure sensitivity is favorable, processing time can be shortened, and good TCT resistance can be obtained.

The binder polymer in the present invention can improve coating film formability during application of the polymerizable composition for a solder resist, as well as can improve the toughness and the insulation reliability of a formed solder resist film by selecting the kind of binder resin. For example, by selecting, as a binder polymer, an epoxy acrylate-containing resin, a polyamide(imide)-containing resin, a copolymer prepared by including a polyimide precursor, a benzyl(meth) acrylate monomer, and a (meth)acrylic acid monomer, a copolymer prepared by including an allyl(meth)acrylate monomer and (meth)acrylic acid, or the like, the strength of a film cured by exposure is improved, thereby improving the toughness and insulation reliability of a solder resist obtained by exposure and development of the polymerizable composition for a solder resist.

<Filler>

The polymerizable composition of the present invention may further include a filler. As the filler usable in the present invention, there is mentioned spherical silica having surfaces treated with a silane coupling agent. Using spherical silica having surfaces treated with a silane coupling agent can improve thermal cycle test resistance and preservation stability of the polymerizable composition. Thus, for example, even after being exposed to a harsh atmosphere, such as a thermal cycle test, the same good shape as that obtained immediately after pattern formation can be maintained.

The term "spherical" in the spherical filler means that it is sufficient as long as the shape of particles is roundish, not acicular, columnar, or amorphous, and the shape thereof does not necessarily have to be "truly spherical". As a typical "spherical" shape, there is mentioned a "truly spherical" shape.

The spherical shape of the filler can be confirmed by observation using a scanning electron microscope (SEM).

A volume average particle diameter of primary particles of the filler is not specifically restricted and can be appropriately selected according to the purpose. The volume average particle diameter thereof is preferably 0.05 to 3 µm, and more preferably 0.1 to 1 µm. When the volume average particle diameter of the primary particles of the filler is in the above range, reduction of processability due to the occurrence of thixotropy is suppressed and a largest particle diameter is not increased. Therefore, the occurrence of defects caused by adhesion of a foreign object onto an obtained cured film and unevenness of coated film are suppressed, which is thus advantageous.

The volume average particle diameter of the primary particles of the filler can be measured by a dynamic light scattering particle size distribution analyzer.

The filler can be dispersed by using the dispersant for inorganic pigment and the binder described above. From the viewpoint of curability, particularly preferred is an alkali-soluble binder polymer having a double bond in a side chain.

—Surface Treatment—

Next, surface treatment of the filler will be described. The surface treatment for filler is not specifically restricted and can be appropriately selected according to the purpose. Preferred is a treatment for coating silica with a silane coupling agent.

—Silane Coupling Agent—

The silane coupling agent is not specifically restricted and can be appropriately selected according to the purpose. However, preferably, the compound has at least one functional group (hereinafter may also be referred to as "first functional group") selected from alkoxysilyl groups, chlorosilyl groups, and acetoxysilyl groups and at least one functional group (hereinafter may also be referred to as "second functional group") selected from (meth)acryloyl groups, amino groups, and epoxy groups, and more preferably, the second functional group is a (meth)acryloyl group or an amino group, in which as the second functional group, a (meth)acryloyl group is more preferable. When the second functional group is a (meth)acryloyl group, it is advantageous in terms of preservation stability and TCT resistance.

In addition, a compound described in JP-B-7-68256 can also be preferably used. The compound includes, as a first functional group, at least one selected from an alkoxysilyl group, a chlorosilyl group, and an acetoxysilyl group and, as a second functional group, at least one selected from an imidazole group, an alkylimidazole group, and a vinylimidazole group.

The silane coupling agent is not specifically restricted. Suitable examples of the silane coupling agent include a γ-aminopropyltriethoxysilane, N-(β-aminoethyl)-γ-aminopropyltrimethoxysilane, N-(β-aminoethyl)-γ-aminopropylmethyldimethoxysilane, γ-glycidoxypropyltrimethoxysilane, γ-glycidoxypropylmethyldiethoxysilane, γ-methacryloxypropyltrimethoxysilane, γ-methacryloxypropylmethyldimethoxysilane, α-[[3-(trimethoxysilyl)propoxy]methyl]-imidazole-1-ethanol described in JP-B-7-68256, 2-ethyl-4-methyl-α-[[3-(trimethoxysilyl)propoxy]methyl]-imidazole-1-ethanol, 4-vinyl-α-[[3-(trimethoxysilyl)propoxy]methyl]-imidazole-1-ethanol, 2-ethyl-4-methylimidazopropyltrimethoxysilane, and salts thereof, intramolecular condensates thereof, and intermolecular condensates thereof. These may be used alone or in combination of two or more thereof.

The surface treatment of spherical silica using the silane coupling agent may be performed in advance only on the spherical silica (this case may be hereinafter referred to as "pretreatment"), or may be performed together with treatment for a part or all of other filler(s) included in the polymerizable composition.

The method for performing the pretreatment is not specifically restricted, and for example, there may be mentioned a dry method, an aqueous solution method, an organic solvent method, and a spray method. Pretreatment temperature is not specifically restricted, but preferably from room temperature to 200° C.

During pretreatment, addition of a catalyst is also preferable. The catalyst is not specifically restricted. Examples of the catalyst include acids, bases, metal compounds, and organic metal compounds.

An amount of the silane coupling agent added in the pretreatment is not specifically restricted, but preferably in a range of 0.01 to 50 parts by mass, and more preferably in a range of 0.05 to 50 parts by mass, with respect to 100 parts by mass of the spherical silica. By setting the amount of addition of the silane coupling agent in the above range, surface treatment sufficient to exhibit effect can be performed, and deterioration of handling due to the aggregation of spherical silica after treatment is suppressed.

The silane coupling agent serves to improve adhesion between a substrate and a photosensitive layer, since the first functional group reacts with active groups on the substrate surface, the spherical silica surface, and in the binder, and additionally, the second functional group reacts with a carboxyl group and an ethylenically unsaturated group of the binder. Meanwhile, the silane coupling agent is highly reactive. Accordingly, when the agent itself is added to the polymerizable composition, diffusion action causes reaction or deactivation of mainly the second functional group during preservation, whereby shelf life or pot life may be shortened.

However, by using the spherical silica pretreated with the silane coupling agent as described above, the diffusion action is suppressed, so that problems with shelf life and spot life are greatly ameliorated, which enables a one-component type composition. Furthermore, when performing pretreatment on the spherical silica, conditions such as stirring condition, temperature condition, and catalyst use can be freely selected. Accordingly, as compared to when adding without pretreatment, reactivity between the first functional group of the silane coupling agent and the active group present in the silica can be significantly increased. Thus, particularly regarding severe requirement characteristics, such as electroless gold plating, electroless solder plating, and humidity load life test, extremely favorable results can be obtained. Moreover, performing the pretreatment can reduce the amount of the silane coupling agent used, which can further improve shelf life and pot life.

Examples of spherical silica with surfaces treated with the silane coupling agent usable in the present invention include FB and SFP series manufactured by Denki Kagaku Kogyou Kabushiki Kaisha; 1-FX manufactured by Tatsumori Ltd; HSP series manufactured by Toagosei Co., Ltd; and SP series manufactured by Fuso Chemical Co., Ltd.

A content of the filler in the total solid content of the polymerizable composition is not specifically restricted and can be appropriately selected according to the purpose. The content thereof is preferably 1 to 60% by mass. When the content of the filler is in the above range, the linear expansion coefficient is sufficiently reduced and embrittlement of cured film formed is suppressed. Thus, when wiring is formed using a permanent pattern, function as a protective film for the wiring is sufficiently exhibited.

<Thermal Curing Accelerator>

In the polymerizable composition for a solder resist of the present invention, to accelerate thermal curing of the epoxy compound or the oxetane compound used as a thermal crosslinking agent, a thermal curing accelerator may be used. Examples of the accelerator include an amine compound (such as dicyandiamide, benzyldimethylamine, 4-(dimethylamino)-N,N-dimethylbenzylamine, 4-methoxy-N,N-dimethylbenzylamine, and 4-methyl-N,N-dimethylbenzylamine), a quaternary ammonium salt compound (such as triethylbenzyl ammonium chloride), a blocked isocyanate compound (such as dimethylamine), an imidazole derivative-bicyclic amidine compound and a salt thereof (such as imidazole, 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanethyl)-2-ethyl-4-methylimidazole) a phosphorus compound (such as triphenylphosphine), a guanamine compound (such as melamine, guanamine, acetoguanamine, and benzoguanamine), and an S-triazine derivative (such as 2,4-diamino-6-methacryloyloxyethyl-5-triazine, 2-vinyl-2,4-diamino-5-triazine, 2-vinyl-4,6-diamino-S-triazine-isocyanuric acid adduct, 2,4-diamino-6-methacryloyloxyethyl-S-triazine-isocyanuric acid adduct). These may be used alone or in combination of two or more thereof. The compound for the thermal curing accelerator is not specifically restricted as long as it is a curing catalyst for the epoxy resin compound or the oxetane compound or can accelerate the reaction between these compounds and a carboxyl group, and there may be used compound(s) that can accelerate thermal curing other than those above.

A content of a compound that can accelerate thermal curing of the epoxy compound, the oxetane compound, and these compounds and a carboxylic acid in the total solid content of the polymerizable composition is usually 0.01 to 15% by mass.

<Elastomer>

Preferably, the polymerizable composition of the present invention further includes an elastomer.

By including an elastomer, adhesion between a print circuit board and a conductive layer can be further improved when the polymerizable composition is used for a solder resist. In addition, thermal resistance, resistance to thermal shock, flexibility, and toughness of cured film can be further improved.

The elastomer usable in the present invention is not specifically restricted and can be appropriately selected according to the purpose. Examples of the elastomer include a styrene-based elastomer, an olefin-based elastomer, a urethane-based elastomer, a polyester-based elastomer, a polyamide-based elastomer, an acrylic elastomer, and a silicone-based elastomer. These elastomers are composed of a hard segment component and a soft segment component, and in general, the former contributes to thermal resistance and strength, whereas the latter contributes to flexibility and toughness. Among them, a polyester-based elastomer is advantageous in terms of compatibility with other materials.

Examples of the styrene-based elastomer include a styrene-butadiene-styrene block copolymer, a styrene-isoprene-styrene block copolymer, a styrene-ethylene-butylene-styrene block copolymer, and a styrene-ethylene-propylene-styrene block copolymer. As a component forming the styrene-based elastomer, besides styrene, there can be used a styrene derivative such as α-methylstyrene, 3-methylstyrene, 4-propylstyrene, and 4-cyclohexylstyrene. Specific examples thereof include TUFPRENE, SOLPRENE T, ASAPRENE T, and TUFTEC (manufactured by Asahi Kasei Corporation); ELASTOMER AR (manufactured by Aronkasei Co., Ltd.); KRATON G and CALIFLEX (manufactured by Shell Japan Co. Ltd.); JSR-TR, TSR-SIS, and DYNARON (manufactured by JSR Corporation); DENKA STR (manufactured by Denki Kagaku Kogyo K.K.); QUINTAC (manufactured by ZEON Corporation); TPE-SB Series (manufactured by Sumitomo Chemical Co., Ltd.): RABALON (manufactured by Mitsubishi Chemical Corporation); SEPTON and HYBRAR (manufactured by Kuraray Co., Ltd.); SUMIFLEX (manufactured by Sumitomo Bakelite Co., Ltd.); and LEOSTOMER and ACTYMER (manufactured by Riken Vinyl Industry Co., Ltd.).

The olefin-based elastomer is a copolymer of α-olefin having 2 to 20 carbon atoms, such as ethylene, propylene, 1-butene, 1-hexene, and 4-methyl-pentene, and for example, there may be mentioned an ethylene-propylene copolymer (EPR), an ethylene-propylene-diene copolymer (EPDM), and the like. In addition, examples of the olefin-based elastomer include a copolymer of a nonconjugated diene having 2 to 20 carbon atoms, such as dicyclopentadiene, 1,4-hexadiene, cyclooctadiene, methylenenorbornene, ethylidenenorbornene, butadiene, or isoprene and α-olefin, and an epoxidized polybutadiene. Furthermore, the examples of the olefin-based elastomer include a carboxyl-modified NBR obtained by copolymerizing methacrylic acid with a butadiene-acrylonitrile copolymer, and the like. Still other examples of the olefin-based elastomer include an ethylene-α-olefin copolymer rubber, an ethylene-α-olefin-nonconjugated diene copolymer rubber, a propylene-α-olefin copolymer rubber, and a butene-α-olefin copolymer rubber.

Specific examples of the olefin-based elastomer include MILASTOMER (manufactured by Mitsui Petrochemical Industries, Ltd.); EXACT (manufactured by Exxon Chemical); ENGAGE (manufactured by Dow Chemical); hydrogenated styrene-butadiene rubber "DYNABON HSBR" (manufactured by JSR Corporation); butadiene-acrylonitrile copolymer "NBR Series" (manufactured by JSR Corporation); butadiene-acrylonitrile copolymer modified with carboxyl groups at both terminals, having a crosslinking point "XER Series" (manufactured by JSR Corporation); and epoxidized polybutadiene obtained by partially epoxidizing polybutadiene "BF-1000" (manufactured by Nippon Soda Co., Ltd.).

The urethane-based elastomer is composed of structural units of a hard segment made of low molecular (short chain) diol and diisocyanate and a soft segment made of high molecular (long chain) diol and diisocyanate. Examples of the high molecular (long chain) diol include polypropylene glycol, polytetramethylene oxide, poly(1,4-butylene adipate), poly(ethylene-1,4-butylene adipate), polycaprolactone, poly(1,6-hexylene carbonate), and poly(1,6-hexylene-neopentylene adipate). The number average molecular weight of the high molecular (long chain) diol is preferably from 500 to 10,000. Examples of the low molecular (short chain) diol include ethylene glycol, propylene glycol, 1,4-butanediol, and bisphenol A. The number average molecular weight of the short chain diol is preferably from 48 to 500. Specific examples of the urethane-based elastomer include PANDEX T-2185 and T-2983N (manufactured by DIC Corporation), and Shirakutoran E790.

The polyester-based elastomer is obtained by polycondensation of a dicarboxylic acid or a derivative thereof and a diol compound or a derivative thereof. Specific examples of the dicarboxylic acid include aromatic dicarboxylic acids such as terephthalic acid, isophthalic acid, and naphthalenedicarboxylic acid, and aromatic dicarboxylic acids in which hydrogen atoms of the above-described aromatic rings are substituted with a methyl group, an ethyl group, a phenyl group, or the like; aliphatic dicarboxylic acids having 2 to 20 carbon atoms, such as adipic acid, sebacic acid, and dodecanedicarboxylic acid; and alicyclic dicarboxylic acids such as cyclohexanedicarboxylic acid. These compounds may be used alone or in combination of two or more thereof. Specific examples of the diol compound include aliphatic and alicyclic diols such as ethylene glycol, 1,3-propanediol, 1,4-butanediol, 1,6-hexanediol, 1,10-decanediol, and 1,4-cyclohexanediol, bisphenol A, bis-(4-hydroxyphenyl)-methane, bis-(4-hydroxy-3-methylphenyl)-propane, and resorcin. These compounds may be used alone or in combination of two or more thereof. In addition, there can be used a multi-block copolymer composed of a hard segment component made of an aromatic polyester (such as polybutylene terephthalate) portion and a soft segment component made of an aliphatic polyester (such as polytetramethylene glycol) portion. The polyester-based elastomer is available in various grades according to the kind, proportion, molecular weight difference, and the like of the hard segment and the soft segment. Specific examples of the polyester-based elastomer include HYTREL (manufactured by Du Pont-Toray Co., Ltd.), PELPRENE (manufactured by Toyobo Co., Ltd.), and ESPEL (manufactured by Hitachi Chemical Co., Ltd.).

The polyamide-based elastomer is composed of a hard segment made of polyamide and a soft segment made of polyether or polyester and is roughly classified into two types: a polyether block amide type and a polyetherester block amide type. Examples of polyamide include polyamide 6, polyamide 11, and polyamide 12. Examples of polyether include polyoxyethylene, polyoxypropyrene, and polytetramethyleneglycol. Specific examples of the polyamide-based elastomer include UBE POLYAMIDE ELASTOMER (manufactured by Ube Industries, Ltd.), DAIAMID (manufactured by Daicel-Huels Ltd.), PEBAX (manufactured by Toray Industries, Inc.), GRILON ELY (EMS Japan Co., Ltd.), NOVAMID (manufactured by Mitsubishi (Chemical Corporation), and GRILAX (manufactured by DIC Corporation).

The acrylic elastomer is obtained by copolymerization of an acrylic acid ester such as ethyl acrylate, butyl acrylate, methoxyethyl acrylate, or ethoxyethyl acrylate, an epoxy group-containing monomer such as glycidyl methacrylate or allyl glycidyl ether, and/or a vinyl-based monomer such as acrylonitrile or ethylene. Examples of the acrylic elastomer include an acrylonitrile-butyl acrylate copolymer, an acrylonitrile-butyl acrylate-ethyl acrylate copolymer, and an acrylonitrile-butylacrylate-glycidyl methacrylate copolymer.

The silicone-based elastomer is made of mainly organopolysiloxane and classified into polydimethylsiloxane-based elastomer, polymethylphenylsiloxane-based elastomer, and polydiphenylsiloxane-based elastomer. In addition, there may be used one obtained by modifying a part of organopolysiloxane with a vinyl group, an alkoxy group, or the like. Specific examples of the silicone-based elastomer include KE Series (manufactured by Shin-Etsu Chemical Co., Ltd.), and SE Series, CY Series and SH Series (manufactured by Dow Corning Toray Silicone Co., Ltd.).

Additionally, besides the above elastomers, rubber-modified epoxy resin can also be used. The rubber-modified epoxy resin is obtained by modifying some or all of epoxy groups in the bisphenol F-type epoxy resin, the bisphenol A-type epoxy resin, salicylaldehyde-type epoxy resin, phenol novolac-type epoxy resin, cresol novolac-type epoxy resin, or the like with a both-terminal carboxylic acid-modified butadiene-acrylonitrile rubber, a both-terminal amino-modified silicone rubber, or the like.

Among the elastomers, from the viewpoint of shear adhesive strength and resistance to thermal shock, preferred are a both-terminal carboxylic acid-modified butadiene-acrylonitrile copolymer, ESPEL having a hydroxyl group (ESPEL 1612 and 1620 manufactured by Hitachi Chemical Co. Ltd.) as the polyester-based elastomer, and epoxidized polybutadiene A content of the elastomer to be used in the polymerizable composition of the present invention is not specifically restricted and can be appropriately selected according to the purpose. However, the content thereof in the total solid content of the polymerizable composition is preferably 0.5 to 30% by mass, more preferably 1 to 10% by mass, and particularly preferably 3 to 8% by mass. When the content thereof is in the preferable range, it is advantageous in that shear adhesive strength and resistance to thermal shock can be further increased.

<Surfactant>

In the polymerizable composition of the present invention, a surfactant may be added. As the surfactant, there can be used various kinds of surfactants such as a fluorine-based surfactant, a nonionic surfactant, a cationic surfactant, an anionic surfactant, and a silicone-based surfactant.

Particularly, by including a fluorine-based surfactant, liquid properties (particularly, fluidity) of a coating liquid produced can be further improved, thereby further improving coating-thickness uniformity and liquid-saving efficiency.

In other words, in the polymerizable composition including a fluorine-based surfactant, by reducing interfacial tension between a coated surface and a coating liquid, wettability on the coated surface is improved and thereby coatability on the coated surface is enhanced. Accordingly, even when a thin film having a thickness of a few to a few tens of micrometers is formed with a small amount of the liquid, the polymerizable composition is effective in that formation of film having less uneven thickness and uniform thickness can be more suitably performed.

A fluorine content in the fluorine-based surfactant is suitably 3 to 40% by mass, more preferably 5 to 30% by mass, and particularly preferably 7 to 25% by mass. When the fluorine content is in the range, it is effective in terms of coating-thickness uniformity and liquid-saving efficiency, and the solubility of the surfactant in the composition is also favorable.

Examples of the fluorine-based surfactant include MEGAFAC F171, MEGAFAC F172, MEGAFAC F173, MEGAFAC F176, MEGAFAC F77, MEGAFAC F141, Megafac F142, MEGAFAC F143, MEGAFAC F144, MEGAFAC R30, MEGAFAC F437, MEGAFAC F475, Megafac F479, MEGAFAC F482, MEGAFAC F780, and MEGAFAC F781 (manufactured by DIC Corporation); FLUORAD FC430, FLUORAD FC431, and FLUORAD FC171 (manufactured by Sumitomo 3M Ltd.); SURFLON S-382, SURFLON SC-101, SURFLON SC-103, SURFLON SC-104, SURFLON SC-105, SURFLON SC-1068, SURFLON SC-381, SURFLON SC-383, SURFLON S-393, and SURFLON KH-40 (manufactured by Asahi Glass Co., Ltd.), and SOLSPERSE 20000 (manufactured by The Lubrizol Corporation).

Specific examples of the cationic surfactant include a phthalocyanine derivative (a commercially available product: EFKA-745, manufactured by BASF Japan Co. Ltd.); an organosiloxane polymer KP341 (manufactured by Shin-Etsu Chemical Co., Ltd.); (meth)acrylic acid (co)polymers: POLYFLOW No. 75, No. 90, and No. 95 (manufactured by Kyoeisha Chemical Co., Ltd.); and W001 (manufactured by Yusho Co., Ltd.).

Specific examples of the nonionic surfactant include polyoxyethylene lauryl ether, polyoxyethylene stearyl ether, polyoxyethylene oleyl ether, polyoxyethylene octylphenyl ether, polyoxyethyl ene nonylphenyl ether, polyethylene glycol dilaurate, polyethylene glycol distearate, and sorbitan fatty acid esters (such as PLURONIC L10, L31, L61, L62, 10R5, 17R2, and 25R2, and TETRONIC 304, 701, 704, 901, 904, and 150R1, manufactured by BASF Japan Co. Ltd).

Specific examples of the anionic surfactant include W004, W005, and W017 (manufactured by Yusho Co. Ltd).

Examples of the silicone-based surfactant include "TORAY SILICONE DC3PA", "TORAY SILICONE SH7PA", "TORAY SILICONE DC11PA", "TORAY SILICONE SH21PA", "TORAY SILICONE SH28A", "TORAY SILICONE SH29PA", "TORAY SILICONE SH30PA" and "TORAY SILICONE SH8400" manufactured Dow Corning Toray Silicone Co., Ltd.; "TSF-4440", "TSF-4300", "TSF4445", "TSF-4460" and "TSF-4452" manufactured by Toshiba Silicone Co. Ltd.; "KP341", "KF6001" and "KF6002" manufactured by Shin-Etsu Silicone Co. Ltd.; and "BYK-323" and "BYK-330" manufactured by BYK Chemie Co. Ltd.

The surfactant may be used in combination of two or more kinds thereof.

<Other Components>

In the polymerizable composition of the present invention, in addition to the essential components and the preferable additives described above, other components may be appropriately selected according to the purpose to be used within a range that does not deteriorate the effects of the present invention.

Examples of other components that can be used together include a thermal curing accelerator, a thermal polymerization inhibitor, a plasticizer, and a coloring agent (coloring pigment or dye). Additionally, an adhesion accelerator to substrate surface and other auxiliary agents (such as conductive particles, a filler, a defoaming agent, a flame retardant, a leveling agent, a release accelerator, an antioxidant, a perfume, a surface tension adjuster, and a chain transfer agent) may also be used together.

Stability, photographability, film properties, and the like of an intended solder resist can be adjusted by appropriately including those components.

The thermal polymerization inhibitor is described in detail, for example, in paragraph Nos. [0101] to [0102] of JP-A-2008-250074.

The plasticizer is described in detail, for example, in paragraph Nos. [0103] to [0104] of JP-A-2008-250074.

The coloring agent is described in detail, for example, in paragraph Nos. [0105] to [0106] of JP-A-2008-250074.

The adhesion accelerator is described in detail, for example, in paragraph Nos. [0107] to [0109] of JP-A-2008-250074.

The additives described in the Patent Literature can be all used in the polymerizable composition of the present invention.

The polymerizable composition of the present invention is preferably filtrated by a filer for removal of a foreign substance, reduction of detects, or the like. The filter is not specifically restricted as long as it is conventionally used for filtration or the like. Examples of the filter include those made of a fluorocarbon resin such as PTFE (polytetrafluoroethylene); a polyamide resin such as nylon-6 or nylon-6,6; and a polyolefin resin (including high density and ultra-high-molecular-weight) such as polyethylene or polypropylene (PP). Among the materials, preferred is polypropylene (including high density polypropylene).

A pore size of the filter is suitably about 0.01 to 7.0 μm, preferably about 0.01 to 2.5 μm, and more preferably about 0.01 to 1.5 μm. Setting the pore size thereof in the range can ensure the removal of a minute foreign substance disturbing the preparation of the uniform and smooth colored composition in the downstream process.

In the use of filter, different filters may be used in combination. In that case, filtering by a first filter may be performed only once or two or more times. When filtering two or more times by combining different filters, pore size for a second or subsequent filtering is preferably made larger than that for a first filtering. In addition, first filters having different pore size in the above-mentioned range may be used in combination. The pore size herein can be set by referring to nominal values of filter manufacturers. For example, commercially available filters can be selected from those provided by Paul Corporation, Advantec Toyo Kaisha, Ltd., Nihon Entegris K.K. (former Nihon Mykrolis K.K.), or Kitz Micro Filter Corporation.

As the second filter, there can be used a filter made of the same material and the like as that of the above-mentioned first filter. The pore size of the second filter is suitably about 0.5 to 7.0 μm, preferably about 2.5 to 7.0 μm, and more preferably about 4.5 to 6.0 μm. By setting the pore size of the second filter in the range, while leaving component particles contained in a mixture solution, it is possible to remove a foreign substance mixed in the mixture solution and disturbing the preparation of the uniform and smooth polymerizable composition in the downstream process.

For example, filtering by the first filter may be performed using only a dispersion liquid, and then, after mixing other component(s), the second filtering may be performed.

The polymerizable composition of the present invention thus obtained is used for formation of a solder resist. To form a coated film having a relatively large thickness, a solid content concentration is preferably 30% by mass or more but 80% by mass or less, more preferably 35% by mass or more but 70% by mass or less, and most preferably 40 to 60%.

In addition, from the viewpoint of thick-film formability and uniform coatability, a viscosity of the polymerizable composition of the present invention is preferably in a range of mPa·s or more but 3000 mPa·s or less, more preferably in a range of 500 mPa·s or more but 1500 mPa·s or less, and most preferably in a range of 700 mPa·s or more but 1400 mPa·s or less.

Hereinafter, a description will be given of a method for firming a patterned solder resist having infrared ray shielding properties using the polymerizable composition of the present invention. Herein, there will be exemplified a case of forming a photosensitive layer (polymerizable composition layer) using the polymerizable composition.

—Photosensitive Layer—

To form a patterned solder resist (solder resist pattern), first a photosensitive layer is formed by using the polymerizable composition of the present invention. The photosensitive layer is not specifically restricted as long as it is a layer formed by including the polymerizable composition. Film thickness, lamination structure, and the like can be appropriately selected according to the purpose.

As the method for forming the photosensitive layer, there may be mentioned a method in which a coating liquid is prepared by dissolving, emulsifying, or dispersing the polymerizable composition of the present invention in water or a solvent, and directly applied on a substrate and then dried.

The solvent for preparing the coating liquid is not specifically restricted and can be appropriately selected according to the purpose as long as it can uniformly dissolve or disperse each component of the polymerizable composition of the present invention. Examples of the solvent include alcohols such as methanol, ethanol, normal-propanol, isopropanol, normal-butanol, secondary-butanol, and normal-hexanol; ketones such as acetone, methyl ethyl ketone, methyl isobutyl ketone, cyclohexanone, diisobutyl ketone, cyclohexanone, and cyclopentanone; esters such as ethyl acetate, butyl acetate, normal-amyl acetate, methyl sulfate, ethyl propionate, dimethyl phthalate, ethyl benzoate, propylene glycol monomethyl ether acetate, and methoxypropyl acetate; aromatic hydrocarbons such as toluene, xylene, benzene, and ethylbenzene; halogenated hydrocarbons such as carbon tetrachloride, trichloroethylene, chloroform, 1,1,1-trichloroethane, methylene chloride, and monochlorobenzene; ethers such as tetrahydrofuran, diethyl ether, ethylene glycol monomethyl ether, ethylene glycol monoethyl ether, 1-methoxy-2-propanol, and propylene glycol monomethyl ether; dimethylformamide, dimethylacetoamide, dimethylsulfoxide, and sulfolane. These solvents may be used alone or in combination of two or more thereof. In addition, a known surfactant may be added.

The method for applying the coating liquid on a support is not specifically restricted and can be appropriately selected according to the purpose. Examples of the method therefor include a method for applying using a spin coater, a slit spin coater, a roll coater, a die coater, or a curtain coater.

Conditions for drying the coated film vary in accordance with each component, the kind of the solvent, the percentage of use thereof, and the like, but usually drying is performed at a temperature of 60 to 150° C. for about 30 seconds to 15 minutes.

The thickness of the photosensitive layer is not specifically restricted and can be appropriately selected according to the purpose. However, considering infrared ray shielding properties and function of solder resist, the thickness thereof is, for example, preferably 1 to 100 μm, more preferably 2 to 50 μm, and particularly preferably 4 to 30 μm.

(Solder Resist Pattern Forming Method)

The method for forming a solder resist permanent pattern using the polymerizable composition for a solder resist of the present invention includes at least an exposure step, and, usually, further includes a developing step in which conditions are appropriately selected as needed, and other step(s). In the present invention, the term "exposure" is used to mean that it encompasses irradiation of not only light with various wavelengths but also electron beam, i ray, or the like.

<Exposure Step>

The exposure step is a step of exposing the photosensitive layer formed using the polymerizable composition layer through a mask, and at this step, only a light-irradiated region is cured.

The exposure is preferably performed by applying a radiation. As radiations usable for exposure, particularly preferably used are electron beam, UV light such as KrF, ArF, g ray, h ray, and i ray, and visible light. Preferred are KrF, g ray, h ray, and i ray.

Examples of exposure system include stepper exposure and exposure with a high-pressure mercury-vapor lamp.

An exposure dose is preferably 5 to 3000 mJ/cm$^2$, more preferably 10 to 2000 mJ/cm$^2$, and most preferably 50 to 1000 mJ/cm$^2$.

<Other Steps>

The other steps are not specifically restricted and can be appropriately selected according to the purpose. For example, there may be mentioned a substrate surface treatment step, a development step, a curing treatment step, and a post-exposure step.

<Development Step>

Following the exposure step, an alkali development treatment (development step) is performed to elute a non-light-irradiated portion in the exposure step in an alkali solution. Thereby, only a portion cured by light is left to form a patterned solder resist having light shielding properties.

A desirable developer is an organic alkali developer that does not cause any damage to underlying circuits and the like. Development temperature is usually 20 to 40° C., and development time is 10 to 180 seconds.

Examples of alkali used for the developer include sodium hydroxide, potassium hydroxide, sodium carbonate, sodium hydrogen carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, and 1,8-diazabicyclo-[5.4.0]-7-undecene. Among them, an organic alkaline compound is diluted with pure water such that a concentration thereof is 0.001 to 10% by mass, and preferably 0.01 to 1% by mass to obtain an aqueous alkaline solution used as a developer. When using the developer made of such an aqueous alkaline solution, generally, washing (rinsing) with pure water is performed after development.

<Curing Treatment Step>

The curing treatment step is a step of performing curing on a photosensitive layer of a formed pattern, as needed, after the development step. Performing this treatment improves mechanical strength of the permanent patter.

The curing treatment step is not specifically restricted and can be appropriately selected according to the purpose. Suitable examples of the curing treatment include an entire-surface exposure treatment and an entire-surface heating treatment.

As the entire-surface exposure treatment method is, for example, there may be mentioned a method of exposing the entire surface of a laminate with the formed patterned photosensitive layer after the development step. The entire-surface exposure accelerates curing of the polymerizable components in the polymerizable composition forming the photosensitive layer, whereby curing of the permanent pattern is further proceeded to improve the mechanical strength and durability.

The apparatus for performing the entire-surface exposure is not specifically restricted and can be appropriately selected according to the purpose. As a suitable example, there may be mentioned a UV exposure apparatus such as an ultra-high pressure mercury vapor lamp.

In addition, as the method for the entire-surface heating treatment, there may be mentioned a method of heating the entire surface of the laminate having the formed patterned photosensitive layer after the development step. The entire-surface heating increases the film strength of the pattern.

Heating temperature in the entire-surface heating is preferably 120 to 250° C., and more preferably 120 to 250° C. When the heating temperature is 120-C or higher, beating treatment increases the film strength, and when the temperature is 250° C. or lower, it can be prevented that decomposition of resin in the polymerizable composition occurs and thereby film quality becomes weak and brittle.

Heating time in the entire-surface heating is preferably 3 to 180 minutes, and more preferably 5 to 120 minutes.

The apparatus for performing the entire-surface heating is not specifically restricted and can be appropriately selected from known apparatuses according to the purpose. For example, there may be mentioned a dry oven, a hot plate, and an IR heater.

The patterned resist thus formed has excellent infrared ray shielding properties and therefore is widely applied. The polymerizable composition for a solder resist of the present invention has excellence in shielding properties in infrared region and light transmission properties in the region of UV to visible light. Accordingly, a high resolution pattern is formed, as well as the formed pattern (cured film) has excellent infrared ray shielding properties, and thus the composition is useful for forming a solder resist for devices with a photodiode having a sensitivity up to the infrared region, particularly for solid state image sensors.

EXAMPLES

Hereinafter, Examples of the present invention will be described, although the present invention is not restricted to the Examples by any means. Unless otherwise specified, "part(s)" and "%" are based on mass.

<Preparation of Titanium Black Dispersion Liquid A>

Components of the following formulation 1 were kneaded by a kneader for 30 minutes and then, subjected to high viscosity dispersion treatment by twin rolls to obtain a dispersion product. At that time, the dispersion product had a viscosity of 40000 mPa·s.

(Formulation 1)

Titanium black 13M-C having an average primary particle diameter of 75 nm (manufactured by Mitsubishi Materials Corporation) (Pigment Black 35): 40 parts Propylene glycol monomethyl ether acetate (solvent: hereinafter may be referred to as PGMEA) solution of Exemplary Compound 13 (Mw: 20000) (solid content: 40%): 12 parts To the obtained dispersion product, a mixture of the following formulation 2 was added and the mixture solution was stirred in a homogenizer under the conditions of 3000 rpm for 3 hours. The obtained mixture solution was subjected to fine dispersion treatment for 4 hours by a disperser (trade name: DISPERMAT manufactured by Getzmann GmbH) using zirconia beads having a diameter of 0.3 mm to obtain a titanium black dispersion liquid A (hereinafter referred to as "TB dispersion liquid A").

At that time, the viscosity of the mixture solution was 7.0 mPa·s.

(Formulation 2)

PGMEA solution (solid content 40%) of Exemplary Compound 13 (Mw: 20000): 6 parts Propylene glycol monomethyl ether acetate: 200 parts <Preparation of Titanium Black Dispersion Liquid B>

Components of the following formulation 3 were kneaded by a kneader for 30 minutes and then, subjected to high viscosity dispersion treatment by twin rolls to obtain a dispersion product. At that time, the dispersion product had a viscosity of 40000 mPa·s.

(Formulation 3)

Titanium black 13M-C having an average primary particle diameter of 75 nm (manufactured by Mitsubishi Materials Corporation), (Pigment Black 35): 39 parts PGMEA solution (solid content 40%) of an allyl meth acrylate/meth acrylic acid copolymer (allyl methacrylate/methacrylic acid=70/30 (mass ratio), Mw: 25000): 8 parts SOLSPERSE 5000 (manufactured by the Lubrizol Corporation): 1 part To the obtained dispersion product, a mixture of the following formulation 4 was added and the mixture solution was stirred in the homogenizer under the conditions of 3000 rpm for 3 hours. The obtained mixture solution was subjected to fine dispersion treatment for 4 hours by the disperser (trade name: DISPERMAT manufactured by Getzmann GmbH) using zirconia beads having the diameter of 0.3 mm to obtain a titanium black dispersion liquid B (hereinafter referred to as "TB dispersion liquid B").

At that time, the viscosity of the mixture solution was 7.0 mPa·s.

(Formulation 4)

PGMEA solution (solid content 40%) of the allyl methacrylate/methacrylic acid copolymer (allyl methacrylate/methacrylic acid=70/30 (mass ratio), Mw: 25000): 8 parts Propylene glycol monomethyl ether acetate: 200 parts <Preparation of Carbon Black Dispersion Liquid A>

The following formulation 5 was subjected to high viscosity dispersion treatment by twin rolls to obtain a dispersion product. At that time, the dispersion product had a viscosity of 70000 mPa·s.

Then, to the obtained dispersion product, a mixture of the following formulation 6 was added and the mixture product was stirred in the homogenizer under the conditions of 3000 rpm for 3 hours. The obtained mixture solution was subjected to fine dispersion treatment for 4 hours by the disperser (trade name: DISPERMAT manufactured by Getzmann GmbH) using zirconia beads having the diameter of 0.3 mm to obtain a carbon black dispersion liquid A (hereinafter referred to as "CB dispersion liquid A").

At that time, the viscosity of the mixture solution was 37 mPa·s.

(Formulation 5)

Carbon black having an average primary particle diameter of 15 nm (Pigment Black 7): 23 parts PGMEA 45% solution of benzyl methacrylate/methacrylic acid copolymer (benzyl methacrylate/methacrylic acid=67/33 (mass ratio), Mw: 2800): 22 parts SOLSPERSE 5000 (manufactured by the Lubrizol Corporation): 1.2 parts (Formulation 6)

PGMEA 45% solution of benzyl methacrylate/methacrylic acid copolymer (benzyl methacrylate/methacrylic acid=67/33 (mass ratio), Mw: 28000): 22 parts Propylene glycol monomethyl ether acetate: 200 parts Synthesis of Specific Resin 1

In a reaction container, 800 parts of cyclohexane were placed, and while injecting nitrogen gas into the container, the container was heated to 100° C. At the same temperature, a mixture of 60.0 parts of styrene, 80.0 parts of methacrylic acid, 68.0 parts of methyl methacrylate, 62.0 parts of butyl methacrylate, and 9.0 parts of azobisisobutyronitrile was dropped in 1 hour to perform polymerization reaction. After the dropping, additionally, the reaction product was allowed to react at 100° C. for 3 hours. Then, a solution obtained by dissolving 2.0 parts of azobisisobutyronitrile in 50 parts of cyclohexanone was added to the reaction product. Reaction was furthermore continued at 100° C. for 1 hour to obtain a solution of acrylic resin 1 having a weight-average molecular weight of about 30000 and a content of 3.44 mmol/g.

After cooling it down to room temperature, about 2 g of the resin solution was sampled, heated and dried at 180° C. for 20 minutes to measure non-volatile matter. Next, cyclohexanone was added to the previously synthesized resin solution such that the non-volatile matter was 20% by mass, whereby a solution of specific resin 1 was prepared.

Synthesis of Specific Resin 2

To the solution of acrylic resin 1 were added 10 parts of glycidyl methacrylate and 1 part of tetraethyl ammonium bromide, and the mixture solution was stirred at 90° C. for 2 hours to introduce double bond group into a side chain of the resin.

Then, using a reprecipitation method, there was obtained a solid of specific resin 2 (corresponding to the specific binder resin A) having a weight average molecular weight of about 32000 and a content of double bond group of 3.1 mmol/g.

After that, in the same manner as the synthesis of the specific resin 1, the amount of the solvent was adjusted such that the non-volatile matter was 20% by mass, whereby a solution of specific resin 2 was prepared.

Examples 1 to 4 and Comparative Examples 1 and 2

Components of the following polymerizable composition solution A were mixed together and filtered by the following filters to prepare polymerizable compositions of Examples 1 to 4 and Comparative Examples 1 and 2.

Filters for filtering: As a first filter, PROFILE STAR (polypropylene; filter rating 1.5 µm) manufactured by Pall Corporation was used, and as a second filter, HDCII (high-density polypropylene; filter rating 6.0 µm) manufactured by Pall Corporation was used.

Formulation of Polymerizable Composition Solution A

Silica dispersion liquid of the following formulation: 79.94 parts

Infrared ray shielding material (compounds shown in Table 1 below): (amounts shown in Table 1 below)

Polymerizable compound (compounds shown ii Table 1 below): 20.00 parts

Specific resin 2 (obtained by the above synthesis method): 37.50 parts

30% methylethyl ketone solution of MEGAFAC F-780 (manufactured by DIC Corporation): 0.15 parts Bisphenol A diglycidyl ether: 10.93 parts Polymerization initiator (compounds shown in Table 1 below): 0.90 parts Solvent (PGMEA): 20.0 parts —Silica Dispersion Liquid—

Filler 1 (SC-2500-SMJ; spherical silica, methacryl silane treatment 1%; primary particles' volume average particle diameter 0.5 µn, manufactured by Admatex Co., Ltd): 16.99 parts Solution of specific resin 2 (concentration: 20%): 62.75 parts Dicyandiamide (curing accelerator): 0.20 parts

TABLE 1

| | Infrared ray shielding material | Polymerizable compound | Polymerization initiator |
|---|---|---|---|
| Example 1 | Titanium black dispersion liquid A 12.0 parts | M-1 | I-1 |
| Example 2 | Titanium black dispersion liquid A 12.0 parts | M-1 | I-2 |

TABLE 1-continued

| | Infrared ray shielding material | Polymerizable compound | Polymerization initiator |
|---|---|---|---|
| Example 3 | Titanium black dispersion liquid B 12.0 parts | M-2 | I-3 |
| Example 4 | Titanium black dispersion liquid B 12.0 parts | M-1 | I-1 |
| Comparative Example 1 | Carbon black dispersion liquid B 12.0 parts | M-1 | I-1 |
| Comparative Example 2 | Carbon black dispersion liquid B 20.0 parts | M-1 | I-1 |

Details of the polymerizable compounds and the polymerization initiators shown in Table 1 above are as follows:
(Polymerizable Compound)
M-1: Dipentaerythritol hexaacrylate (DPHA)
M-2: Succinic acid-modified pentaerythritol triacrylate

| Polymerization initiator | Structure |
|---|---|
| Compound I-1 | IRGACURE OXE01 (manufactured by BASF Japan Co. Ltd.) |
| Compound I-2 | IRGACURE OXE02 (manufactured by BASF Japan Co. Ltd.) |
| Compound I-3 | IRGACURE 379 (manufactured by BASF Japan Co. Ltd.) |

The viscosity of the dispersion product subjected to high-viscosity dispersion treatment by twin rolls was measured at 25° C. using RE 550H Model manufactured by Toki Sangyo Co., Ltd.

In addition, the viscosity of the dispersion liquid subjected to fine dispersion treatment by the disperser (trade name: DISPERMAT manufactured by Getzmann GmbH) was measured at 25° C. using the RE 550H Model manufactured by Toki Sangyo Co., Ltd.

Transmittance was measured using UV-3600 model manufactured by Shimadzu Corporation.

<Evaluation of Polymerizable Composition for Solder Resist>

The obtained polymerizable compositions of Examples 1 to 4 and Comparative Examples 1 and 2 were each applied on a silicon wafer by spin coating so as to have a film thickness of 25 μm. Then, the wafer was heated on a hot plate at 120° C. for 2 minutes to obtain a polymerizable composition layer.

Next, the obtained polymerizable composition layer was irradiated through a photomask having a pattern of 300 μm using an i ray stepper while changing an exposure dose ranging from 50 to 2000 mJ/cm$^2$ at intervals of 50 mJ/cm$^2$.

The polymerization composition layer after the exposure was subjected to puddle development using a 2.38% by mass aqueous solution of tetramethylammonium hydroxide at 25° C. for 60 seconds, rinsed by spin shower, and additionally washed with pure water to obtain a solder resist pattern having infrared ray shielding properties. A minimum exposure dose at which a circular pattern with a diameter of 300 μm was obtained at the development step for 60 seconds was measured as an index of pattern formability. It is evaluated that as the value is smaller, sensitivity and pattern formability are better.

In addition, under the same conditions, the polymerizable composition was applied on a glass substrate by spin coating to form a coated film of a photosensitive layer (a polymerizable composition layer) having a film thickness of 25 μm. Then, transmittance of the coated film at a wavelength of 1200 nm was measured. It is evaluated that as the value is lower, infrared ray shielding properties are higher. It can be said that a transmittance of 2% or lower indicates practically favorable infrared ray shielding properties.

TABLE 2

|  | Infrared ray shielding properties (1200 nm transmittance) | Exposure dose in pattern formation (mJ/cm$^2$) |
| --- | --- | --- |
| Example 1 | 1% or lower | 200 |
| Example 2 | 1% or lower | 200 |
| Example 3 | 1% or lower | 300 |
| Example 4 | 1% or lower | 200 |
| Comparative Example 1 | 3.5% | 800 |
| Comparative Example 2 | 2% | 1200 |

The results of Table 2 show that according to the polymerizable compositions for a solder resist of the present invention, minute patterns are formed with high sensitivity and infrared ray shielding properties of coated films are excellent. In addition, in Comparative Examples 1 and 2 using carbon black as a black organic pigment instead of the infrared ray shielding material, it is shown that although some degrees of infrared ray shielding properties are shown, pattern formability is lower. This seems to be due to low light transmittance in the region of UV to visible light.

Examples 5 to 10 and Comparative Examples 3 and 4

Formulation of Polymerizable Composition Solution B

Binder (ZAR-2039H manufactured by Nippon Kayaku Co. Ltd.; solid content concentration 60%; bisphenol A-type epoxy acrylate): 35.6 parts Polymerizable Compound (DPHA manufactured by Nippon Kayaku Co. Ltd.): 2.57 parts Thermal crosslinking agent (EPOTOTO YDF-170 manufactured by Toto Kasei Co., Ltd., bisphenol F-type epoxy resin): 3.95 parts Thermal crosslinking agent (melamine, manufactured by Wako Pure Chemical Industries, Ltd.): 1.38 parts Polymerization initiator (IRGACURE-907 manufactured by BASF Japan Co., Ltd.): 0.97 parts Sensitizer (diethylthioxanthone): 0.009 parts Elastomer (ESPEL 1620 manufactured by Hitachi Chemical Co., Ltd.): 32.48 parts Infrared ray shielding material (compounds shown in Table 3 below): (amounts shown in Table 0.3 below)

30% methylethyl ketone solution of MEGAFAC F-780 (manufactured by DIC Corporation): 0.15 parts PGMEA (solvent): 22.90 parts Cyclohexanone (solvent): 10.00 parts

TABLE 3

|  | Infrared ray shielding material | Polymerizable compound | Polymerization initiator |
| --- | --- | --- | --- |
| Example 5 | Titanium black dispersion liquid A 8.0 parts | M-1 | I-1 |
| Example 6 | Titanium black dispersion liquid B 8.0 parts | M-1 | I-2 |
| Example 7 | Titanium black dispersion liquid A 8.0 parts | M-1 | I-3 |
| Example 8 | Titanium black dispersion liquid B 8.0 parts | M-2 | I-1 |
| Example 9 | Infrared ray shielding material 1 3 parts Infrared ray shielding material 2 1 part | M-2 | I-3 |
| Example 10 | Infrared ray shielding material 3 1.5 parts Infrared ray shielding material 4 1.5 parts Infrared ray shielding material 5 1.5 parts | M-1 | I-1 |
| Comparative Example 3 | Carbon black dispersion liquid B 8.0 parts | M-1 | I-1 |
| Comparative Example 4 | Carbon black dispersion liquid B 12.0 parts | M-1 | I-1 |

Details of the infrared ray shielding materials shown in Table 3 above are as follows:
Infrared ray shielding material 1: ADS1120P (pyrylium dye): manufactured by American Dye Source, Inc.
Infrared ray shielding material 2: ADS 840MT (quinolinium dye): manufactured by American Dye Source, Inc.
Infrared ray shielding material 3: PA-1001 (phthalocyanine dye) manufactured by Yamamoto Chemicals Inc.
Infrared ray shielding material 4: SIR-132 (phthalocyanine dye) manufactured by Yamamoto Chemicals Inc.
Infrared ray shielding material 5: YKR-3040 (phthalocyanine dye) manufactured by Yamamoto Chemicals Inc.

The polymerizable compositions for a solder resist of Examples 5 to 10 and Comparative Examples 3 and 4 thus prepared were evaluated in the same manner as Example 1. Table 4 below shows the results.

TABLE 4

|  | Infrared ray shielding properties (1200 nm transmittance) | Exposure dose in pattern formation (mJ/cm$^2$) |
| --- | --- | --- |
| Example 5 | 1% or lower | 300 |
| Example 6 | 1% or lower | 250 |
| Example 7 | 1% or lower | 400 |
| Example 8 | 1% or lower | 300 |
| Example 9 | 1% or lower | 400 |
| Example 10 | 1% or lower | 400 |
| Comparative Example 3 | 3.6% | 1000 |
| Comparative Example 4 | 2% | 1500 |

The results of Table 4 show that according to the polymerizable compositions for a solder resist of the present invention, even in the case of using infrared ray absorbing dyes, minute patterns are formed with high sensitivity and the infrared ray shielding properties of coated films are excellent in the same manner as in those using titanium black as the infrared ray shielding material. Meanwhile, in Comparative Examples 3 and 4 using carbon black as a black pigment instead of infrared ray shielding material, it is shown that although some degrees of infrared ray shielding properties are shown, pattern formability is lower. This seems to be due to low light transmittance in the region of UV to visible light.

Examples 11 to 15 and Comparative Examples 3 and 4

Synthesis of Specific Resin 3

Into a 1,000-ml three-neck flask, 159 g of 1-methoxy-2-propanol was placed and heated to 85° C. under nitrogen gas flow. A solution of 63.4 g of benzylmethacrylate, 72.3 g of methacrylic acid, and 4.15 g of V-601 (polymerization initiator manufactured by Wako Pure Chemical, Industries, Ltd.) in 159 g of 1-methoxy-2-propanol was dropped thereto in 2 hours. After finishing dropping, the mixture solution was heated for additional 5 hours to allow it to react.

Next, heating was stopped to obtain a copolymer of benzylmethacrylate/methacrylic acid (30/70 mol % ratio).

Then, 120.0 g of the above copolymer solution was transferred to a 300-mL three-neck flask. In the flask, 16.6 g of glycidyl methacrylate and 0.16 g of p-methoxyphenol were added and stirred to be dissolved therein. After the dissolution thereof, 3.0 g of triphenylphosphine was added, and the mixture was heated to 100° C. to perform addition reaction. Heating was stopped after confirming the disappearance of glycidyl methacrylate by gas chromatography.

Into the reaction product was added 38 g of 1-methoxy-2-propanol to prepare a solution of specific resin 3 having an acid value of 112 mgKOH/g, a weight average molecular weight of 24,000, and a solid content of 46%.

Formulation of Polymerizable Composition Solution C

The solution of specific resin 3: 45.0 parts
Infrared ray shielding material (compounds and a dispersion product shown in Table 5 below): (amounts shown in Table 5 below)
Dipentaerythritol hexaacrylate (trade name: KAYARAD DPHA manufactured by Nippon Kayaku Co. Ltd.): 10.7 parts
Polymerization initiator (IRGACURE OXE 02 manufactured by BASF Japan Co. Ltd.): 1.50 parts
Epoxy resin (EPOTOTO YDF-170 manufactured by Toto Kasei Co., Ltd., bisphenol F-type): 5.00 parts
Pigment dispersion liquid below: 35.7 parts
30% methylethyl ketone solution of MEGAFAC F-780 (manufactured by DIC Corporation): 0.13 parts
Methylethyl ketone: 12.0 parts
—Preparation of Pigment Dispersion Liquid—
After mixing, in advance, 30 parts of silica (SO-C2 manufactured by Admatex Co., Ltd), 48.2 parts of the solution of specific resin 3, 0.51 parts of phthalocyanine blue (C.I. Pigment Blue 15:3), 0.14 parts of an anthraquinone-based yellow pigment (C.I. Pigment Yellow 24), 0.37 parts of dicyandiamide, and 59.0 parts of n-propyl acetate, the mixture was subjected to dispersion by a motor mill M-250 (manufactured by Eiger Co. Ltd) using zirconia beads having a diameter of 1.0 mm at a peripheral velocity of 9 m/s for 3 hours.

TABLE 5

|  | Infrared ray shielding material | Polymerizable compound | Polymerization initiator |
| --- | --- | --- | --- |
| Example 11 | Titanium black dispersion liquid A 12.0 parts | M-1 | I-1 |
| Example 12 | Infrared ray shielding material 1 3 parts Infrared ray shielding material 2 1 part | M-1 | I-1 |
| Example 13 | Infrared ray shielding material 3 1.5 parts Infrared ray shielding material 4 1.5 parts Infrared ray shielding material 5 1.5 parts | M-1 | I-1 |
| Example 14 | Infrared ray shielding material 6 1 part | M-1 | I-1 |
| Example 15 | Infrared ray shielding material 7 1 part | M-1 | I-1 |

In addition, "titanium black dispersion liquid A" in Table 5 above is the same one as that used in Example 1, and the infrared ray shielding materials 1 to 5 are the above-mentioned compounds.

Infrared ray shielding material 6: a cyanine dye having the following structure exemplified as compound 16 in JP-A-11-109126

Infrared ray shielding material 7: IR-910 (phthalocyanine dye) manufactured by Nippon Syokubai Co. Ltd.

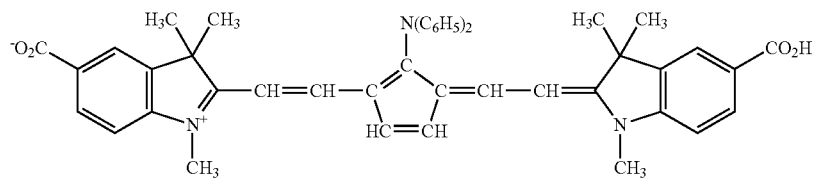

Infrared Ray Shielding Material 6

The polymerizable compositions for a solder resist of Examples 11 to 15 thus prepared were evaluated in the same manner as Example 1. Table 6 below shows the results.

TABLE 6

|  | Infrared ray shielding properties (1200 nm transmittance) | Exposure dose in pattern formation (mJ/cm²) |
| --- | --- | --- |
| Example 11 | 1% or lower | 300 |
| Example 12 | 1% or lower | 400 |
| Example 13 | 1% or lower | 400 |
| Example 14 | 1% or lower | 300 |
| Example 15 | 1% or lower | 300 |
| Example 16 | 1% or lower | 400 |
| Example 17 | 1% or lower | 400 |

The results of Table 6 show that according to the polymerizable compositions for a solder resist of the present invention (Examples 11 to 15), minute patterns are formed with high sensitivity and infrared ray shielding properties of coated films are excellent not only in the case of using titanium black as the infrared ray shielding material but also in the cases of using the infrared ray absorbing dyes other than the metal-containing inorganic pigment.

Example 16

Synthesis of Binder Polymer B (Polyamic Acid 1 as Polyimide Resin Precursor) Corresponding to Specific Binder Resin B <Synthesis of Polyamic Acid 1>

In a 1000-ml four-necked flask equipped with a thermometer, a stirrer, a raw material feeding nozzle, and a nitrogen gas introducing tube, DPM (4,4'-diaminodiphenylmethane: 24.454 g) and dry NMP (436.86 ml) were placed and dissolved while stirring under a dry nitrogen stream. PMDA (pyromellitic acid dianhydride: 13.451 g) and CBDA (cyclobutane tetracarboxylic acid dianhydride: 12.095 g) were added to react for 24 hours, while maintaining a temperature of the reaction system in a range of 70° C., whereby an NMP solution of polyamic acid 1 was obtained. The obtained polyamic acid had a molecular weight by GPC of 75,000.

Polymerizable Composition Solution D

A polymerizable composition solution D of Example 16 was prepared in the same manner as Example 11, except that the solution of specific resin 3 used in the polymerizable composition solution C was replaced by the solution of the binder polymer B.

Example 17

Synthesis of Binder Polymer C (Alkali-Soluble Photocrosslinkable Polyurethane Resin) Corresponding to Specific Binder Resin C In a 500-ml three-necked flask, 50.1 g of 4,4'-diphenylmethane diisocyanate, 68.7 g of polyoxytetramethylene glycol (molecular weight: 981), and 17.4 g of 2,2-bis(hydroxymethyl)propionic acid were dissolved in 90 ml of dioxane. After adding 0.3 g of N,N-diethylaniline, the mixture was stirred for 6 hours under reflux of dioxane to obtain a polyurethane resin solution having a carboxyl group.

After termination of reaction, under a mixture stream of 7% by volume of oxygen and 93% by volume of nitrogen, 3.84 g of glycidyl acrylate, 0.11 g of triphenyl phosphine, and 0.027 g of hydroquinone monomethylether were added to be reacted at 100° C. for 10 hours to obtain a solution of binder polymer C.

A solid content of the above-obtained binder polymer C had an acid value of 40 mgKOH/g, and a bromine value of 3.4 gBr$_2$/100 g. The molecular weight of the solid content measured by a GPC apparatus was 32,000 in mass average (polystyrene standard).

The acid value was measured based on JIS K0070. However, when the sample was not dissolved, a solvent such as dioxane or tetrahydrofuran (THF) was used.

The bromine value was measured based on JIS K2605.

The mass average molecular weight was measured using a high-speed GPC apparatus (HLC-802A manufactured by Toyo Soda Manufacturing Co. Ltd). Specifically, using a 0.5% by mass THF solution as a sample solution and using TSKgelGMH columns, 200 μl of the sample was injected and eluted with the THF solution to perform measurement by a refractometer at 25° C. Next, the mass average molecular weight was calculated from the molecular weight distribution curve calibrated using the standard polystyrene.

Polymerizable Composition Solution E

A polymerizable composition solution E of Example 17 was prepared in the same manner as Example 11, except that the solution of specific resin 3 used in the polymerizable composition solution C was replaced by the solution of the binder polymer C.

The prepared polymerizable compositions of Example 16 and Example 17 were evaluated in the same manner as Example 1. Table 6 above shows the results together.

As seen in Table 6, it is understood that even in the cases of using the polyimide resin corresponding to specific binder resin B and the polyurethane resin corresponding to specific binder resin C, the polymerizable compositions for a solder resist of the present invention have excellence in infrared ray shielding properties and pattern formability.

The invention claimed is:
1. A polymerizable composition for a solder resist, comprising an infrared ray shielding material, a polymerization initiator having photosensitivity in a range of UV to visible light, and a polymerizable compound,
wherein the infrared ray shielding material is at least one infrared ray absorbing dye selected from a phthalocyanine dye, a naphthalocyanine dye, a dye represented by the following general formula (I), a dye represented by the following general formula (II), or a dye represented by the following general formula (III):

General Formula (I)

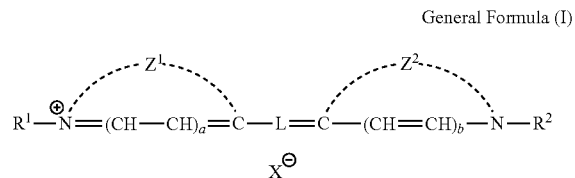

wherein each of $Z^1$ and $Z^2$ independently represents a non-metal atomic group forming a five- or six-membered nitrogen-containing heterocyclic ring that may be a condensed ring; each of $R^1$ and $R^2$ independently represents an alkyl group, an alkenyl group, or an aralkyl group; L is a linking group including a structure in which 5 to 9 methine groups are linked by conjugated double bonds; a and b each are 0 or 1; and X represents a counter anion;

General Formula (II)

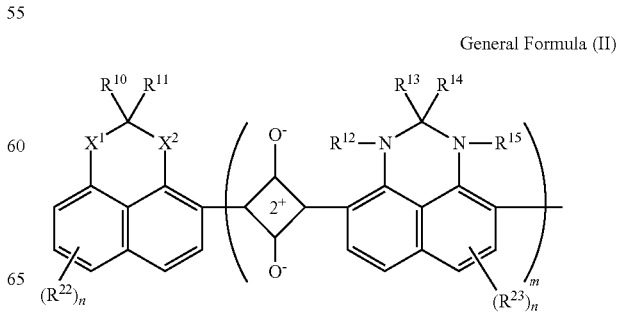

-continued

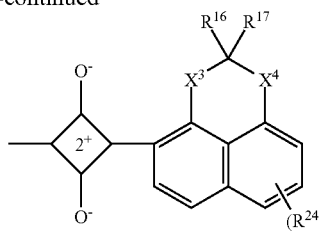

wherein each of $R^{10}$, $R^{11}$, $R^{12}$, $R^{13}$, $R^{14}$, $R^{15}$, $R^{16}$, and $R^{17}$ independently represents a hydrogen atom, an alkyl group, a cycloalkyl group, an aryl group, an aralkyl group, or a heterocyclic group; one or more pairs of $R^{10}$ and $R^{11}$, $R^{12}$ and $R^{13}$, $R^{14}$ and $R^{15}$, and $R^{16}$ and $R^{17}$ may be bonded to each other to form a five- or six-membered ring structure; $X^1$ represents an oxygen atom or —$NR^{18}$; $X^2$ represents an oxygen atom or —$NR^{19}$; $X^3$ represents an oxygen atom or —$NR^{20}$; $X^4$ represents an oxygen atom or —$NR^{21}$; $R^{18}$, $R^{19}$, $R^{20}$, and $R^{21}$ each independently represents a hydrogen atom, a linear or branched alkyl group, a cycloalkyl group, an aryl group, an aralkyl group, or a heterocyclic group; one or more pairs of $R^{18}$ and $R^{10}$, $R^{19}$ and $R^{11}$, $R^{20}$ and $R^{16}$, and $R^{21}$ and $R^{17}$ may be bonded to each other to form a five- or six-membered ring structure; $R^{22}$, $R^{23}$, and $R^{24}$ each independently represents a hydrogen atom or a monovalent group; n represents an integer of 1 to 3; m represents an integer from 0 to 6; and when n represents 2 or 3, a plurality of $R^{22}$s, $R^{23}$s, or $R^{24}$s may be the same as or different from each other;

General Formula (III)

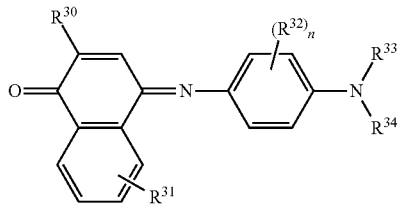

wherein $R^{30}$ represents —$CONHR^{35}$, —$SO_2NHR^{35}$, —$NHSO_2R^{35}$, —$NHCOR^{35}$, —$NHCONHR^{35}$, a hydrogen atom, a halogen atom, a carboxyl group, or a sulfo group; $R^{31}$ represents a hydrogen atom, an alkyl group, —$NHSO_2R^{35}$, or —$NHCOR^{35}$; $R^{35}$ represents an alkyl group, an aryl group, or a heterocyclic group; $R^{32}$ represents a hydrogen atom, an alkyl group, an alkoxy group, a hydroxyl group, an amino group, or a halogen atom; when a plurality of $R^{32}$s are present, they may be the same as or different from each other; n represents an integer from 0 to 3; $R^{33}$ and $R^{34}$ each independently represent an alkyl group, an aryl group, or an aralkyl group; and one or more pairs of $R^{33}$ and $R^{34}$, $R^{32}$ and $R^{33}$, and $R^{32}$ and $R^{34}$ may be bonded to each other to form a five- or six-membered ring structure.

2. The polymerizable composition for a solder resist according to claim 1, wherein the polymerizable compound is one or more selected from the group consisting of radically polymerizable compounds and cationically polymerizable compounds.

3. The polymerizable composition for a solder resist according to claim 1, wherein the polymerizable compound is a polyfunctional polymerizable compound having a plurality of polymerizable groups in a molecule thereof.

4. The polymerizable composition for a solder resist according to claim 1, further comprising a binder polymer.

5. The polymerizable composition for a solder resist according to claim 1, which has a solid content concentration of from 30% by mass to 80% by mass, and a viscosity of from 10 mPa·s to 3000 mPa·s.

6. The polymerizable composition for a solder resist according to claim 1, wherein a cured film having a film thickness of 20 μm formed from the composition has a light transmittance of 10% or less at a wavelength of from 800 to 1200 nm.

7. The polymerizable composition for a solder resist according to claim 1, wherein a cured film having a film thickness of 20 μm formed from the composition has a breakdown voltage of 1 MV/cm or more.

8. A solder resist pattern formation method comprising, in this order: a step of forming a photosensitive layer containing the polymerizable composition for a solder resist according to claim 1 on a substrate;

a step of pattern exposing the photosensitive layer to electron beam, UV light, or visible light to cure an exposed portion; and a step of removing an uncured photosensitive layer by development to form a patterned cured film having an infrared ray shielding property.

9. The polymerizable composition for a solder resist according to claim 1, wherein the polymerization initiator is an oxime ester compound.

10. A polymerizable composition for a solder resist, comprising an infrared ray shielding material, a polymerization initiator, and a polymerizable compound, wherein the infrared ray shielding material is at least one infrared ray absorbing dye selected from a phthalocyanine dye, a naphthalocyanine dye, a dye represented by the following general formula (I), a dye represented by the following general formula (II), or a dye represented by the following general formula (III):

General Formula (I)

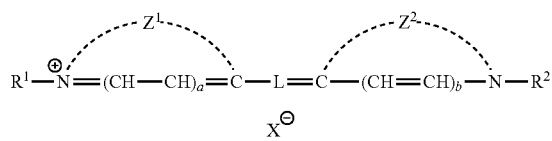

wherein each of $Z^1$ and $Z^2$ independently represents a non-metal atomic group forming a five- or six-membered nitrogen-containing heterocyclic ring that may be a condensed ring; each of $R^1$ and $R^2$ independently represents an alkyl group, an alkenyl group, or an aralkyl group; L is a linking group including a structure in which 5 to 9 methine groups are linked by conjugated double bonds; a and b each are 0 or 1; and X represents a counter anion;

General Formula (II)

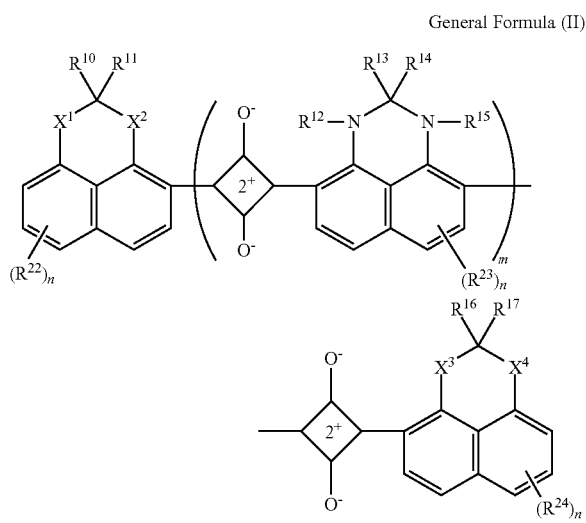

wherein each of $R^{10}$, $R^{11}$, $R^{12}$, $R^{13}$, $R^{14}$, $R^{15}$, $R^{16}$, and $R^{17}$ independently represents a hydrogen atom, an alkyl group, a cycloalkyl group, an aryl group, an aralkyl group, or a heterocyclic group; one or more pairs of $R^{10}$ and $R^{11}$, $R^{12}$ and $R^{13}$, $R^{14}$ and $R^{15}$, and $R^{16}$ and $R^{17}$ may be bonded to each other to form a five- or six-membered ring structure; $X^1$ represents an oxygen atom or —$NR^{18}$; $X^2$ represents an oxygen atom or —$NR^{19}$; $X^3$ represents an oxygen atom or —$NR^{20}$; $X^4$ represents an oxygen atom or —$NR^{21}$; $R^{18}$, $R^{19}$, $R^{20}$, and $R^{21}$ each independently represents a hydrogen atom, a linear or branched alkyl group, a cycloalkyl group, an aryl group, an aralkyl group, or a heterocyclic group; one or more pairs of $R^{18}$ and $R^{10}$, $R^{19}$ and $R^{11}$, $R^{20}$ and $R^{16}$, and $R^{21}$ and $R^{17}$ may be bonded to each other to form a five- or six-membered ring structure; $R^{22}$, $R^{23}$, and $R^{24}$ each independently represents a hydrogen atom or a monovalent group; n represents an integer of 1 to 3; m represents an integer from 0 to 6; and when n represents 2 or 3, a plurality of $R^{22}$s, $R^{23}$s, or $R^{24}$s may be the same as or different from each other;

General Formula (III)

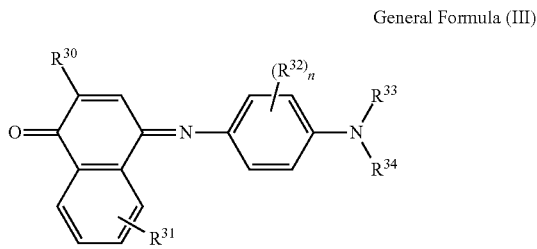

wherein $R^{30}$ represents —$CONHR^{35}$, —$SO_2NHR^{35}$, —$NHSO_2R^{35}$, —$NHCOR^{35}$, —$NHCONHR^{35}$, a hydrogen atom, a halogen atom, a carboxyl group, or a sulfo group; $R^{31}$ represents a hydrogen atom, an alkyl group, —$NHSO_2R^{35}$, or —$NHCOR^{35}$; $R^{35}$ represents an alkyl group, an aryl group, or a heterocyclic group; $R^{32}$ represents a hydrogen atom, an alkyl group, an alkoxy group, a hydroxyl group, an amino group, or a halogen atom; when a plurality of $R^{32}$s are present, they may be the same as or different from each other; n represents an integer from 0 to 3; $R^{33}$ and $R^{34}$ each independently represent an alkyl group, an aryl group, or an aralkyl group; and one or more pairs of $R^{33}$ and $R^{34}$, $R^{32}$ and $R^{33}$, and $R^{32}$ and $R^{34}$ may be bonded to each other to form a five- or six-membered ring structure;

wherein the polymerization initiator is an oxime ester compound.

11. The polymerizable composition for a solder resist according to claim 10, wherein the polymerizable compound is one or more selected from the group consisting of radically polymerizable compounds and cationically polymerizable compounds.

12. The polymerizable composition for a solder resist according to claim 10, wherein the polymerizable compound is a polyfunctional polymerizable compound having a plurality of polymerizable groups in a molecule thereof.

13. The polymerizable composition for a solder resist according to claim 10, further comprising a binder polymer.

14. The polymerizable composition for a solder resist according to claim 10, which has a solid content concentration of from 30% by mass to 80% by mass, and a viscosity of from 10 mPa·s to 3000 mPa·s.

15. The polymerizable composition for a solder resist according to claim 10, wherein a cured film having a film thickness of 20 μm formed from the composition has a light transmittance of 10% or less at a wavelength of from 800 to 1200 nm.

16. The polymerizable composition for a solder resist according to claim 10, wherein a cured film having a film thickness of 20 μm formed from the composition has a breakdown voltage of 1 MV/cm or more.

17. A solder resist pattern formation method comprising, in this order: a step of forming a photosensitive layer containing the polymerizable composition for a solder resist according to claim 10 on a substrate;

a step of pattern exposing the photosensitive layer to electron beam, UV light, or visible light to cure an exposed portion; and a step of removing an uncured photosensitive layer by development to form a patterned cured film having an infrared ray shielding property.

18. A polymerizable composition for a solder resist, comprising an infrared ray shielding material, a polymerization initiator, and a polymerizable compound, wherein the infrared ray shielding material is at least one infrared ray absorbing dye selected from a dye represented by the following general formula (II) or a dye represented by the following general formula (III):

General Formula (II)

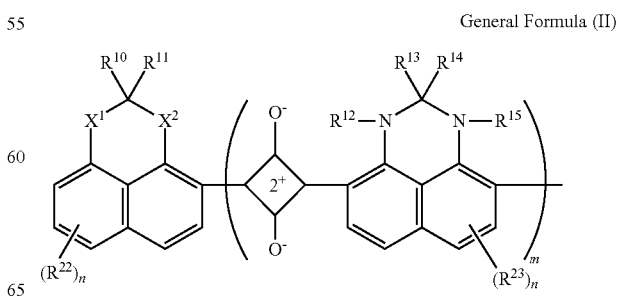

-continued

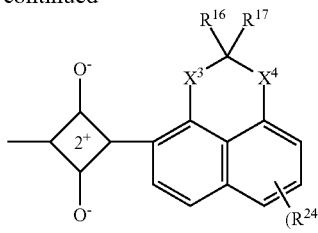

wherein each of $R^{10}$, $R^{11}$, $R^{12}$, $R^{13}$, $R^{14}$, $R^{15}$, $R^{16}$, and $R^{17}$ independently represents a hydrogen atom, an alkyl group, a cycloalkyl group, an aryl group, an aralkyl group, or a heterocyclic group; one or more pairs of $R^{10}$ and $R^{11}$, $R^{12}$ and $R^{13}$, $R^{14}$ and $R^{15}$, and $R^{16}$ and $R^{17}$ may be bonded to each other to form a five- or six-membered ring structure; $X^1$ represents an oxygen atom or —$NR^{18}$; $X^2$ represents an oxygen atom or —$NR^{19}$; $X^3$ represents an oxygen atom or —$NR^{20}$; $X^4$ represents an oxygen atom or —$NR^{21}$; $R^{18}$, $R^{19}$, $R^{20}$, and $R^{21}$ each independently represents a hydrogen atom, a linear or branched alkyl group, a cycloalkyl group, an aryl group, an aralkyl group, or a heterocyclic group; one or more pairs of $R^{18}$ and $R^{10}$, $R^{19}$ and $R^{11}$, $R^{20}$ and $R^{16}$, and $R^{21}$ and $R^{17}$ may be bonded to each other to form a five- or six-membered ring structure; $R^{22}$, $R^{23}$, and $R^{24}$ each independently represents a hydrogen atom or a monovalent group; n represents an integer of 1 to 3; m represents an integer from 0 to 6; and when n represents 2 or 3, a plurality of $R^{22}$s, $R^{23}$s, or $R^{24}$s may be the same as or different from each other;

General Formula (III)

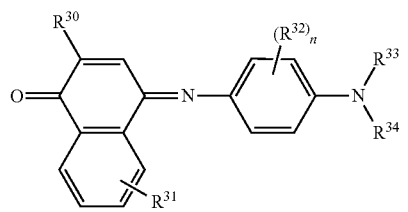

wherein $R^{30}$ represents —$CONHR^{35}$, —$SO_2NHR^{35}$, —$NHSO_2R^{35}$, —$NHCOR^{35}$, —$NHCONHR^{35}$, a hydrogen atom, a halogen atom, a carboxyl group, or a sulfo group; $R^{31}$ represents a hydrogen atom, an alkyl group, —$NHSO_2R^{35}$, or —$NHCOR^{35}$; $R^{35}$ represents an alkyl group, an aryl group, or a heterocyclic group; $R^{32}$ represents a hydrogen atom, an alkyl group, an alkoxy group, a hydroxyl group, an amino group, or a halogen atom; when a plurality of $R^{32}$s are present, they may be the same as or different from each other; n represents an integer from 0 to 3; $R^{33}$ and $R^{34}$ each independently represent an alkyl group, an aryl group, or an aralkyl group; and one or more pairs of $R^{33}$ and $R^{34}$, $R^{32}$ and $R^{33}$, and $R^{32}$ and $R^{34}$ may be bonded to each other to form a five- or six-membered ring structure.

19. The polymerizable composition for a solder resist according to claim 18, wherein the polymerizable compound is one or more selected from the group consisting of radically polymerizable compounds and cationically polymerizable compounds.

20. The polymerizable composition for a solder resist according to claim 18, wherein the polymerizable compound is a polyfunctional polymerizable compound having a plurality of polymerizable groups in a molecule thereof.

21. The polymerizable composition for a solder resist according to claim 18, further comprising a binder polymer.

22. The polymerizable composition for a solder resist according to claim 18, which has a solid content concentration of from 30% by mass to 80% by mass, and a viscosity of from 10 mPa·s to 3000 mPa·s.

23. The polymerizable composition for a solder resist according to claim 18, wherein a cured film having a film thickness of 20 μm formed from the composition has a light transmittance of 10% or less at a wavelength of from 800 to 1200 nm.

24. The polymerizable composition for a solder resist according to claim 18, wherein a cured film having a film thickness of 20 μm formed from the composition has a breakdown voltage of 1 MV/cm or more.

25. A solder resist pattern formation method comprising, in this order: a step of forming a photosensitive layer containing the polymerizable composition for a solder resist according to claim 18 on a substrate;
a step of pattern exposing the photosensitive layer to electron beam, UV light, or visible light to cure an exposed portion; and a step of removing an uncured photosensitive layer by development to form a patterned cured film having an infrared ray shielding property.

26. The polymerizable composition for a solder resist according to claim 18, wherein the polymerization initiator is an oxime ester compound.

* * * * *